United States Patent [19]
Janc et al.

[11] Patent Number: 4,893,316
[45] Date of Patent: Jan. 9, 1990

[54] DIGITAL RADIO FREQUENCY RECEIVER

[75] Inventors: Robert V. Janc, Palos Heights; Steven C. Jasper, Hoffman Estates; Lester A. Longley; Katherine L. Zebrose, both of Chicago; William J. Turney; Ross J. Lillie, both of Schaumburg, all of Ill.

[73] Assignee: Motorola, Inc., Schaumburg, Ill.

[21] Appl. No.: 890,804

[22] Filed: Jul. 24, 1986

Related U.S. Application Data

[63] Continuation-in-part of Ser. No. 771,736, Sep. 3, 1985, abandoned, Continuation-in-part of Ser. No. 720,311, Apr. 4, 1985, abandoned, Continuation-in-part of Ser. No. 612,107, Apr. 20, 1984, abandoned.

[51] Int. Cl.$^4$ .................................. H04L 27/18
[52] U.S. Cl. ........................ 375/44; 375/86; 375/39; 375/77; 375/67; 364/721; 364/724.1; 341/110; 341/122; 455/324; 455/296
[58] Field of Search ............... 340/347 AD, 347 SH; 375/39, 43, 54, 61, 75-77, 82, 86, 44, 102, 103, 57, 104, 99, 58; 455/46, 60, 63, 202, 205, 296, 307, 324, 315; 329/122, 50, 124, 153, 154; 364/721, 724, 724.1; 332/10, 44; 370/20; 341/110, 122

[56] References Cited

U.S. PATENT DOCUMENTS

| | | | |
|---|---|---|---|
| 3,562,420 | 2/1971 | Thompson et al. | 178/6 |
| 3,816,831 | 6/1974 | Mollod | 343/103 |
| 3,877,022 | 4/1975 | Lehman et al. | 340/347 |
| 3,879,724 | 4/1975 | McDonald | 340/347 |
| 3,972,000 | 7/1976 | Desblache et al. | 329/105 |
| 3,979,701 | 9/1976 | Tomozawa | 333/70 T |
| 3,988,539 | 10/1976 | Motley et al. | 375/39 |
| 3,999,129 | 12/1976 | Kasson | 325/42 |
| 4,003,002 | 1/1977 | Snijders et al. | 332/10 |
| 4,011,438 | 3/1977 | Aufderheide et al. | 364/724 |
| 4,044,241 | 8/1977 | Hatley, Jr. | 235/152 |
| 4,057,759 | 11/1977 | Genova et al. | |
| 4,062,060 | 12/1977 | Nussbaumer | 364/724 |
| 4,071,821 | 1/1978 | Harthill et al. | 324/83 R |
| 4,090,145 | 5/1978 | Webb | 375/77 |
| 4,130,806 | 12/1978 | Van Gerwen et al. | 455/307 |
| 4,159,526 | 6/1979 | Mosley, Jr. et al. | 364/721 |
| 4,237,554 | 12/1980 | Gitlin et al. | 375/15 |
| 4,241,312 | 12/1980 | Barnes et al. | 329/50 |
| 4,246,653 | 1/1981 | Malm | 375/82 |
| 4,288,857 | 9/1981 | Wilterding | 364/728 |
| 4,313,211 | 1/1982 | Leland | 455/139 |
| 4,315,219 | 2/1982 | Rocheleau et al. | 328/14 |
| 4,318,128 | 3/1982 | Sauvanet | 358/147 |
| 4,320,523 | 3/1982 | Horikawa et al. | 375/103 |
| 4,345,500 | 8/1982 | Alonso et al. | |

(List continued on next page.)

FOREIGN PATENT DOCUMENTS

| | | | |
|---|---|---|---|
| 2308257 | 11/1976 | France. | |
| 873926 | 9/1959 | United Kingdom | 40/5 |

OTHER PUBLICATIONS

Argarwal et al., "New Recursive Digital Filter Structures Having Very Low Sensitivity and Roundoff Noise", I.E.E.E. Trans. on Circuits and Systems, vol. CAS-22, No. 12, pp. 921-927, Dec. 1975.

(List continued on next page.)

*Primary Examiner*—Robert L. Griffin
*Assistant Examiner*—Marianne Huseman
*Attorney, Agent, or Firm*—Thomas G. Berry; Steven G. Parmelee

[57] ABSTRACT

A digital radio receiver is described. The digital receiver of the present invention contemplates a digital radio receiver which operates on a received analog signal which has been converted to a digital form after preselection at the output of the antenna. The digital receiver of the present invention comprises a preselector, a high-speed analog-to-digital (A/D) converter, a digitally implemented intermediate-frequency (IF) selectivity section having an output signal at substantially baseband frequencies, and digital signal processor (DSP) circuit performing demodulation and audio filtering. The radio architecture of the present invention is programmably adaptable to virtually every known modulation scheme and is particularly suitable for implementation on integrated circuits.

162 Claims, 28 Drawing Sheets

U.S. PATENT DOCUMENTS

| | | | |
|---|---|---|---|
| 4,346,477 | 8/1982 | Gordy | 455/257 |
| 4,356,559 | 10/1982 | Candy et al. | 364/724 |
| 4,384,357 | 6/1983 | deBuda et al. | 375/81 |
| 4,419,759 | 12/1983 | Poklemba | 375/97 |
| 4,455,680 | 6/1984 | Villarreal et al. | 455/208 |
| 4,464,770 | 8/1984 | Maurer et al. | 375/77 |
| 4,475,220 | 10/1984 | Mattei et al. | 375/86 |
| 4,506,228 | 3/1985 | Kammeyer | 329/50 |
| 4,594,555 | 6/1986 | Hilton | 329/135 |

OTHER PUBLICATIONS

Bruton, "Low-Sensitivity Digital Ladder Filters", I.E.E.E. Trans. on Circuits and Systems, vol. CAS-22, No. 3, pp. 168–176, Mar. 1975.

Tierney et al., "A Digital Frequency Synthesizer", I.E.E.E. Trans. on Audio and Electroacoustics, vol. AU-19, o. 1, pp. 48–57, Mar., 1971.

Bellanger et al., "Digital Filtering by Polyphase Network: Application to Sample-Rate Alteration and Filter Banks", I.E.E.E. Trans. on Acoustics, Speech, and Signal Processing, vol. ASSP-24, No. 2, pp. 109–114, Apr., 1976.

Stephenson, "Digitizing Multiple Rf Signals Requires an Optimum Sampling Rate", Electronics, pp. 106–110, Mar. 1972.

Yiu et al., "A Low-Cost GPS Receiver for Land Navigation", Journal of the Institute of Navigation, vol. 29, No. 1, Fall, 1983.

Chao, "Low Cost RF/LSI Technologies for Commercial GPS Receivers", Microwave Systems Application Technology Conference, Washington, D.C., Mar., 1983.

Resolution Improvement in an Analog-to-Digital Converter by the Superposed Dither Signal, Shimizu et al., Electronics and Comm. in Japan, vol. 64-A, No. 12, 1981.

Vanderkooy et al., "Resolution Below the Least Significant Bit in Digital Systems with Dither", Journal of Audio Eng. Society, vol. 32, No. 3, 1984.

Schuchman, "Dither Signals and their Effect on Quantization Noise", I.E.E.E. Trans. on Comm. Tech., 1964.

Bennett, "Spectra of Quantized Signals", Bell Systems Technical Journal, Jul. 1948.

Sasaki et al., Japanese Patent Publication No. 25287.

Tsuda, Japanese Patent Publication No. 97968.

Yamazaki, Japanese Patent Publication No. 168323.

Tsukamoto, Japanese Patent Publication No. 7521.

Yamada, Japanese Patent Publication No. 18123.

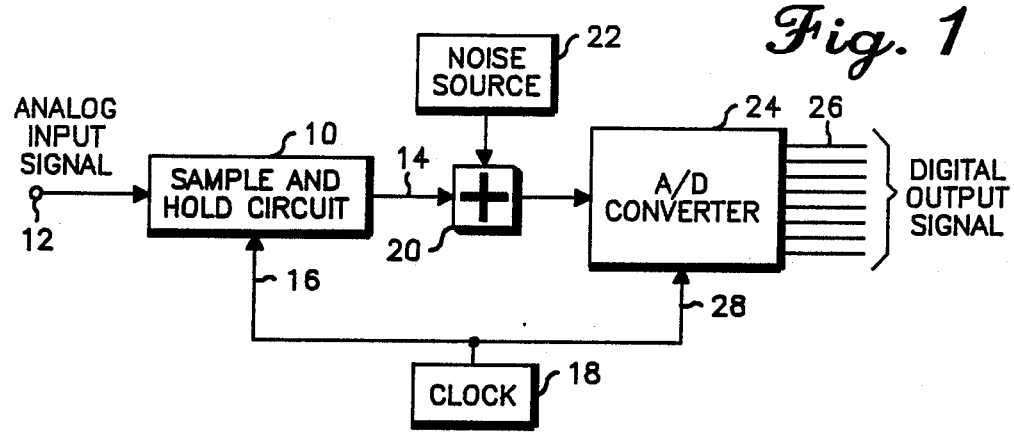
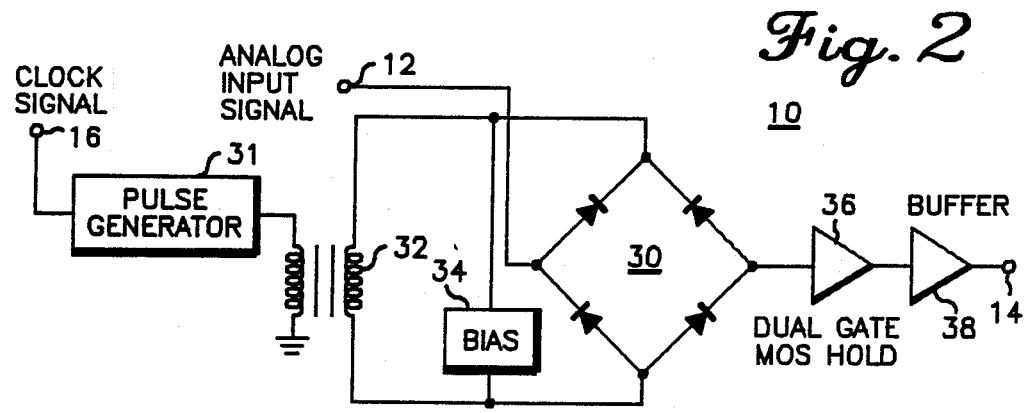
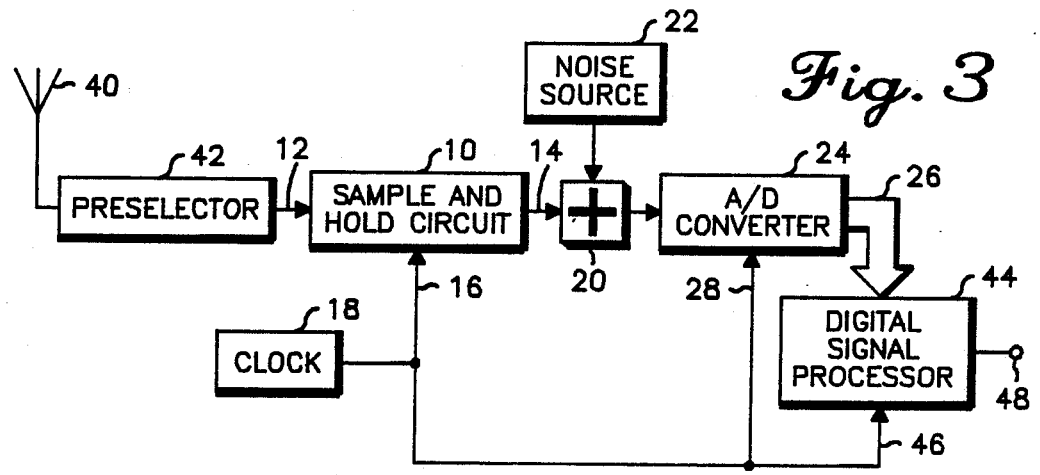

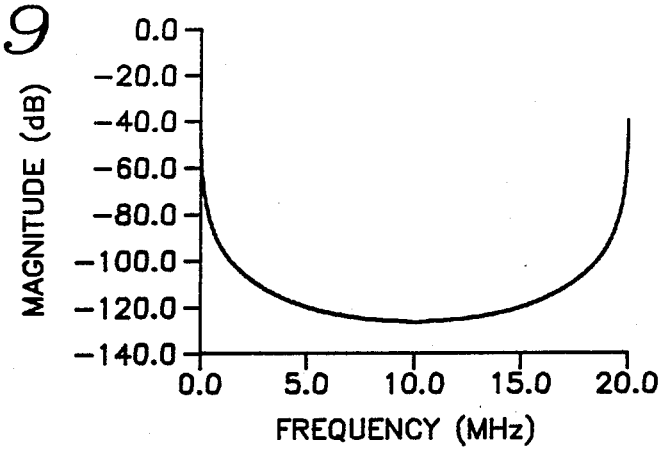
Fig. 9
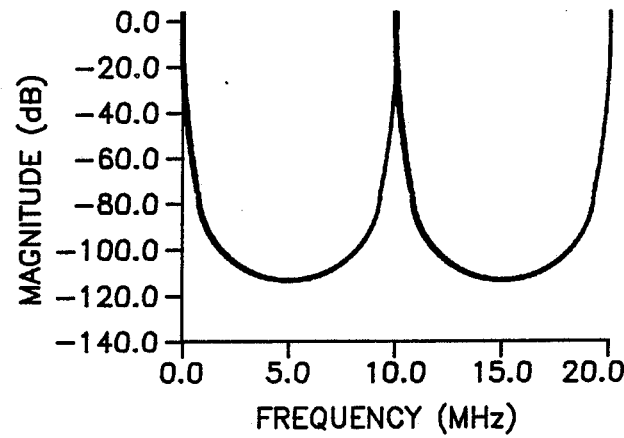
Fig. 10c
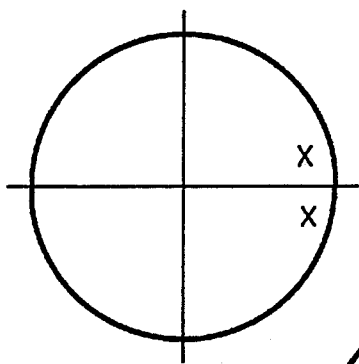
Fig. 10a
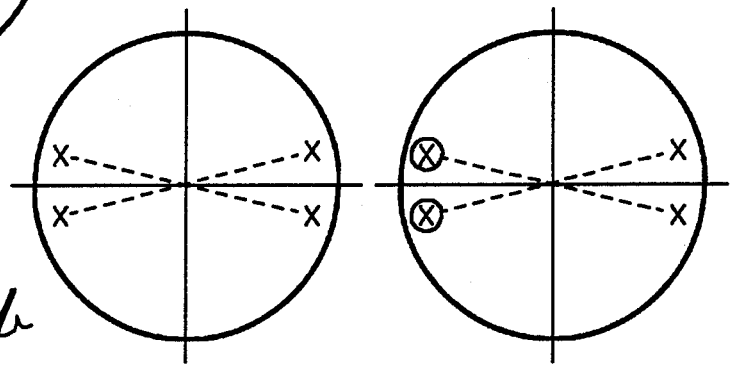
Fig. 10b
Fig. 11

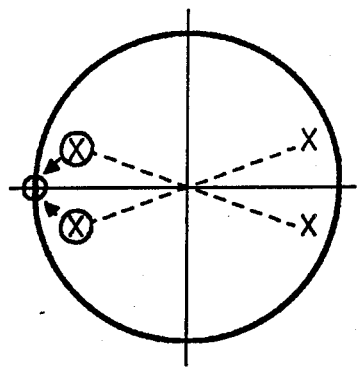
Fig. 12a
Fig. 12b
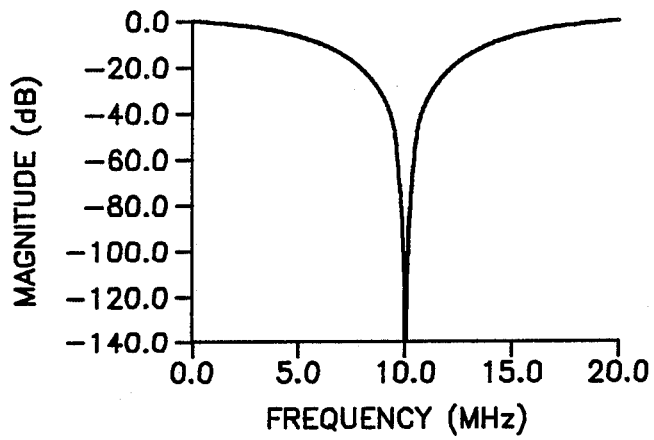
Fig. 13
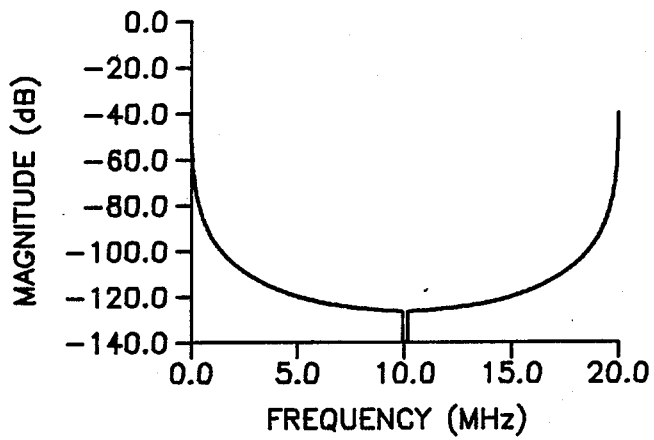

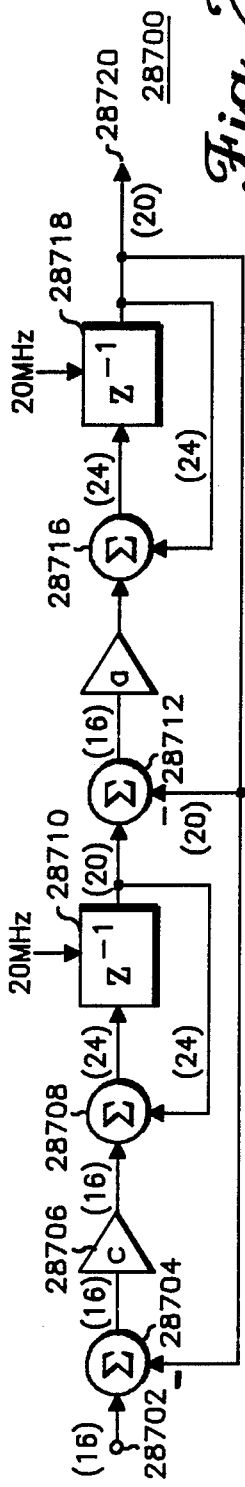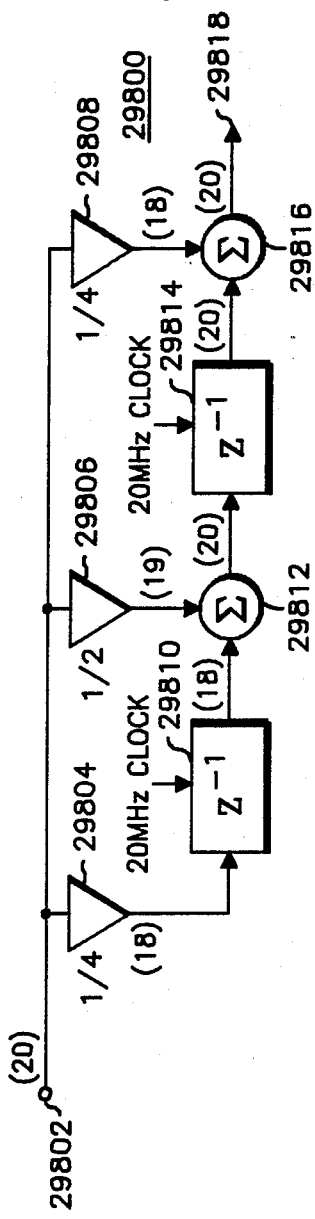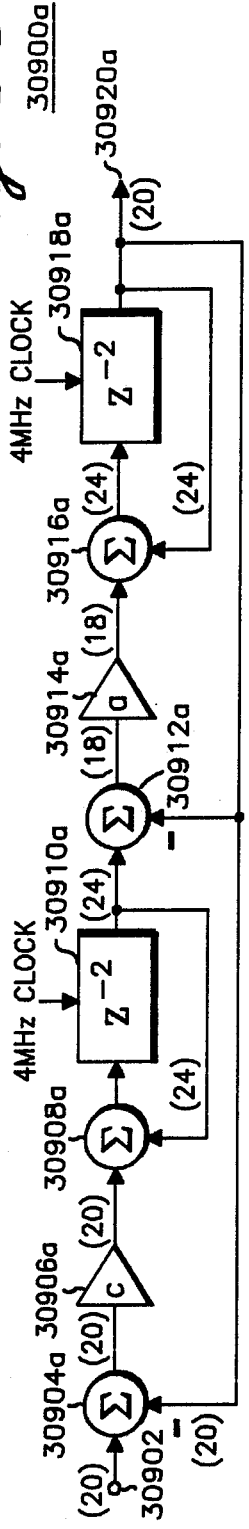
Fig. 28
Fig. 29
Fig. 30a

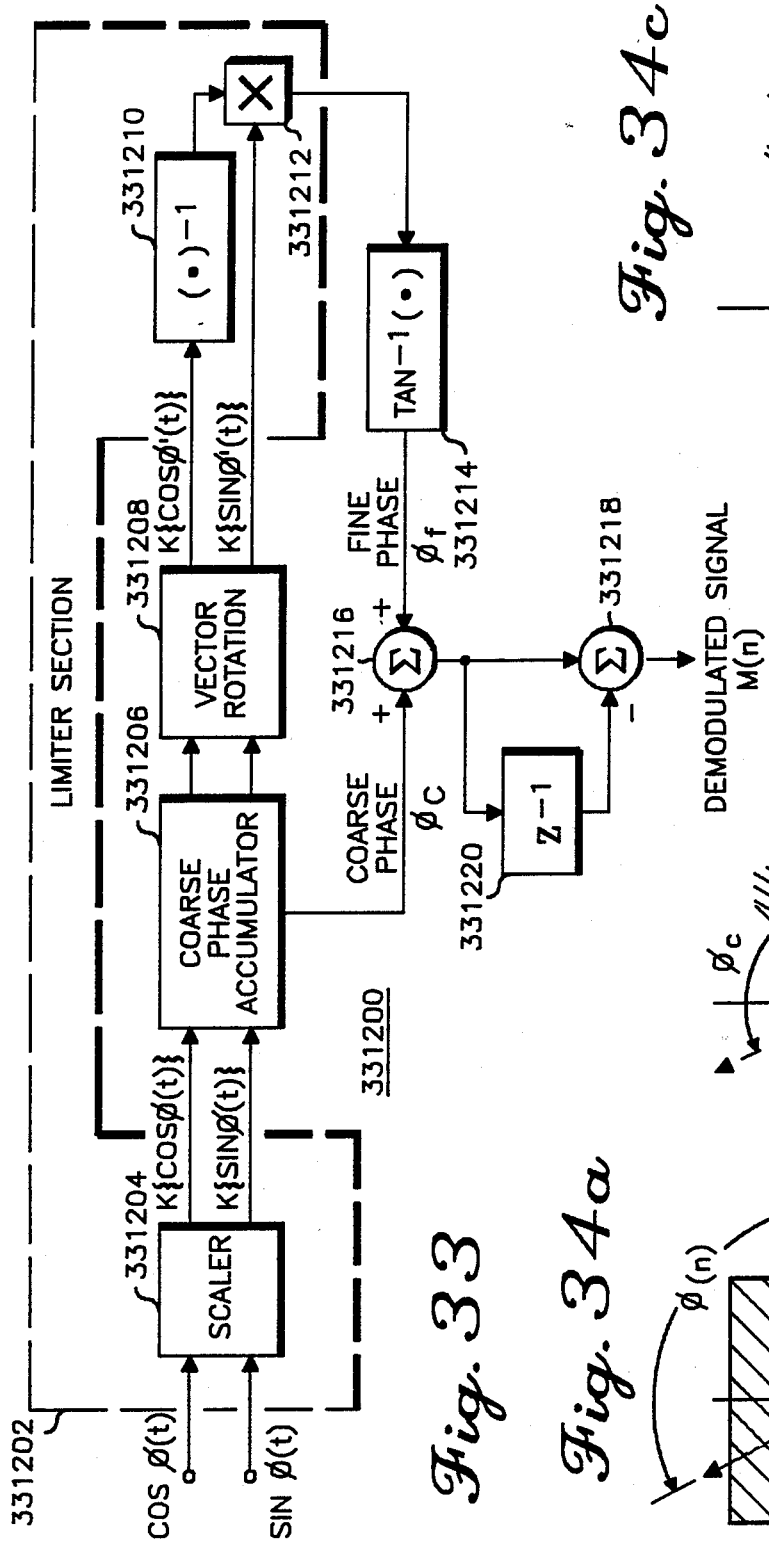
Fig. 33
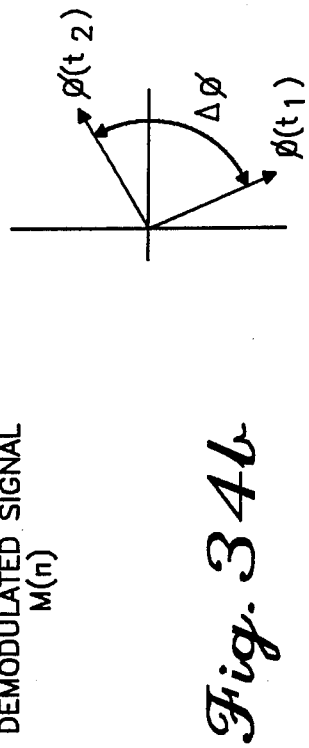
Fig. 34c
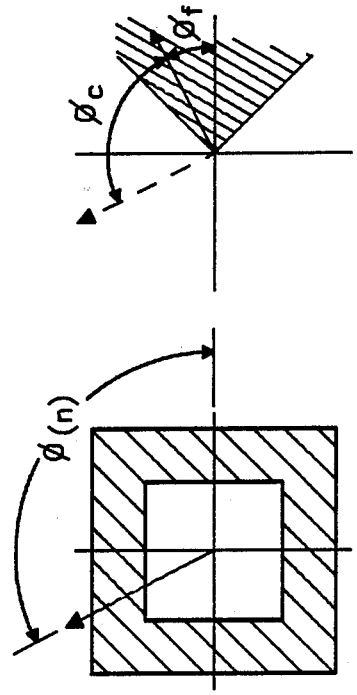
Fig. 34b
Fig. 34a

DIGITAL RADIO FREQUENCY RECEIVER

This application is a continuation of application Ser. No. 717,736, filed on Sept. 3, 1985, now abandoned; Ser. No. 612,107, filed Apr. 20, 1984, now abandoned, and Ser. No. 720,311, filed Apr. 4, 1985, now abandoned.

FIELD OF THE INVENTION

This invention relates to the field of radio communications and specifically to a radio frequency receiver which is substantially implemented with digital circuitry.

BACKGROUND OF THE INVENTION

Conventional radio communications equipment are implemented primarily with analog circuitry. The inherent characteristics of analog components limit the amount of signal processing possible. For example, the noise and gain characteristics of analog amplifiers limit the dynamic range of the processed analog signal. In addition, analog information can not be readily stored in a manner which allows sophisticated signal processing.

The use of digital signal processing to replace operations previously performed using analog processing eliminates undesirable variations in those operations which may have resulted from external effects such as temperature, humidity, and aging on analog components. In addition, digital signal processing techniques offer flexibility in terms of programmable operating characteristics and features. For example, a digital intermediate frequency (IF) integrated circuit would be programmable in terms of its channel frequency, its sampling rate, and, to some extent, its filter response. A digital signal processor (DSP), executing alternate stored programs, can perform different filtering and demodulation to implement completely different types of radios. Also, the DSP may be used to introduce advanced processing techniques such as adaptive equalization.

An additional advantage of a digital receiver structure is that the DSP and IF circuitry can be designed so that it can be "reversed" to perform the corresponding operations for a digitally implemented transmitter. For half-duplex operation, the circuitry might be switched so that it simply reverses "direction," while for full-duplex operation two IF filters would be needed.

The primary technology contribution leading to the feasibility of a substantially digital receiver is a high-speed (20-100 MHz), high-resolution (10-12 bits) A/D converter. Clearly, before any digital processing can occur, the normally low level analog signal presented to the receiver must be converted into digital form.

The initial A/D conversion of the received signal presents several problems. In a land mobile system the magnitude of a received signal may be as low as 0.5 microvolts (uV). This signal level is significantly lower than the threshold sensitivity available in a conventional A/D converter; for example, a commercially available 1 volt 14 bit A/D converter has a threshold wherein the least significant bit (LSB) in its output corresponds to an analog input voltage of 61 uV. A substantial range (0.5 uV–60 uV) of input signal levels which is useful in conventional analog receivers, would not be detected by such an A/D converter and could not be processed by digital signal processing.

Of course, an amplifier could be utilized to amplify low level received signals prior to the A/D conversion. However, such an amplifier would likely give rise to severe intermodulation distortion in a land mobile receiver and would itself provide an intermodulation limit. If a stronger signal is present concurrently with a low level desired signal, the A/D quantizing noise will have a narrow frequency spectrum and can result in severe intermodulation distortion. By converting a received RF analog signal into digital form, the AD converter functions as a quantizer, that is, it functions to subdivide the analog signal into small but measurable increments.

The mathematical relationship between distortion and quantization step size is addressed in an article by W. R. Bennett entitled "Spectra of Quantized Signals" published in the *Bell System Technical Journal*, July 1948, pages 446-472.

In an article by Leonard Schuchman entitled "Dither Signals and Their Effect on Quantization Noise" published in the *IEEE Transactions on Communication Technology*, Dec. 1964, pages 162-165, the mathematical relationship between a dither signal and quantization noise is addressed.

Arthur Stephenson's article "Digitizing Multiple RF Signals Requires an Optimum Sampling Rate" published in *Electronics*, Mar. 27, 1972, pages 106-110, discloses a concept for utilizing an A/D converter, digital filter and digital demodulator for receiving and processing RF signals. The disclosed concept envisioned utilizing an automatic gain controlled amplifier to amplify the low level filtered RF signal prior to the A/D conversion.

In U.S. Pat. No. 3,816,831 to Leonard Mollod, the disclosed invention relates to the processing of Loran signals using hard-limiting techniques. RF noise is added to the input signal to maintain a desired-signal to noise ratio The combined signal and noise is amplified by a hard-limiting amplifier prior to the information decoding.

A digital integrating and auto-correlator apparatus is disclosed in U.S. Pat. No. 4,288,857 to Jack Wilterding and John Cozzens and is directed generally to signal-to-noise ratio enhancement. A signal containing noise and a separate reference noise signal are alternately coupled through an analog switch, a low pass filter, and a sample and hold circuit to an A/D converter.

A second major factor leading to the technical feasibility of a digital receiver structure is the high level of integration and high speeds attainable in VLSIIC implementations, ultimately permitting, for example, an all digital zero-IF selectivity section (DZ155).

Historically, intermediate frequency (IF) sections have been employed in transmitters and receivers to perform the major portion of a radio's selectivity since it may be technically difficult, or cost prohibitive, to develop sufficiently selective filters at the transmitted or received frequency. Transceivers may have more than one IF section. For example, some receivers employ two IF sections for recovering the transmitted information. These receivers are generally referred to as dual conversion receivers, whereas a single IF receiver would be referred to as a singular conversion receiver. Generally, any receiver with an intermediate frequency of zero Hertz is referred to as a direct conversion receiver.

Analog implementations of direct conversion receivers suffer from a variety of detriments including local oscillator (LO) radiation, which results from imperfect reverse isolation through the mixers, and may desense nearby receivers. Further, radio desense performance can be degraded by nonlinear effects in the mixers causing self-mixing of on-and off-channel signals which creates DC offsets and audio distortion. Also, in an application involving the reception of frequency modulated (FM) signals, the direct conversion analog receiver has no means of limiting the zero-IF signal. This causes unpredictable performance in fading and other adverse conditions.

The aforementioned dual conversion receiver alleviates some of the direct conversion problems. The additional isolation obtained by a dual conversion receiver solves the LO radiation problem. However, the solution is achieved at the cost of an additional mixer and local oscillator, in addition to a narrow band (generally crystal) filter to achieve the required isolation. Further, having a traditional IF section prior to the DC-IF section essentially band-limits the incoming signal to one channel. Thus, the self-mixing products caused by the nonlinear effects of the mixers generally will not fall into the passband of the filter in a dual conversion receiver.

Although the dual conversion receiver solves many of the problems experienced by the direct conversion receiver (although at additional cost and size requirements), the dual-conversion receiver experiences other detriments. As previously mentioned, the direct conversion FM receiver cannot limit the zero-IF signal. Thus, the use of unconventional detection methods are required. The typical solution to this problem is to up-convert the zero-IF signal to a third IF frequency where it can be limited and detected using conventional circuits. Up-converting requires another local oscillator, additional mixers and a summing circuit. Further, up-converting creates yet another problem. The quadrature paths in an analog receiver cannot be perfectly balanced for amplitude and phase characteristics because of the nonexact performance of the mixers and filters. Thus, a beat-note is (created due to imperfect cancellation in the summer) which degrades hum and noise performance and causes audio distortion. A proposed solution to this problem is to phase lock the L0 to an incoming pilot signal. This necessitates additional circuitry at the transmitter to transmit the pilot signal and also requires additional circuitry at the receiver to develop the phase lock loop and pilot filters. Lastly, the phase lock loop lock-time and pull-in range become critical receiver parameters.

Although the above discussion has concerned receivers, similar problems are experienced in transmitter IF sections, even though transmitter IF topologies are generally different than those employed in receivers. Generally, any analog implementation of an IF section will experience temperature and part-to-part variations that may degrade the IF section performance. Therefore, a need exists for an IF section that is insensitive to part and temperature variations and solves the above mentioned problems experienced in analog implementations of IF sections.

The present invention combines these new technologies with improved techniques for front-end analog processing and digital IF filtering to achieve a feasible design for a substantially digital receiver. The receiver structure of the present invention permits a revolutionary change in the manufacturing technology and operating characteristics of mobile radios. Furthermore, this approach permits a radio to be built with a minimal number of parts, which at once reduces parts and manufacturing costs, while also improving radio reliability and serviceabilty.

SUMMARY AND OBJECTS OF THE INVENTION

In summary, the present invention contemplates an all digital radio receiver which operates on a received R F signal which is converted to a digital form after preselection at the output of an antenna. The receiver of the present invention comprises a preselector, a high-speed analog-to-digital (A/D) converter, a digitally implemented intermediate-frequency (IF) selectivity section having an output signal at substantially baseband frequencies, and general-purpose digital signal processor (DSP) integrated circuits performing final selectivity or equalization, demodulation, and post-demodulation processing.

In one embodiment of the A/D converter, a sample and hold circuit receives a low level analog input signal and is gated by a clock. The output of the sample and hold circuit is summed with a signal from a noise source and the resulting signal coupled to an A/D converter. The noise source presents a bandwidth restricted signal having no substantial energy in the range of frequencies of the desired analog input signal. The clock also drives the A/D converter which has a plurality of digital output signals which correspond to varying analog signal levels.

In another embodiment of the A/D converter, directed to an improvement in a communications receiver utilizing digital processing, a low level received RF signal is filtered by means of a band pass filter or preselector and received by a sample and hold circuit. The output of the sample and hold circuit is summed with a noise source and received by an A/D converter which provides a digital output to a digital signal processor for digital filtering and demodulation. A clock is utilized to drive the sample and hold circuit, A/D converter, and digital signal processor. The noise source is bandwidth restricted so that the noise energy does not occupy the same frequency range as the incoming desired signals.

In the preferred embodiment of the DZ155, a digital quadrature local oscillator is employed to generate digitized discrete-time amplitude pulses of sine and consine waveforms which are then combined with an input signal in a digital quadrature mixer. In a receiver, the digital quadrature mixer down-converts the input signal to occupy a frequency band centered about zero Hertz. Subsequent digital filtering removes any unwanted mixing components so that only the signal centered about zero Hertz is communicated to any recovery circuitry in the receiver. In a transmitter, the digital quadrature mixer up-converts a digitally filtered input signal to occupy a frequency band centered about the selected frequency of the local oscillator signals.

Accordingly it is an object of the present invention to provide a digitally implemented radio receiver.

It is another object of the present invention to provide a radio receiver structure which is readily adapted to receive a plurality of transmission schemes.

It is yet another object of the present invention to provide a radio receiver structure which may be substantially implemented using integrated circuit techniques.

It is still another object of the present invention to provide a digital receiver IF filter design which operates at a relatively fast rate so as to reduce the resolution and step size demands on the A/D converter.

It is yet another object of this invention to provide an apparatus and a corresponding method for enhancing the threshold sensitivity of an A/D converter.

Still another object of this invention is to provide an apparatus and corresponding method for converting low level RF analog signals into digital form for further processing in a receiver.

It is a further object of this invention to minimize the above mentioned problems relating to the conversion of low level RF signals into digital form in a communications receiver.

It is still another object of the present invention to provide a digital zero-IF selectivity section that alleviates the aforementioned problems experienced in analog implementations.

It is yet a further object of the present invention to provide a digital zero-IF selectivity section having a topology that can be used for both transmitters and receivers.

It is yet a further object of the present invention to provide a digital zero-IF selectivity section capable of operating at high sampling rates.

Accordingly, these and other objects are achieved in the present digital radio frequency receiver

BRIEF DESCRIPTION OF THE DRAWINGS

The features of the present invention which are believed to be novel are set forth with particularity in the appended claims. The invention, together with further objects and advantages thereof, may be understood by reference to the following description taken in conjunction with the accompanying drawings, and the several figures of which like referenced numerals identify like elements and in which:

FIG. 1 is a block diagram illustrating an embodiment of the present invention;

FIG. 2 is a schematic diagram illustrating a sample and hold circuit suitable for use in the embodiment shown in FIG. 1;

FIG. 3 is a block diagram of an embodiment of the present invention in a communication receiver;

FIG. 9 is graphical representation of the response of the digital low pass filter section of FIG. 8.

FIGS. 10a-c are graphical representations of a filter decomposition technique and resulting filter response;

FIG. 11 is a graphical representation of a combining filter technique used in the prior art;

FIGS. 12a-b are graphical representations of the combining filter technique and filter response as taught by the present invention;

FIG. 13 is a graphical representation of a decomposed and combined filter response as taught by the present invention;

FIG. 26b is a block diagram, of a decomposed approximation to the fast lowpass filter of FIG. 26a;

FIG. 28 is a schematic diagram of the second-order narrowband lowpass infinite-impulse-response (IIR) filter used in the decomposed "fast" lowpass filters of FIG. 26b;

FIG. 29 is a schematic diagram of the second-order finite-impulse-response (FIR) filter with a notch at half the sampling rate used in the decomposed fast lowpass filters of FIG. 26b;

FIGS. 30a through 30c are schematic diagrams of the time-division-multiplexed second-order lowpass IIR filter used in the time-division-multiplexed "slow" lowpass filters described in conjunction with FIG. 24;

FIG. 33 is a block diagram of an FM demodulator implemented with a general purpose DSP;

FIGS. 34a through 34c are diagrams detailing the principles of phasers in the context of the present invention;

FIGS. 36a through 36b are flow diagrams of the operation of the scale routine described in conjunction with FIG. 36a;

DETAILED DESCRIPTION OF THE DRAWINGS

Figure 4:
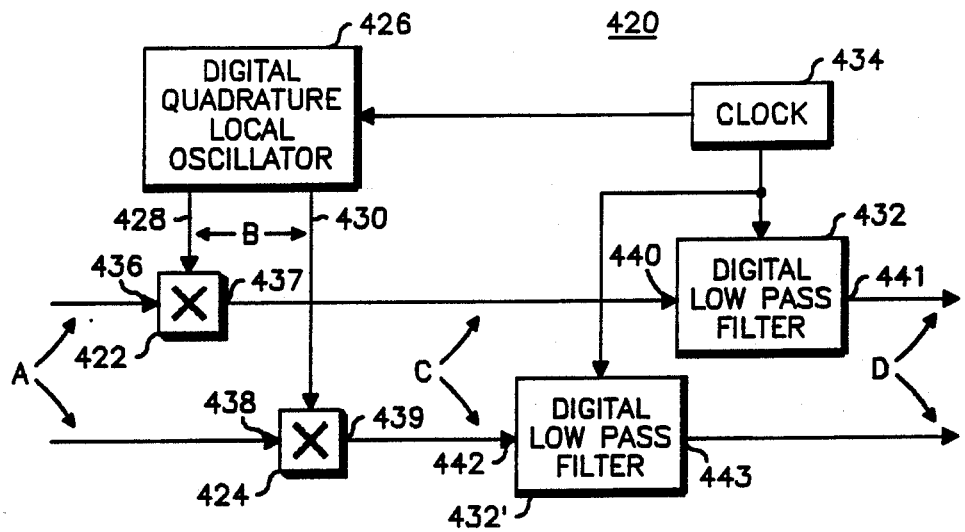
FIG. 4 is a block diagram of a digital zero-IF selectivity section especially adapted for use in a receiver.

In the embodiment of this invention shown in FIG. 1, a sample and hold circuit 10 includes an input port 12 for accepting an analog input signal, an output 14, and a gating control input 16. The purpose of sample and hold circuit 10 is to monitor the varying instantaneous voltage presented by the analog alternating current (AC) input signal and store an instantaneous voltage level of the analog input signal. Output pulses of clock 18 are received by input 16 and determine the instants in time when the analog input signal waveform is sampled. The sample and hold circuit 10 stores the magnitude of the sampled signal until the next sample interval. The output 14 of circuit 10 may consist of the stored voltage level or a signal proportional to the sampled voltage level.

A summation circuit 20 sums the signal from output 14 of the sample and hold circuit 10 together with the output from a noise source 22. The output of noise source 22 preferably consists of a moderately wide band noise signal such as a bandwidth of 50 kHZ or greater. The bandwidth of the noise signal should be selected so that it does not overlap or occupy part of the range of frequencies in which desired analog input signals occur. For example, low pass or bandpass filtered Gaussian noise can be used.

An analog to digital converter 24 receives the resulting composite signal, which contains a signal component corresponding to the analog input signal, from summation circuit 20 and converts it into a digital output signal (data) defined by the binary state of digital outputs 26. The output from clock 18 is received at input 28 of converter 24 which utilizes the clock pulses for gating purposes to control the time when analog to digital conversions are to occur.

The amplitude of the noise signal supplied by noise source 22 should be less than the peak to peak voltage range of the A/D converter 24, i.e. the noise signal should not cause the A/D converter to clip. For example, a noise signal approximately 15 decibels (dB) below the maximum peak to peak voltage range of the A/D converter is suitable.

Summing a noise signal having a predetermined bandwidth and magnitude level selected relative to the range of the A/D converter permits analog input signals having a magnitude less than threshold sensitivity of the A/D converter to be detected by the converter. The noise signal also has an additional benefit of "whiting" the spectrum of the A/D converter's quantizing noise; that is, the quantizing noise at the output of the A/D converter will have an essentially uniform power spectral density. The sampling or clock rate should be high enough so that the spectral power of the quantizing noise in the received analog input signal bandwidth is low; that is, the ratio of the sample rate to the bandwidth of the desired signal should be large, preferably 10 or greater. The improvement in threshold sensitivity achieved by this invention increases as this ratio increases.

Although noise source 22 is shown being summed with the output of sample and hold circuit 10 by means of summation circuit 20, a noise source could be combined with the desired analog input signal preceding the sample and hold circuit 10 as opposed to after it. That is, the analog input signal could be summed with a noise source and the resulting summed signal applied to a sample and hold circuit having its output coupled directly to the A/D converter.

The use of a sample and hold circuit 10 presumes that the rate of change or frequency of the analog input signal is too great or high for the A/D converter 24 to process. If the rate of change or frequency of the analog input signal is within the capability of the A/D converter, then a sample and hold circuit need not be used. In such an application, the analog input signal would be applied directly to the summation circuit 20 in the place of the output 14 of the sample and hold circuit as shown in FIG. 1.

In an exemplary embodiment of the present invention according to FIG. 1, a commercially available 1 volt (plus over −0.5 volt) 8 bit A/D converter having 256 steps was utilized. An applied analog RF input signal at 900.455 Megahertz (MHz) having a 10 Kilohertz (kHz) bandwidth was sampled at a clock rate of 20 mHz. A low pass filtered Gaussian noise source having a bandwidth of 0–50 kHz generated a noise signal with a total power 9 dB below the root mean square (rms) value of the peak to peak voltage range of the A/D converter. This converter has a threshold sensitivity or step size of 3.9 millivolts (mV). Without utilizing the present invention, the A/D converter would be unable to recognize the presence of an analog signal which did not exceed 3.9 mV. However, utilizing this invention, an analog input signal having a magnitude of only 0.2 mV was detected and converted into a digital output signal by the A/D converter. Thus, from this particular example of the present invention, it will be apparent that analog input signals having an amplitude significantly lower than the threshold sensitivity of the A/D converter can be achieved.

With respect to the low pass filtered Gaussian noise referenced in the above example, its bandwidth should be increased as the sampling rate increases and could be decreased if an A/D converter having a greater number of bits was utilized. Other types of noise sources which meet the following criteria can also be used: (1) no substantial energy at the frequency of the desired signal; (2) causes the quantization noise at the output of the A/D converter to have an essentially uniform power spectral density; (3) magnitude of the noise signal does not cause the A/D converter to clip. For example, a plurality of sine waves or a numerically (computer) generated noise signal could be employed.

In FIG. 2, a particular sample and hold circuit 10 is illustrated. The analog input signal is coupled at input 12 to a diode sampling bridge 30. The clock signal from clock 18 is coupled at input 16 to a pulse generator 31 having its output pulse coupled by means of transformer 32 to sampling bridge 30 as shown. The width (time duration) of the output pulse from the pulse generator should be less than one-half of the reciprocal of the frequency of the analog input signal. Operating bias for bridge 30 is supplied by a conventional bias circuit 34.

The clock signals as coupled to bridge 30 cause the bridge to alternately be conductive and non-conductive. Thus, bridge 30 acts as a gate which alternately couples and inhibits the coupling of the analog input signal to the input of a dual gate MOS hold integrated circuit 36. When the bridge is conducting, the analog input signal will be coupled to hold IC 36; when the bridge is not conducting, analog input signal will be blocked and not coupled to hold IC 36. The output of the hold IC 36 is coupled to a buffer 38 which has an output 14.

FIG. 3 illustrates another embodiment of the present invention utilized in a "front end" of a communications receiver. The front end refers to the initial signal processing section in a receiver. A received RF signal is sensed by antenna 40 which couples it to a preselector 42 which preferably consists of a band pass filter designed to pass the range of frequencies in which desired received signals may occur. The filtered signal is coupled from preselector 42 to the input 12 of sample and hold circuit 10. The operation of sample and hold circuit 10, clock 18, noise source 22, summation circuit 20, and A/D converter 24 in FIG. 3 is the same as previously explained with respect to FIG. 1 and therefore is not repeated.

The digital outputs 26 of A/D converter 24 can be coupled to a digital signal processor 44 for filtering and digital information recovery. Various types of digital filtering and digital signal processing are well known in the art and various digital signal processors are commercially available. The output of clock 18 may also provide a clock reference to an input 46 of the digital signal processor. The output 48 of the processor may comprise the desired information carried by the received signal. For example, the desired information may consist of voice communication (speech) or data.

The particular implementation of a digital signal processor 44 or other alternative processing techniques do not comprise part of the present invention and hence will not be described in detail.

The elements in FIG. 3 which are common to FIG. 1 provide the same advantage in a receiver, that is, the magnitude of the analog received signal which can be detected and converted into digital form by A/D converter 24 is substantially lower than the threshold sensitivity of the A/D converter itself. Thus, the present invention provides an improved sensitivity for the receiver. To meet a given receiver sensitivity, the present invention allows a receiver to utilize no amplification (or less amplification depending upon the particular specification) of a received signal prior to the A/D conversion. Even if an amplifier is required, the gain of the amplifier for the same receiver sensitivity level can be considerably less by the use of the present invention. Minimizing the gain required for such an amplifier or eliminating the need for the amplifier will improve the intermodulation distortion characteristic of the receiver. Also the injection of a limited bandwidth noise signal from noise source 22 tends to broaden the spectral content of the quantizing noise of the A/D converter itself and thus improves the intermodulation characteristic of the A/D converter.

Referring now to FIG. 4, a digital zero-IF selectivity section (DZISS) is depicted in block diagram form, which has been constructed in accordance with the present invention and, further, which is especially adapted for use in a receiver. Basically, DZISS 420 is comprised of an in-phase mixer 422, a quadrature-phase mixer 424, a digital quadrature LO 426 (providing an in-phase LO signal 426 and a quadrature phase LO signal 430), two digital lowpass filters 432 and 432', and a clock source 434.

To employ the DZISS circuit in a receiver, identical digital information may be applied to both the in-phase mixer 422 and the quadrature-phase mixer 424 at input ports 436 and 438 respectively Generally, ports 436 and 438 are not single lines, but are in fact multiple lines representing an L-bit digital word. The actual length of the digital word used in any given application is dependent upon many factors, including: the resolution required, the dynamic range required and the sampling frequency of the received signal For example, a word length of 12 bits is considered to have an acceptable performance in receiving a typical radio signal sampled at 20 MHz.

Mixers 422 and 424 have as a second input quadrature LO lines 428 and 430 respectively. As previously mentioned, these LO signals are not single connections, but are M-bit discrete time representations of signals that are 90 degrees apart in phase (i.e., sine and cosine waveforms). Mixers 422 and 424 perform an arithmetic multiplication of the L-bit input word and the M-bit LO word, rounding the result to form an N-bit output word that is applied from output ports 437 and 439 (of mixers 422 and 424) to the digital lowpass filters input ports 440 and 442 respectively.

The digital word length parameters, L, M and N may be selected to yield acceptable noise performance. As the digital word is lengthened, more quantization levels are available to represent the signal. The smaller quantization increments lead to improved noise performance as is well understood in the art. This process is analogous to an analog implementation of a mixer producing sum and difference sine and cosine products in an analog mixer. However, all the aforementioned problems of an analog mixer are avoided in a digital implementation because of the perfect linearity of the mixers.

The digital word resultant from the aforementioned multiplication is applied to digital filters 432 and 432' to band-limit the received frequency spectrum. Digital filter 432 and 432' are identical in structure and may be formed from a recursive filter topology which will be hereinafter described in greater detail. Following the filtering process, the digital signals are output through ports 441 and 443 and sent on to any digital demodulating structure that may be employed. For example, it may be advantageous to effectuate digital demodulation by the use of a programmable digital signal processor (DSP).

Figure 5:
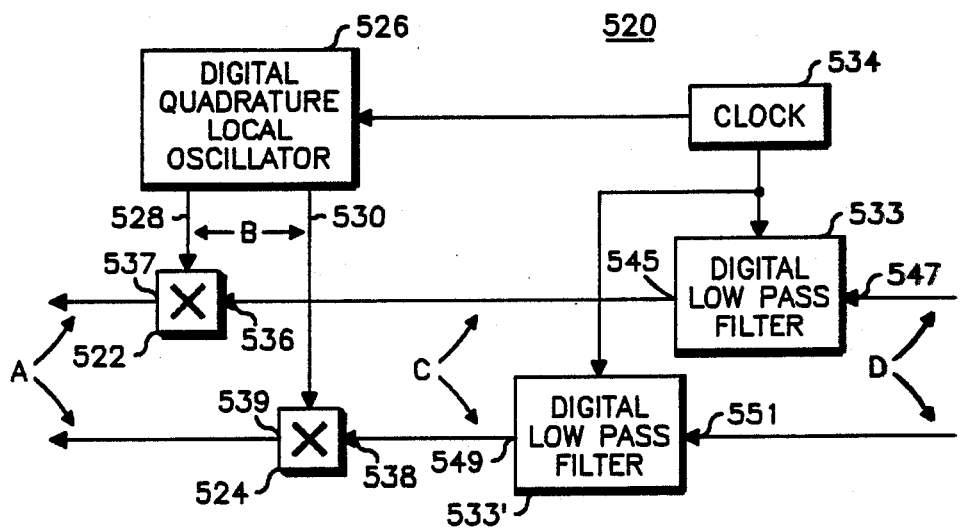
FIG. 5 is a block diagram of the digital zero-IF selectivity section especially adapted for use in a transmitter.

Referring now to FIG. 5, the DZISS, here configured for operation in a transmitter, is depicted in block diagram form. The digital signals to be transmitted would be applied to ports 547 and 551 of lowpass filters 533 and 533' which band-limits the spectrum of the signals and applies them to input ports 536 and 538 of mixers 522 and 524, respectively. As previously described, mixers 522 and 524 accept as a second input LO signals 528 and 530, respectively. The up-converted digital signal is output at ports 537 and 539 which may then be sent to any conventional summing circuit where the signals would be arithmetically added (binary addition) as is well known in the art. The information signal may then be converted to analog form through a D-to-A converter and transmitted by conventional means. From the foregoing discussion it should become apparent that a simple "inversion" of the input/output data flow of mixers and selection of digital low pass filters are all that is required to change the DZISS topology from a receiver configuration to a transmitter configuration or vice-versa. Thus, the DZISS of FIGS. 1 and 2 afford a simple, inexpensive and universal IF section that may be readily employed by both receivers and transmitters.

Figure 6:
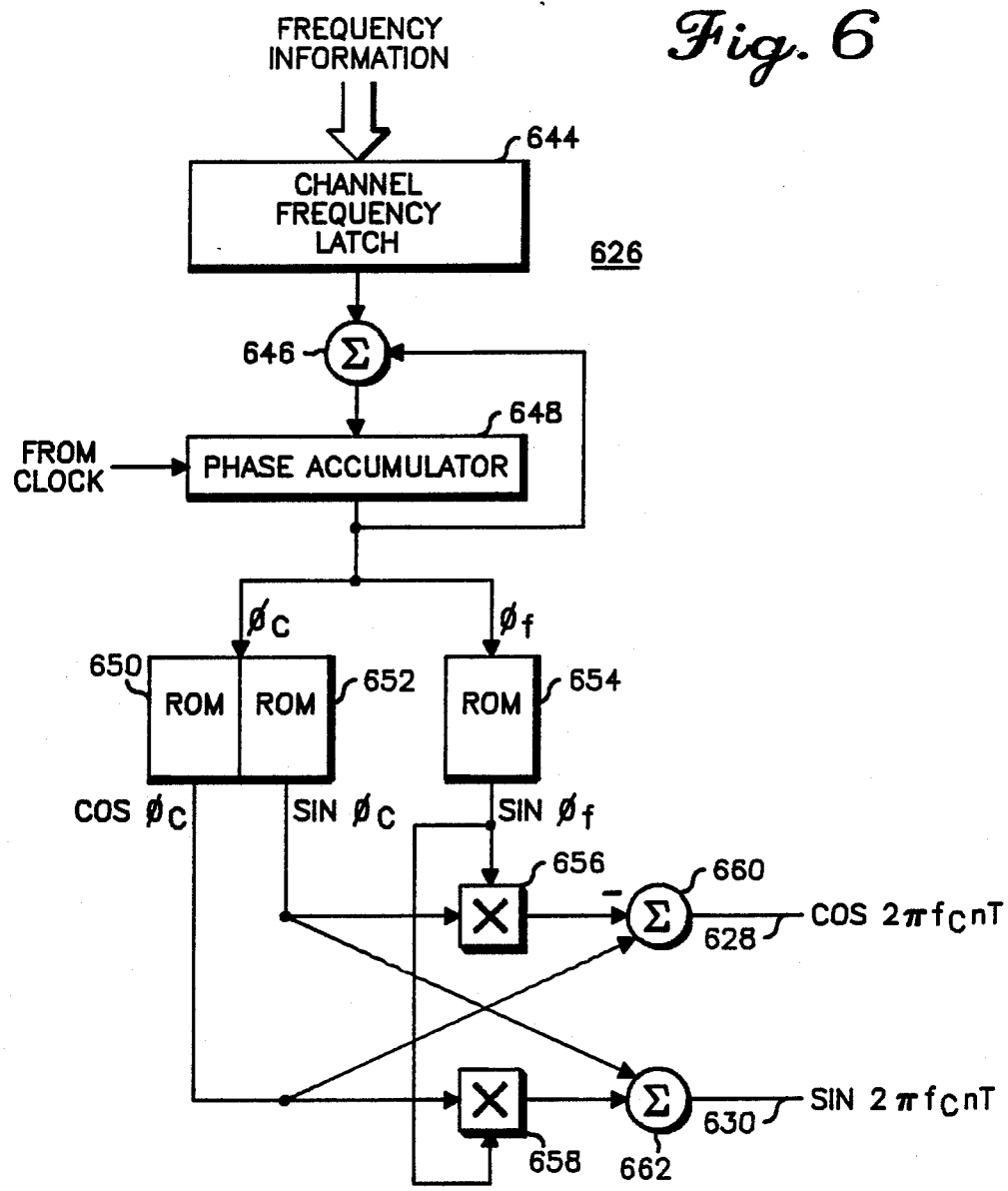
FIG. 6 is a block diagram of the digital quadrature LO of FIGS. 4 and 5

Referring now to FIG. 6, digital quadrature LO 626 is depicted in block diagram form. Implementation of a DZISS hinges on the ability to generate accurate and stable discrete time representations of sine and cosine waveforms for the quadrature mixing process. Thus, the digital quadrature LO 626 is a key component of the DZISS. Traditional techniques, such as the digital feedback oscillator, use multipliers in the feedback path thereby causing a severe limitation in the operating speed of the oscillator. More advanced techniques, such as the direct ROM (read only memory) look-up approach, utilize the fact that sine and cosine waveforms can be expressed in real and imaginary parts of the unit magnitude complex phasor $e^{j2\pi f_c(nT)}$, where $f_c$ is the desired carrier frequency and nT is the discrete time variable (T equals the sampling period which is equal to 1/sampling rate). However, the direct ROM approach simply stores all possible phasor values which may result in large ROM requirements if the number of desired frequencies, and hence, the number of required phasors, is large. Often his large ROM requirement becomes prohibitive in a digital quadrature LO implementation due to cost and size requirements.

The disclosed invention uses a factored-ROM approach utilizing the fact that the phase angle of the unit magnitude phasor can be broken into a complex product of coarse and fine phasors. Thus, the unit magnitude phasor $e^{j\phi}$ can be represented as $e^{j\phi_c} \cdot e^{j\phi_f}$. Therefore, the unit magnitude phasor can be realized by having separate coarse-value phasors and fine-value phasors stored in ROM which are multiplied together to get the discrete time sine and cosine values required for the quadrature mixers. The advantage of this factorization is that the amount of ROM necessary to store the coarse-value and fine-value phasors is greatly reduced from that required of the direct ROM look-up approach. The expense paid for this ROM size reduction is the introduction of circuitry to perform the complex multiplication of coarse and fine phasors Generally, a complex multiplication can be implemented with four multipliers and two adders. By judicious selection of the fine-value phasor, and recalling that the cosine of a small angle can be approximated by one, the ROM for the cosine fine-value phasor can be eliminated Further, by approximating the small angle cosine values as one, two multipliers can be eliminated from the multiplication structure required to generate a complex product. This results in both a cost and size savings in the factored-ROM implementation.

Referring still to FIG. 6, the digital quadrature LO 626, as implemented using the factored-ROM approach, is depicted in block diagram form. Frequency information, in the form of an M bit binary number proportional to the desired frequency, is loaded into the channel frequency latch 644. Channel frequency latch 644 may be realized in many different forms. For example, assuming that M=20., five cascaded 74LS175's (Quad D flip-flops), manufactured by Motorola, Inc., and others, provide an acceptable implementation. Those skilled in the art will appreciate that channel frequency latch 644 may be loaded by various means. For example, in a single frequency radio the channel frequency latch could be permanently loaded with a single binary number. For multiple frequency radios, channel frequency latch 644 could be loaded from an EPROM or ROM look up table or calculated and latched by a microprocessor.

The output of channel frequency latch 644 is coupled to a binary summer 646. It will be understood by those skilled in the art that the following discussion of digital quadrature LO 626, all coupling lines in between the functional blocks are in fact multi-bit binary words and not single connections. The output of adder 646 is coupled to phase accumulator 648. Phase accumulator 648 can be implemented as an M bit binary latch which is used to hold the address of the next location of ROM to be addressed. Thus, the output of phase accumulator 648 is coupled to cosine coarse-value ROM 650, sine coarse-value ROM 652, and sine fine-value ROM 654 (recall that fine-value cosine ROM is not required as it is being approximated by one). Further, the output of phase accumulator 648 is fed back into summer 646 to be added (modulo $2^M$) to the binary number representing the channel frequency information located in the channel frequency latch 644. The output of phase accumulator 648 is updated once every clock pulse which is generally the sampling frequency. The result of this binary addition, is that phase accumulator 648 is holding the binary sum (proportional to phase) of the last address plus a binary vector contained in the channel frequency latch. This number indicates the next address to be required to create the quadrature LO signals 628 and 630.

In actual implementation, the binary word output from phase accumulator 648 is partitioned into two segments, such that only the higher order bits of phase accumulator 648 are sent to ROM 650 and 652, and the lower order bits are sent to ROM 654. As previously stated, these bits are the addresses for the ROM locations. Upon receiving an address, ROM's 650, 652 and 654 output the digital binary word located at the received address on their respective output ports. The digital quadrature signals are then arithmetically generated from the three binary numbers.

To generate the cosine waveform (i.e., the real component of the complex waveform), the outputs of sine coarse-value ROM 652 and sine fine-value ROM 654 are first multiplied in multiplier 656. The output of multiplier 656 is fed to summing circuit 660 where it is subtracted (2's complement form) from the output of cosine coarse-value ROM 650. This arithmetic process yields the cosine-value which is output on port 628 and coupled to quadrature mixers of FIGS. 4 and 5. To generate the sine values of the digital quadrature LO the outputs of the cosine coarse-value ROM 650 and sine fine value ROM 654 are multiplied in multiplier 658. Both multiplier 656 and 658 may be realized as, for example, an MPY016K manufactured by TRW, Inc. The output of multiplier 658 is fed to a summing circuit 662 where it is summed with the output of sine coarse-value ROM 652. Summing circuit 662 outputs via connection 630 the discrete time sine value digital word which is coupled to quadrature mixers of FIG. 4 and 5. Therefore, since the discrete time values of the sine and cosine signals are calculated mathematically, perfect 90 degree phase control is achieved using minimal ROM space.

The amount of coarse-value ROM required can be further reduced by taking advantage of symmetries in the cosine and sine waveforms, and thereby storing only the values of the unit magnitude phasor residing in the first octant (i.e., the first 45 degrees) of the phasor unit circle. Those skilled in the art will appreciate that the unit magnitude phasor represents sine or cosine values rotating through 360 degrees. Due to the symmetrical nature of sinusoidal waveforms, the values of the cosine and sine waveforms over the first octant of the unit circle are identical to the values of these waveforms over any other octant, except for possible sign changes and reversal of roles (i.e., sine becomes cosine and vice versa). Therefore, the only coarse-value phasors that are required are those in the first octant provided there is an indicator of which octant the phasor is currently residing, and there is circuitry present to negate (i.e., change sign) and/or exchange the outputs of coarse-cosine ROM 650 and coarse-sine ROM 652 according to the current octant. An octant indicator is readily implemented using three binary bits of the ROM address. For example, the three most-significant-bits (MSB's) could be used to indicate the octant, and the remaining bits used to address the ROM for the coarse-valued phasor.

Thus, the factored ROM LO reduces the ROM area while maintaining acceptable frequency resolution. For example, to implement a digital quadrature LO 626 that operates at 20 MHz, the coarse-value ROM's 650, 652 could each be implemented in a 32×16 ROM and the fine-value sine ROM 654 could be implemented in a 128×8 ROM. This would result in frequency resolution of approximately 600 Hz using approximately 2000 bits of ROM.

The factored-ROM configuration is preferred for operation at high sampling rates, since, except for the phase accumulator, there is no circuitry connected in a feedback manner. This allows the rest of the LO circuitry (especially multipliers 656 and 658, which represent the main speed bottleneck) to be pipelined to achieve a very high operating rate. Pipelining would consist of introducing latches at certain critical points, such as within the multipliers themselves, as is well understood in the art. Thus, a factored-ROM L0 is described which outputs M-bit discrete time digital quadrature signals which exhibit a selected frequency.

Figure 7A:
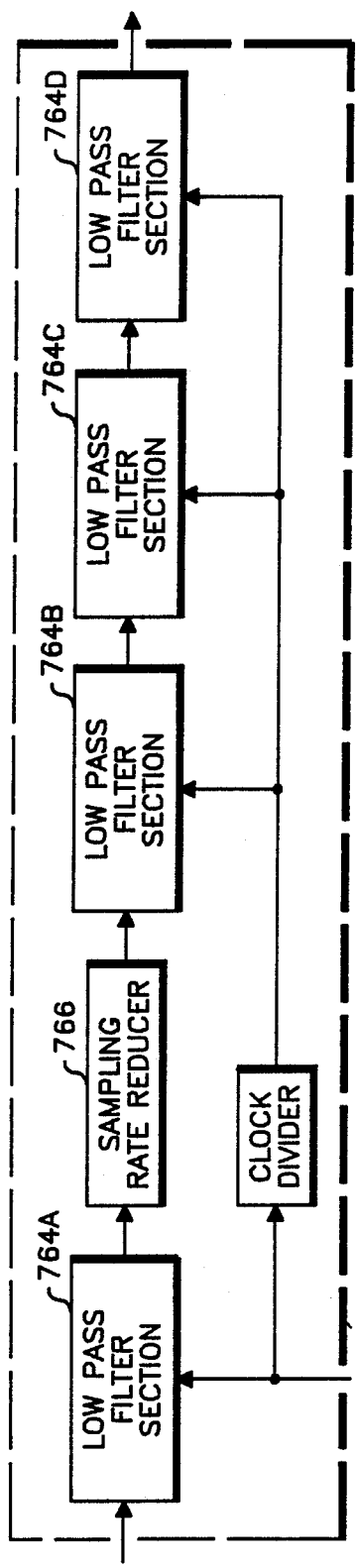
FIG. 7a is a block diagram of the digital lowpass filters of FIG. 4.

Referring now to FIG. 7a, the digital lowpass filter 732 is depicted in block diagram form. Those skilled in the art will appreciate that digital filter 432 and 432' of FIG. 4 are in fact identical filters and are differentiated only to facilitate the discussion of the DZISS disclosed by the present invention.

All digital filter structures are made up of basically the three same components: adders, multipliers, and delay circuits (generally latches or RAM). The factors affecting the performance of a digital filter all have to do with the fact that the various parameters of the filters are quantized, that is, they have finite precision rather than the infinite precision available in analog filters. The finite precision of a digital filter basically gives rise to three major performance effects that must be controlled in any implementation of a digital filter.

Coefficient roundoff is one of these effects. The constant valued coefficients found in a digital filter determine its frequency response. The result of rounding these coefficients so that they may be represented digitally in a finite number of bits causes a permanent, predictable change in the filter response. This is analogous to changing the RLC values in an analog filter; however, digital filters do not suffer the detriment of temperature variations as in analog filters. Generally, the higher the Q of the filter (i.e. narrow bandwidth filters compared to the sampling rate) the more the frequency response is distorted by coefficient rounding, unless special structures are employed. Judicious selection of the filter structure is of key importance in light of the fact that IF filters are generally extremely narrow band, or high-Q, filters.

Round-off noise is another of the performance characteristics that must be controlled in a digital filter. Data entering a digital filter has, of course, been rounded to a finite number of bits, and it is almost always necessary to perform additional roundings at certain points within the filter. Such rounding operations create an error or noise signal in the digital filter. For example, if the digital word length used in a filter is 16 bits and the coefficients are represented in 10 bits each multiplication operation would create a 25 bit product, which must be rounded to 16 bits before the result may be put back into memory.

The last major effect that is controlled in a digital filter is the overflow level. The fact that data samples are represented in a finite number of bits means that there is a maximum allowable absolute value associated with every node in the filter which, if exceeded, results in an overflow phenomenon (generally wrap-around if 2's complement binary arithmetic is used). This largest allowed data value, coupled with the level of roundoff noise described previously, determines the dynamic range of the filter.

Several conventional structures are available to implement digital filters. A straight forward design approach is to cascade sections of first or second order direct-form filters until the desired filter order is achieved. The advantages of this method are its simplicity, regularity, and ease of actual filter design. However, the conventional approach also suffers from many detriments mostly stemming from the fact that high precision (for example 16 bit) filter coefficient representation is required to implement a narrowband filter. This necessitates highly complex multiplications (for example 16×20 bits) be performed in the feedback paths of the filter sections. The multiplications place severe speed and time limitations on the operation of the filters. Further, pipelining, a common technique used to speed logic circuits, cannot be employed in feedback loops. Lastly, high precision high speed multipliers consume tremendous amounts of power.

Referring still to FIG. 7a, the digital lowpass filter employed in the DZISS is depicted in block diagram form. In the preferred low-speed embodiment, the digital lowpass filter 732 may be comprised of four cascaded lowpass filter sections 764a–d which are identical in topology and do not employ multipliers. Between lowpass filter section 764a and 764b is sampling rate reducer 766. Sampling rate reducer 766 may be realized in many forms. For example, if the digital word length is 24 bits, then four cascaded 74LS174's (Hex D flip-flops) manufactured by Motorola, Inc., and others, provide an acceptable implementation. Those skilled in the art will appreciate that any number of digital filter sections may be employed and that sampling rate reduction may be used between any and all filter sections. Further, filter sections having identical topologies are not required but simply facilitate the actual implementation.

High speed digital logic circuits consume high power. Therefore it is advantageous to reduce the sampling rate of the digital signal as early as possible to lower the power consumption of the sections following the sampling reduction point. The present invention brings the sampling rate reduction into the filter structure inserted immediately after the first filtering section. Further sampling rate reduction is often employed after digital lowpass filter 732 and prior to the audio demodulation section of a radio receiver.

Sampling rate reduction, commonly referred to as "decimation" in digital signal processing terminology, consists simply of discarding all but a select subset of the previous output samples. Since decimation is equivalent to resampling at a lower rate, those skilled in the art will appreciate that the bandwidth of the signal being resampled must be less than that of the higher-rate signal by an amount necessary to prevent aliasing Decimation is generally desirable because a given subsequent operation may often be realized with less circuitry if it operates at a lower speed. Further, for CMOS (complementary metal-oxide semiconductor) technology power consumption is reduced at lower operating speeds. The narrowband digital filters 32 and 32' of the present invention thus permit all subsequent circuitry to operate at an advantageously reduced rate.

Figure 7B:
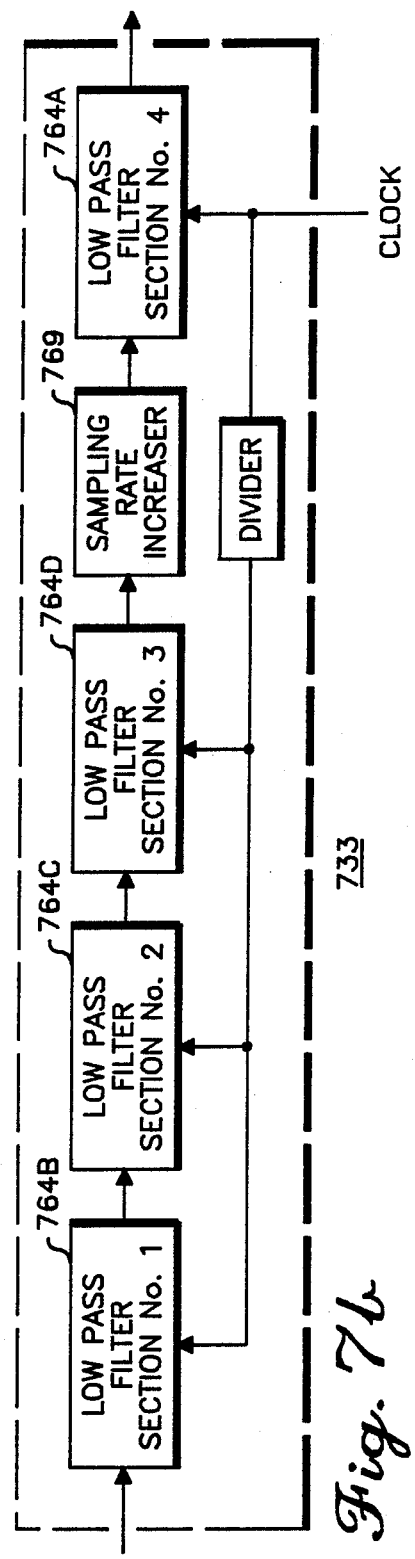
FIG. 7b is a block diagram of the digital low pass filters of FIG. 5.

Referring now to FIG. 7b, taken in conjunction with FIG. 7a, the digital low-pass filter of FIG. 5 is depicted in block diagram form. Basically, digital lowpass filter 733 is formed by rearranging digital lowpass filter 732 of FIG. 7a. However, the sampling rate is increased in a transmitter. Accordingly, sampling rate increaser 769 is disposed between digital lowpass filter sections 764D and 764A to provide low-speed operation until the final filtering section thereby minimizing power consumption. Sampling rate increaser 769 may be implemented as sample and hold circuits which output the same sample continuously until a next sample is received. This "interpolation" process can increase the sampling frequency of a digital signal N times by repeating the held sample N−1 times until the next sample is received. Interpolation does introduce sin(x)/x distortion however, in practice, this may be easily removed through equalization in previous audio processing stages as is well known in the art.

Figure 8:
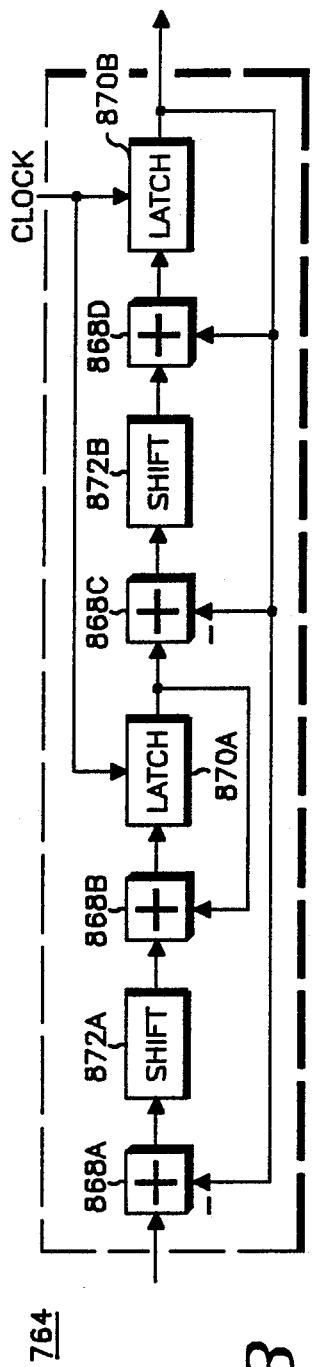
FIG. 8 is a block diagram of one of the lowpass filter sections if FIG. 7a or FIG. 7b.

Referring now to FIG. 8, a digital lowpass filter section 764 is depicted in block diagram form. The filter employed in the DZISS is a recursive filter (i.e., the output signal is feedback, scaled, and summed at strategic points in the filter structure) having a narrow bandwidth and optimized for high-speed and low-sensitivity to the previously described detrimental effects of parameter quantization on digital filters.

Basically, the digital lowpass filter 764 consists of 4 adders (2's complement) 868a–d, 2 digital latches 870a–b and 2 binary shifters 872a–b. As mentioned previously in the discussion of the digital quadrature LO 626, the individual connections of lowpass filter 764 as described in FIG. 8 are multi-bit digital words and not single electrical lines. The input signal is applied to the input of subtracting circuit 868a. A second input to subtractor 868a is taken from digital latch 870b which is fed back from the output of the filter circuit. The difference (2's complement) result of subtractor 868a is next applied to the input of bit shifter 872a which presents the shifted first sum signal as one input of summer 868b.

Bit shifter 872a shifts all bits of the data word outputted from subtractor 868a to the right (i.e., toward the least significant bit) by Na bits, effecting multiplication by a coefficient equal to $2^{-N_a}$. This bit shift may be implemented by an appropriate routing of the data lines from subtractor 868a to adder 868b. Thus, high operating speed of digital filter section 764 is facilitated, since there is no time delay associated with bit shifter 872a, as there would be in a coefficient multiplication implemented by a conventional multiplier circuit.

Summer 868b adds to the shifted first sum signal the last output of summer 868b as held in latch 870a. Further, the last or previous output of summer 868b is applied to subtractor 868c. A second input to subtractor 868c is taken from digital latch 870b which, as previously mentioned, is taken from the output of the digital filter. The result of subtractor 868c is applied to bit shifter 872b which is coupled to summer 868d. Bit shifter 872b shifts all bits of the data word outputted from subtractor 868c to the right by $N_b$ bits, effecting multiplication by a coefficient equal to $2^{-N_b}$. Bit shifter 872b also facilitates high operating speed since no time delay is incurred. The parameters $N_a$ and $N_b$ associated with bit shifters 872a and 872b, respectively, control the frequency response of digital filter section 764, and may be chosen to yield the response appropriate to the intended application. Summer 868d adds the second shifted sum signal to the previous output of 868d as held in latch 870b. The output of latch 870b is also the output of the digital lowpass filter section 764 and represents a band-limited representation of the input signal that was previously applied to the input of summing circuit 868a.

From the foregoing discussion, those skilled in the art will appreciate that while multiplierless digital filters greatly increase the operating speed of the DZISS, the digital filters remain the predominate limitation on the DZISS operating speed. Accordingly, the present invention employs decimation immediately after the first filter section (see FIG. 7a). However, decimation provides relief only to subsequent logic sections. Clearly, the first filter section must operate at a substantially higher data rate. Depending on the actual application, this operating speed burden on the first filter section may not be detrimental However, in those applications where operating speed is a critical parameter, a need exists to relieve the burden of the first filter section, and thus, provide reliable high-speed operation.

Accordingly, in the preferred high-speed embodiment, the present invention employs a "decomposed" first digital filter section Filter decomposition techniques have been discussed, for example, by M. Bellanger, G. Bonnerot and M. Coudreuse in a paper entitled "Digital Filtering by Polyphase Network: Application to Sample-Rate Alteration and Filter Banks", IEEE Transactions on Acoustics, Speech, and Signal Processing, Vol ASSP-24, No. 2, April 1976.

Referring now to FIG. 9, an exemplary magnitude verses frequency plot of digital low pass filter section 64 is graphically depicted As illustrated in FIG. 9, digital low-pass filter section 764b provides a very narrow pass-band (several kHz), and a stop-band extending to 10 MHz. As with any digital filter, the response for fs/2 to fs (where fs is the sampling frequency) is the mirror image of that from zero hertz to fs/2 (here from 0 to 10 MHz). Thus, this example assumes a digital low pass filter operating at 20 MHz band-limiting a signal centered at zero Hertz.

Referring now to FIGS. 10a–b, the decomposition technique is graphically illustrated showing the "poles" and "zeros" of the z-transform of the filter's transfer function positioned in the unit circle in the z-plane. FIG. 10a shows two poles representing the filter response described previously in FIG. 9. The following description pertains to decomposition by a factor of two. Those skilled in the art will appreciate that other factors are possible. The original filter may be decomposed into two or more decomposed sections that will subsequently operate at a lower speed. The first step is to split the original filter into two substantially identical filters by projecting the two poles through the origin as shown in FIG. 10b. The filter magnitude verses frequency plot associated with FIG. 10b is shown in FIG. 10c. The decomposed filter of FIG. 10c may operate approximately half as fast as the filter of FIG. 9 thus effectuating a fifty percent reduction in operating speed.

Examination of the filter responses in FIGS. 9 and 10c reveals that the reduced operating speed has modified the filter response. Those skilled in the art will appreciate that this change is caused by the introduction of the two additional poles in the transfer function as graphically illustrated in FIG. 10b. Thus, it is necessary to compensate for the two additional poles if the original response is to be recovered.

Referring now to FIG. 11, the generally accepted compensation technique is graphically depicted. Basically, the two poles added to decompose the original filter are "covered" (compensated for) by two corresponding zeros. Those skilled in the art will appreciate that adding two poles and corresponding zeros to any filter transfer function does not change the actual filter response, and therefore, the decomposed filter sections (now having four poles and two zeros) will have the same filter response as the original high speed filter section as shown in FIG. 9. However, the present invention deviates from this generally accepted technique to achieve a practical implementation while contemporaneously achieving acceptable performance.

Referring now to FIGS. 12a–b the combining (compensating) technique employed in the present invention is graphically depicted. Departing from traditional practice, the present invention relocates the compensation zeros on the u it circle equidistant from the poles to be compensated at the point $Z = -1$ in the Z-plane. The predominant reasoning for this is that by positioning the two zeros at this point the coefficients of the compensating filter become 1, 2 and 1. That is, they become simple powers of two which can be implemented by the shifting technique previously described in conjunction with shifters 872a and 872b of FIG. 8.

Those skilled in the art will appreciate the ease of realization and high operating speed capability of a digital filter possessing power of two coefficients. The filter response associated with the two unit-circle zeros is graphically depicted in FIG. 12b. It should become apparent that in departing from an exact pole covering the reconstructed filter response will be somewhat modified.

Referring now to FIG. 13, the reconstructed filter response is shown. The unit circle relocation of the compensating zero creates a response imperfection at 13 MHz (see FIG. 13 viewed in conjunction with FIG. 9). In practice however, this imperfection is not significant and, as previously mentioned, affords a more readily realizable implementation of the combining filter.

Figure 14:
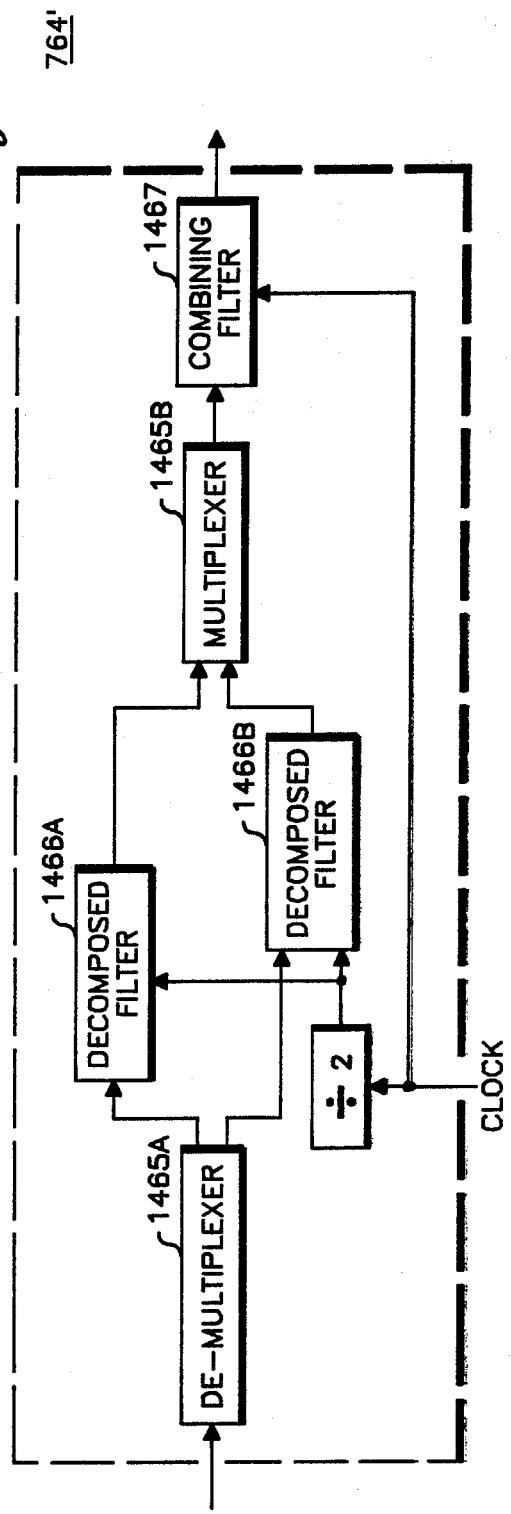
FIG. 14 is an embodiment of a digital low pass filter section having, the response shown in FIG. 13.

Referring now to FIG. 14, in conjunction with the foregoing discussion and FIGS. 9–13, the decomposed filter structure is shown. A high speed multi-bit digital signal is applied to digital low-pass filter section 764' at the input to demultiplexer 1465a. Demultiplexer 1465a has two output ports to which route the input digital words in a alternating manner. Thus, since only every other digital word is present on either output port of demultiplexer 1465a, the output data rate is one-half the input data rate. The data words are coupled to decomposed digital filters 1466a and 1466b which operate in parallel. Therefore, in each branch of low pass filter section 764', two poles of filtering are employed, however, the operating speed has been reduced by fifty percent.

After being filtered, the digital words are combined into a filtered version of the input data stream by multiplexer 1465b. Thus, multiplexer 1465b outputs a signal at the original input data rate. As previously discussed the combined filtered data words must pass through compensating or combining filter 1467 so that the overall response of low pass filter section 764' is substantially the same as low pass filter section 764 of FIG. 7a.

It should be apparent that combining filter 1467 operates at a higher data rate. Although facially this may appear inconsistant with the purpose of filter decomposition, recall from the foregoing discussion that the filter coefficients of combining filter 1467 are simple powers of two by virtue of the filter zero placement on the unit circle (see FIG. 12a). Therefore, the filter actually realized requires less circuitry due to the resulting coefficients, and thus, can readily operate at substantially twice the data rate of the original low pass filter section 764. Thus, the unit circle placement balances the need for an appropriate filter response and a practical filter realization.

Digital low pass filter section 764' can be readily used in place of section 764 to provide a higher speed embodiment of DZISS. Generally, decimation is employed immediately after the first digital low pass filter section 764a (see FIG. 7a) and accordingly, subsequent sections need not be decomposed provided an appropriate decimation rate is employed. The decomposition technique as embodied in digital filter section 764' affords an increase in operating speed capability of approximately 2-to-1. Those skilled in the art will appreciate that more extensive decompositions are possible (e.g., four parallel sections rather than two), which would allow even higher operating speed. Thus, a tradeoff between operating speed and circuit complexity is made possible with this decomposition technique.

Figure 15A:
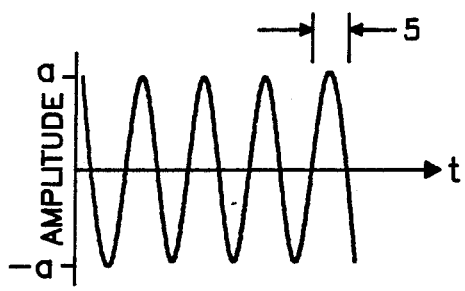
FIGS. 15a-c are time domain and frequency domain representations of exemplary signals appearing at point A of FIG. 4.
Figure 15B:
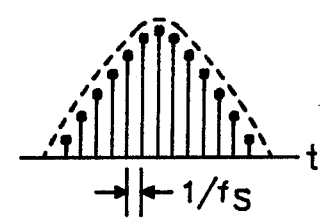
Figure 15C:
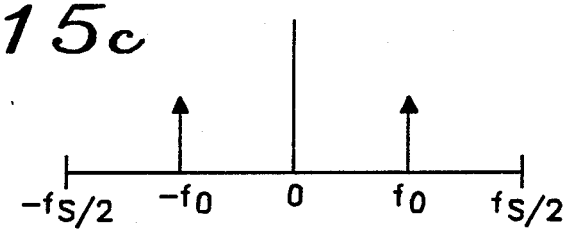

As an example of the operation of the DZISS, the following discussion describes the demodulation of a tone transmitted to a receiver having a DZISS. Referring now to FIGS. 15a–c in conjunction with FIG. 4, an input waveform is shown as a function of time in FIG. 15a. This waveform would be applied to both input ports 436 and 438 of quadrature mixers 422 and 424. Although appearing as a continuous analog sinusoid, the waveform in FIG. 15a is actually a series of discrete time finite amplitude samples as illustrated in FIG. 15b. FIG. 15b is an exploded time segment taken along the line 15—15 of FIG. 15a. Thus, FIG. 15b illustrates a portion of these discrete amplitude samples which occur at a spacing of $1/f_s$ (where fs is the sampling frequency). FIG. 15c illustrates the frequency spectrum (magnitude only) associated with the waveform of FIG. 15c. The frequency spectrum of the signal appears within the band-limited frequency region of plus over minus $f_s/2$ as seen in FIG. 15c.

Figure 16A:
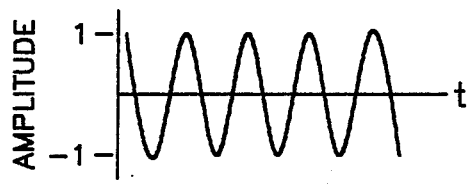
FIGS. 16a-c are time domain and frequency domain representations of exemplary signals appearing at FIGS. 17a-c are time domain and frequency domain representations of exemplary signals appearing at point C of FIG. 4.
Figure 16B:
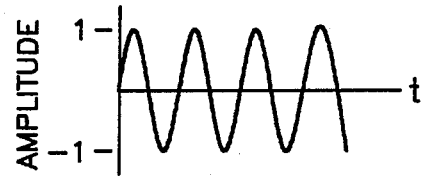
Figure 16C:
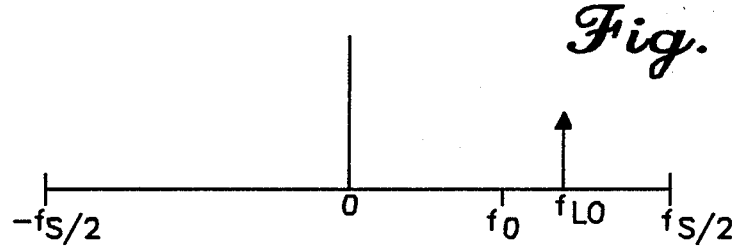

Referring now to FIG. 1 6a–c in conjunction with FIG. 4, the digital quadrature LO signals are presented as a function of time and frequency. FIG. 16a depicts cosine signal 428 which is provided from digital quadrature LO 426. As in FIG. 15, FIG. 16a is actually a series of finite amplitude samples closely spaced at $1/f_s$. Sine waveform B, generated from digital quadrature LO 426 is seen in FIG. 16b. These two waveforms constitute the complex waveform of the LO signal wherein the real component is the cosine waveform and the imaginary component is the sine waveform. The frequency spectrum of this complex waveform is depicted in FIG. 16c.

Figure 17A:
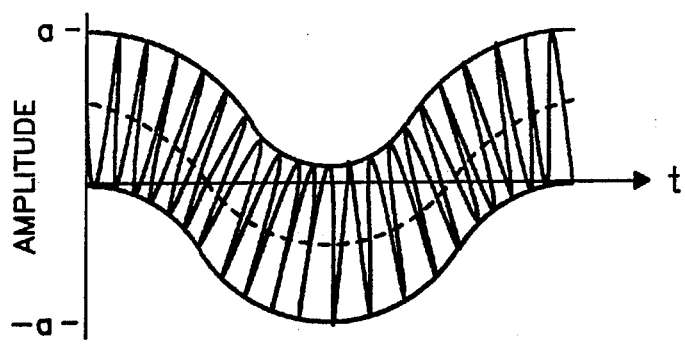
Figure 17B:
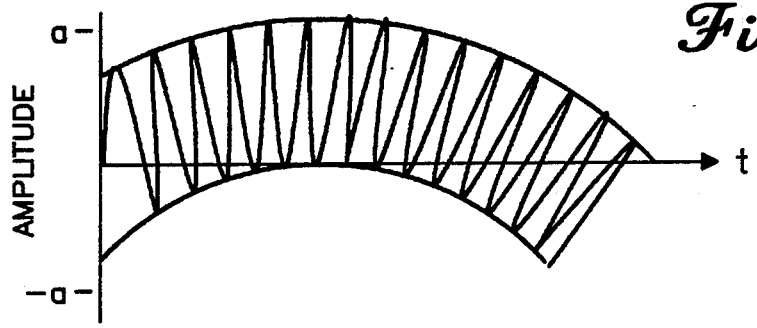
Figure 17C:
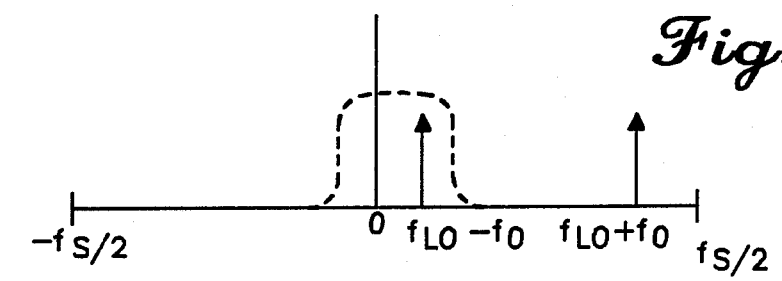

Referring now to FIGS. 17a-c taken in conjunction with FIG. 4, the signal waveforms at point C of FIG. 4 are depicted FIG. 17a depicts, as a function of time, the output of in-phase mixer 422. FIG. 17b depicts the time domain information signal from quadrature-phase mixer 424. Those skilled in the art will appreciate that each component contains a sum and difference frequency. The LO frequency is selected such that the difference frequency falls within the pass-band of digital low-pass filters 432 and 432'. As previously mentioned, although appearing continuous in nature, the waveforms of FIG. 17a and 17b are in fact discrete amplitude pulses. The frequency spectrum associated with these waveforms is depicted in FIG. 17c. FIG. 17c illustrates the spectrum of FIG. 15c which has been shifted by the frequency of $f_{LO}$. FIG. 17c also contains a dashed representation of the passband response of the digital lowpass filters 432 and 433 to which the FIGS. of 17a and 17b are next applied.

Figure 18A:
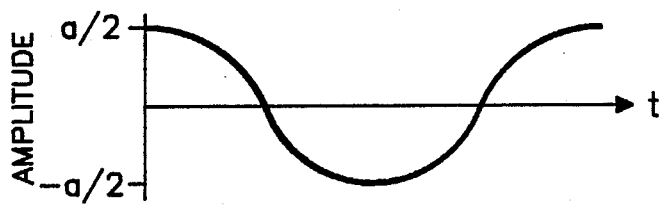
FIGS. 18a-c are time domain and frequency domain representations of exemplary signals appearing at point D of FIG. 4.
Figure 18B:
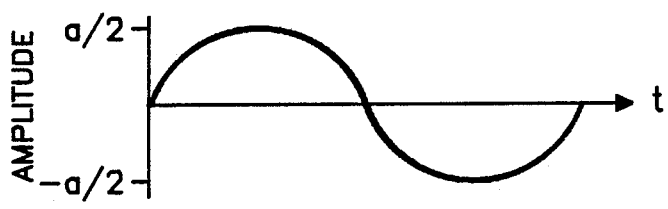
Figure 18:
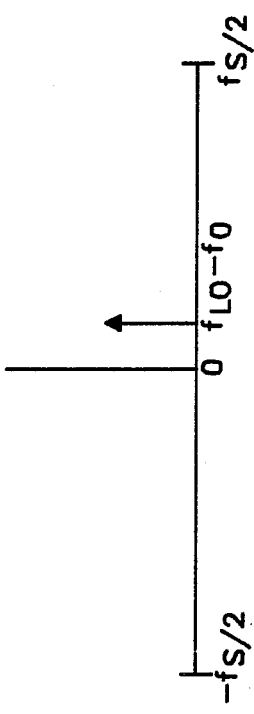

Referring now to FIGS. 18a-c taken in conjunction with FIG. 4, the output waveforms of the digital low-pass filters 432 and 432' are depicted as they would be seen at reference point D of FIG. 4. The digital lowpass filters have removed the higher sum frequency component of FIG. 17c and have passed only the $f_{LO}-f_o$ signal. Again, these signals are in fact discrete amplitude pulses and not continuous waveforms. As can be seen in FIGS. 18a and 18b the recovered signals are still in phase quadrature at reference point D. These signals are now passed through output ports 440 and 442 to whatever audio demodulation section that may be employed in the receiver. The complex frequency spectrum associated with the signals of FIGS. 18a and 18b is depicted in FIG. 18c.

A mathematical representation of the transmitted tone demodulation of FIGS. 15–18, is expressed below in terms of the unit magnitude phaser. The real and imaginary components of the unit magnitude phaser are expressed in terms of sine and cosine waves. A simple transmitted tone applied to point A can be represented as follows:

$$A(t) = a \cos 2\pi f_o t$$
$$= a/2 \left( e^{j2\pi f_o t} + e^{-j2\pi f_o t} \right)$$

This signal is applied to quadrature mixers 422 and 424, together with the digital quadrature LO signals and 430 respectively. The digital quadrature LO signal, a complex waveform, can be expressed mathematically as follows:

$$B(t) = e^{j2\pi f_{lo} t}$$
$$= \cos 2\pi f_{lo} t + j \sin 2\pi f_{lo} t$$

The multiplication product output of mixers 422 and 424 is applied to digital lowpass filters 432 and 432'. The signals represented at point C can be represented as follows:

$$C(+) = a/2 [e^{j2\pi (f_{lo}+f_o)t} + e^{j2\pi (f_{lo}-f_o)t}]$$
$$= a/2 [\cos 2\pi (f_{lo}+f_o)t + \cos 2\pi (f_{lo}-f_o)t] +$$
$$j a/2 [\sin 2\pi (f_{lo}+f_o)t + \sin 2\pi (f_{lo}-f_o)t]$$

Lastly, the output waveform present at terminals and 442 can be represented as follows:

$$D(t) = a/2 \, e^{j2\pi (f_{lo}-f_o)t}$$
$$= a/2 \cos 2\pi (f_{lo}-f_o)t + j \, a/2 \sin 2\pi (f_{lo}-f_o)t$$

Thus, the demodulation of a transmitted tone received by a receiver employing a DZISS section has been described both graphically and mathematically.

Figure 19:
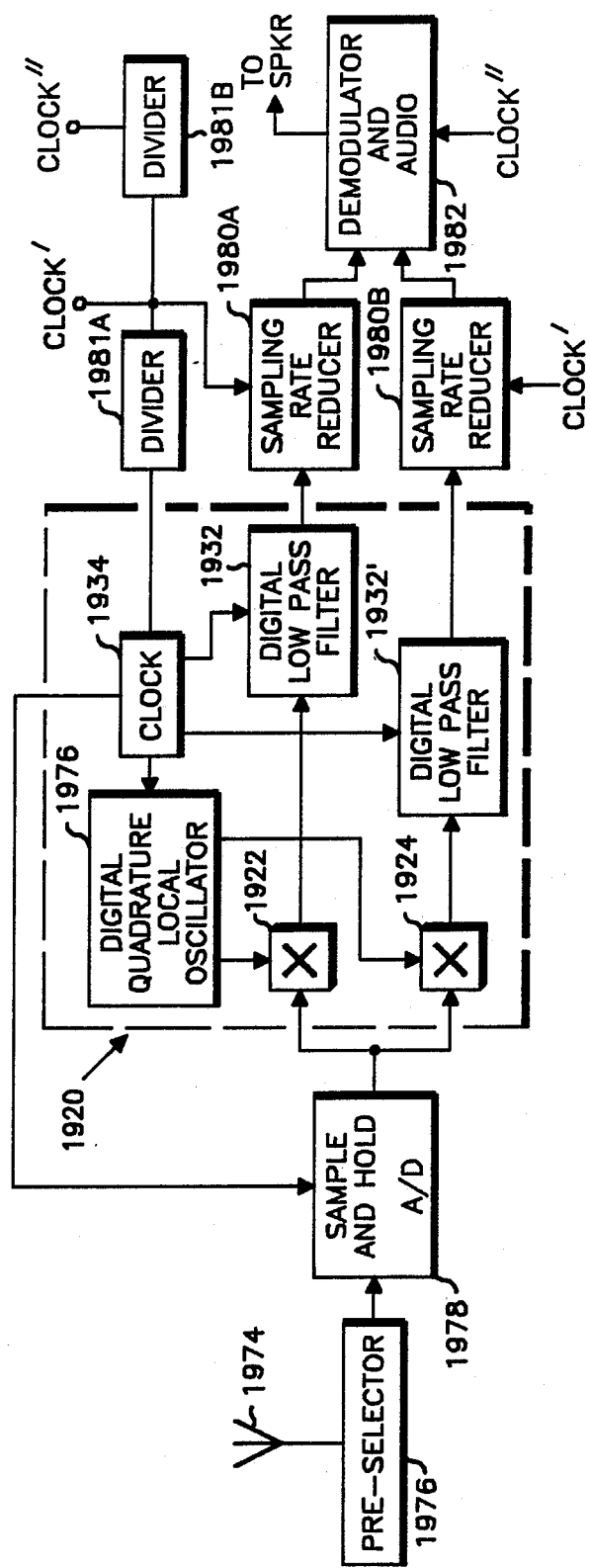
FIG. 19 is a block diagram of a receiver employing the digital zero-IF selectivity section of FIG. 4.

Referring now to FIG. 19, an exemplary block diagram of a receiver employing a DZISS is shown. Basically, the received radio frequency signal would be detected on the antenna 1974 and presented to preselector 1976. Preselector 1976 comprises an amplifier and a bandpass filter which may be implemented as a helical or ceramic filter as is well known in the art. The band-limited signal from preselector 1976 is next applied to sample and hold circuit 1978. Sample and hold 1978 may also perform the function of converting the received analog signal into digital form. Those skilled in the art will appreciate that this function may be implemented in separate blocks of a sample and hold followed by a conventional A to D; however, for the purposes of this illustration they can be considered to be one in the same.

In addition to the speed limitations previously described for lowpass filters 1932 and 1932', the operating speed of sample and hold (and A-to-D) 1978 will determine the maximum speed of the receiver (i.e. the faster the sample and hold circuit 1978 can operate the higher the frequency bandwidth of the receiver). The output of sample and hold circuit 1978, although represented as a single line, is in fact a multi-bit digital word as previously described in conjunction with various sections of DZISS 1920. These signals are split (identically) and applied to quadrature mixers 1922 and 1924 and the DZISS circuit operates, as previously described, to output a band-limited recovered signal centered at zero Hz.

The output signal is applied to sampling rate reducers 1980a and 1980b to lower the sampling rate, and hence the required power consumption of the following circuitry. This decimation process is also performed in digital lowpass filters 1932 and 1932' as previously described. Once the sampling rate has been lowered to an acceptable level (for example from 100 MHz to 100 kHz), the signals, still in phase quadrature, are applied to demodulation and audio recovery circuit 1982. Demodulation and audio circuit 1982 can be implemented in one of many known techniques and in particular may be a programmable digital signal processor (DSP) as is well known in the art. The output of demodulation and audio circuit 1982 may then be applied to an audio power amplifier and speaker to present the recovered audio to the receiver operator. Thus, a digital receiver employing the DZISS of the present invention is described.

Figure 20:
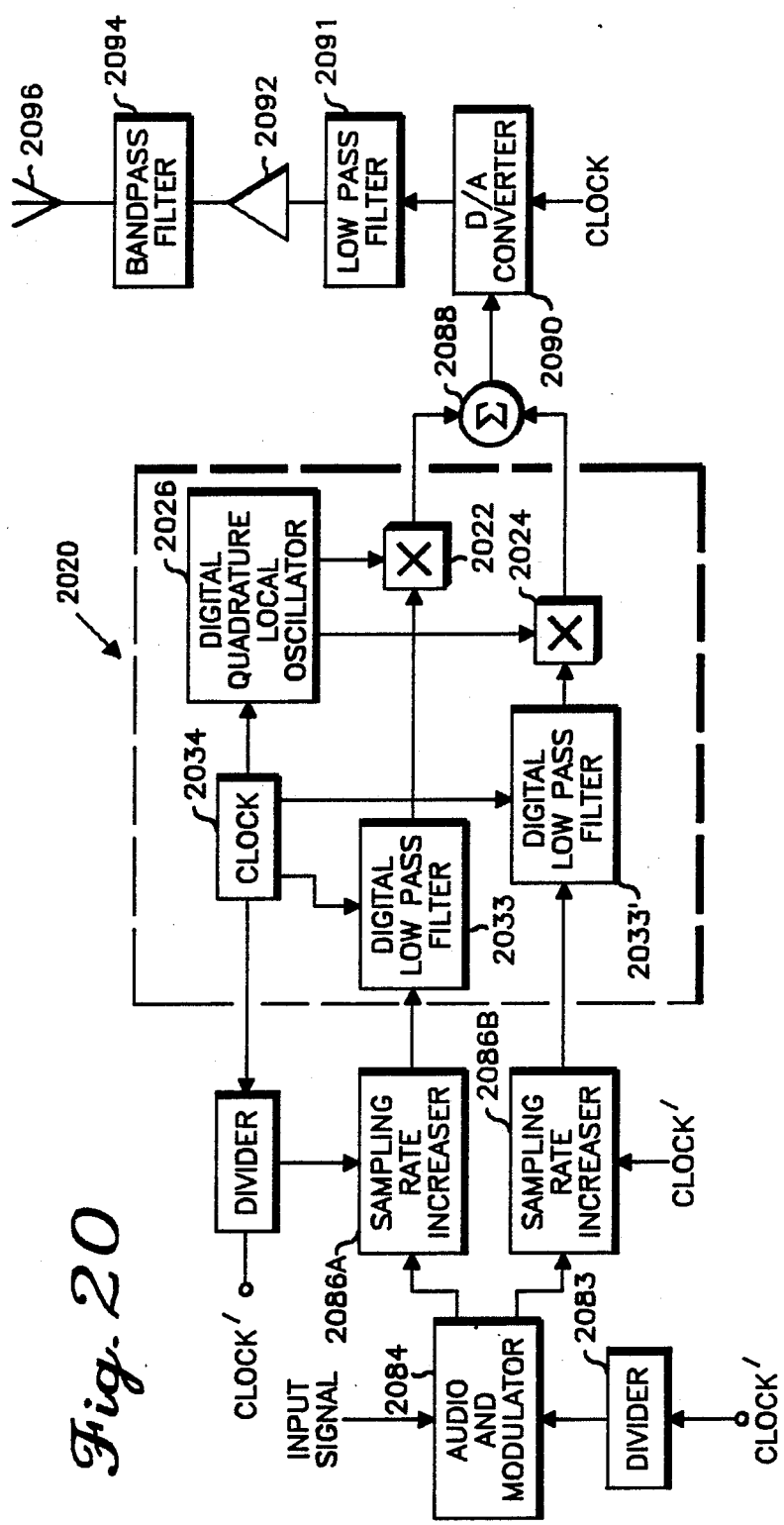
FIG. 20 is a block diagram of a transmitter employing the digital zero-IF selectivity section of FIG. 5.

Referring now to FIG. 20, an illustrative block diagram of a transmitter employing the DZISS of the present invention is shown. Basically, an input signal is applied to audio and modulator circuit 2084. The input signal may be a voice signal. If so, audio and modulator circuit 2084 may include an analog-to-digital converter. Conversely, the voice may have been previously converted to digital form prior to the audio and modulator block 2084 eliminating the A-to-D requirement. Alternatively, the input signal may already be in digital form if it were generated, for example, by a voice synthesis circuit. A further function of audio and modulation block 2084 is to split the audio signal into quadrature paths. These quadrature paths are applied separately to sampling-rate increasing circuits 2086a and 2086b. The increased sampled signal is now applied to digital lowpass filters 2033 and 2033' respectively. The filters bandlimit the digital signals in the same manner as previously described in conjunction with FIG. 5.

The band-limited signals are now applied to quadrature mixers 2022 and 2024 in addition to the quadrature LO signals from digital quadrature LO 2026. The output signals of quadrature mixers 2022 and 2024 are summed (2's complement) in summing circuit 2088 and applied to D-to-A circuit 2090. The output of D-to-A 2090 consists of a series of discrete finite-width amplitude pulses, which are smoothed into a continuous waveform by lowpass filter 2091, which is coupled to the output port of D-to-A 2090. The output of low pass filter 2091, now a continuous analog signal, is applied to power amplifier 2092 to have the signal power increased by an appropriate amount depending predominantly upon the required range of the transmitter. The amplified signal is again band-limited by bandpass filter 2094 to transmit only that portion of the spectrum that contains the information signal and not pollute the surrounding spectrum. The band-limited signal is broadcast through antenna 2096 as is well understood in the art. Thus a transmitter employing the DZISS of the present invention is described wherein the digital signal is converted back to analog form immediately prior to transmission.

Figure 21:
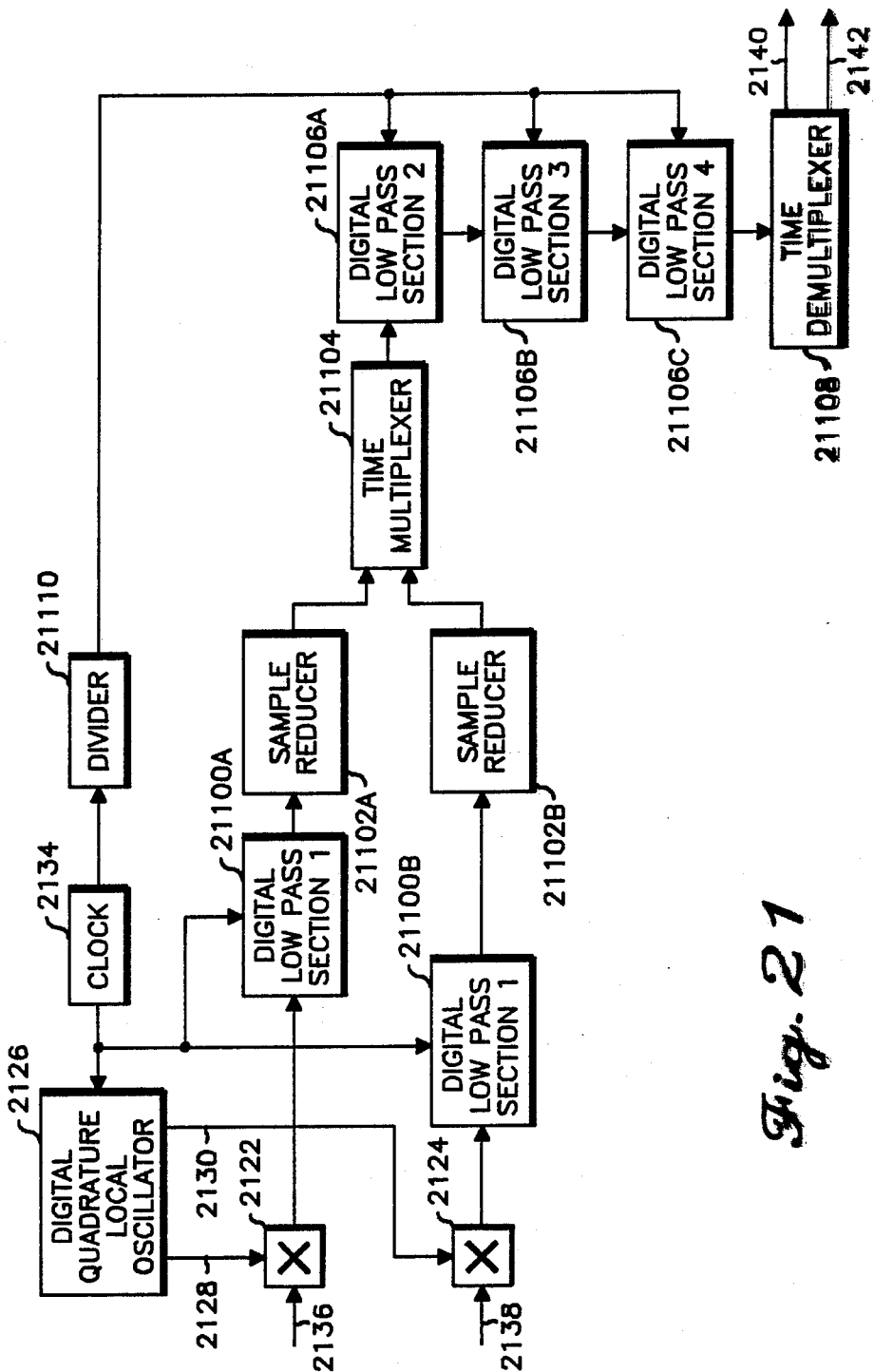
FIG. 21 is a block diagram of an alternate embodiment of the digital zero-IF selectivity section where the digital lowpass filters are divided into high speed and low speed sections and the low speed sections are time multiplexed which effectuate a cost and space savings.

Referring now to FIG. 21, an alternate embodiment of the DZISS for use in a receiver is depicted in block diagram form. As previously described, the input signal applied to connections 2136 and 2138 are applied as a first input to multipliers 2122 and 2124. A second input to quadrature mixers 2122 and 2124 are the digital quadrature LO signals 2128 and 2130, respectively. The N-bit multiplied products of mixers 122 and 2124 are next applied to a single section of the digital lowpass filter previously described in FIG. 8. Digital lowpass sections 21100a and 21100b provide two poles of filtering to each quadrature path by either the high-speed realization as shown in FIG. 14 or as embodied in FIG. 8 for lower data rates. After passing through filter sections 21100a and 21100b, the digital words are communicated to sampling rate reducers 21102a and 21102b respectively. The outputs of sampling rate reducers 21102a and 21102b are now applied to and 21102b are now applied to time multiplexing circuit 21104.

Basically, if the sampling rate is reduced by an appropriate amount, the last three sections of the digital lowpass filter can be time shared since there is so much time available between samples from the high speed section to the low-speed sections. This represents a significant cost and size savings in that three second order digital lowpass filter sections need not be implemented. Since digital lowpass sections 21106a–c process lower speed digital information, the clock speed driving then must be appropriately lowered. Therefore, clock 2134 is applied to divider 21110 to lower (by an amount comparable to sampling rate reducer 21102a and 21102b) the clock speed so that synchronization can be maintained.

The output of filter section 21106c is a band-limited digital signal of N bits identical to the signals at 440 and 442 of FIG. 4 (although they are time multiplexed). The output of filter section 21106c is applied to time demultiplexing circuit 21108 which separates the signals back into their original quadrature paths (although they are now appropriately band-limited), and outputs them on output ports 2140 and 2142 respectively. Thus, by choosing an appropriate decimation rate a significant cost and space savings may be realized.

Figure 22:
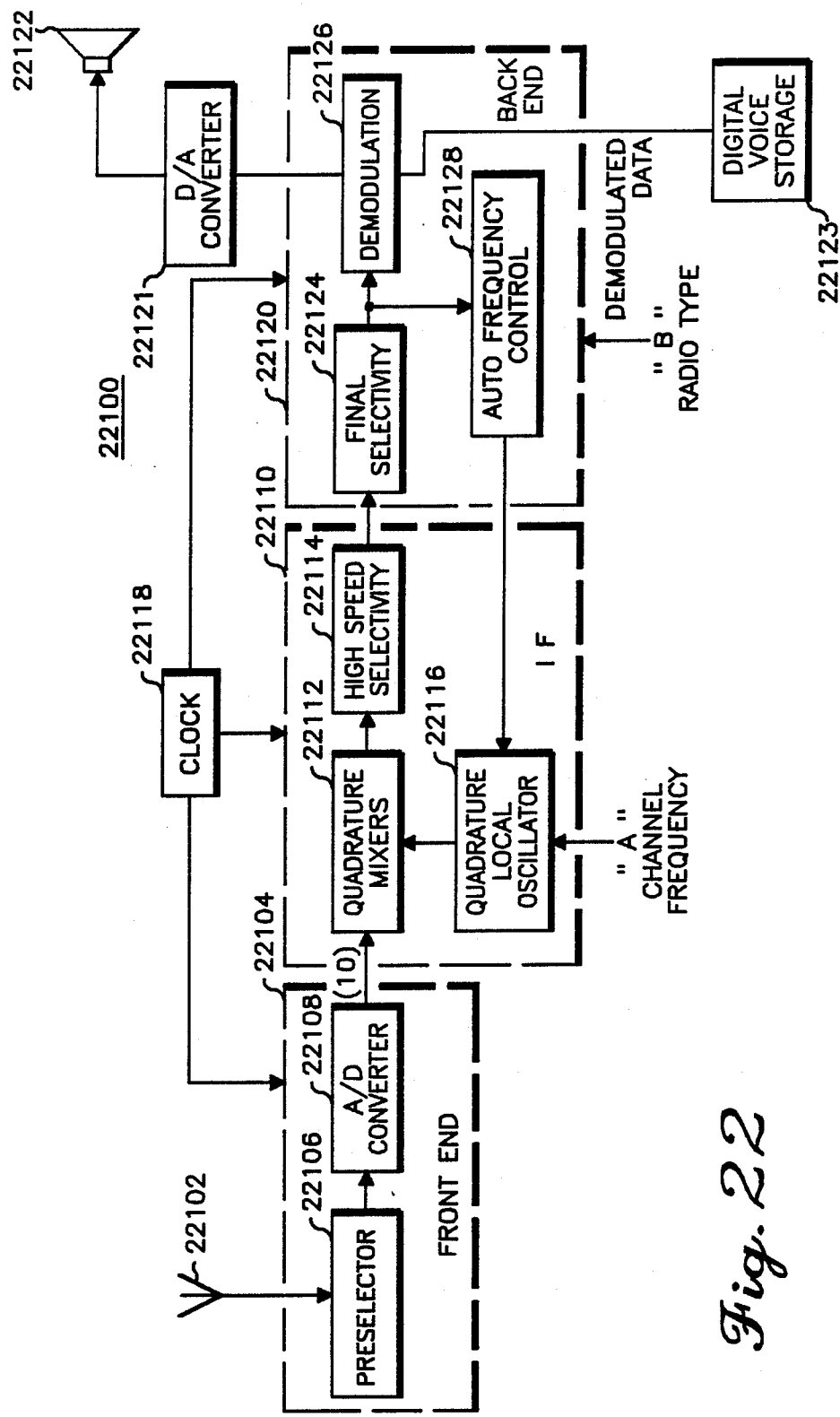
FIG. 22 is a block diagram showing the functions of the digital, receiver of the present invention.

FIG. 22 illustrates the functions of a digital receiver, comprising three major operations. While the diagram shows no example of receiver diversity, it will be obvious to one skilled in the art that various diversity approaches could be applied for use in a receiver of the present invention. In particular, the "front-end" section 22104, which is further detailed in FIG. 23, interfaces an antenna 22102, receiving an analog radio-frequency (RF) signal, to the digitally implemented IF selectivity section 22110. The preselector 22106 provides wideband filtering of the incoming signal, to prevent aliasing in the subsequent A/D conversion process. The A/D block 22108 includes the gain and sample-and-hold operations necessary for the digital processing of the present receiver structure.

Figure 24:
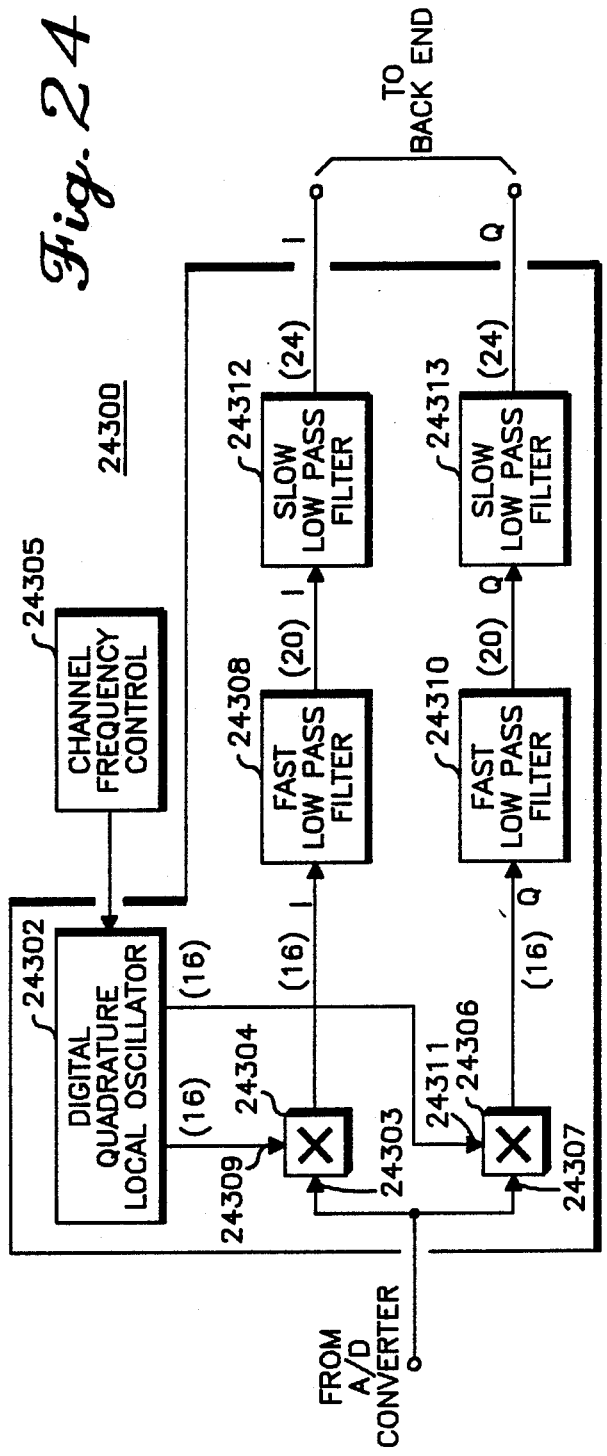
FIG. 24 is a block diagram of the digital zero I.F. selectivity section of the present invention.

The next major section, IF selectivity section 22110 further detailed below in conjunction with FIG. 24, provides a quadrature local oscillator (LO) 22116 which generates a complex exponential signal (quadrature signals sine and cosine). The frequency of this signal is selected by the system channel frequency input "A". The quadrature mixers 22112 use digital multipliers to frequency-shift the desired narrowband channel down to the IF frequency of approximately zero Hz. The high-speed selectivity section 22114 includes several cascaded narrowband lowpass filter sections, which remove undesired signals at higher frequencies from the desired signal which is centered near zero frequency. This lowpass filtering permits gradual sampling rate reduction from the high rates at the output of the A/D converter 22108 to rates comparable to the channel bandwidth at the input to the "back-end" section 22120.

The "back-end" section 22120 is used to "specialize" the general-purpose radio structure into one specifically tailored to a particular radio application, designated by a system radio-type input "B". Its best implementation may comprise a general-purpose digital signal processor (DSP). The final selectivity section 22124 provides any additional filtering needed prior to demodulation of the radio signal in accordance with the type of modulation and channel characteristics. For example, it may provide adaptive channel equalization for a digital data communications system. This filter section 22124 also provides adjacent channel attenuation, and passband equalization to compensate for imperfections in the characteristics of the high-speed selectivity filters 22114, resulting from the coarse coefficient quantization needed to implement multiplierless (lowpass) filters. The demodulation section 22126 may be software-programmed to implement many types of demodulation, including FM demodulation for voice and frequency-shift-keyed (FSK) data. The demodulated voice signal may be converted back to analog form, then amplified and played through a loudspeaker, as suggested by icons 22121 and 2122. Alternatively, a digital voice message may be stored in a digital memory 22123 for later playback. In a data communications system (not shown), the demodulated data symbols may be routed to a computer for further processing or to a computer terminal for immediate display. In addition, control information to implement automatic frequency tracking 22128 may be generated in the "back-end" section 22120. Finally, a clock-generation section 22118 is required to control the input sampling rate of the A/D conversion as necessary for accurate down conversion, to operate the digital circuitry in a regular fashion, and to control the output sampling rate, perhaps for synchronizing with subsequent systems. In the exemplary embodiment to be described here, the sampling rate fs is taken to be 20 MHz, and the band of frequencies to be received is centered at approximately 875 MHz.

Figure 23:
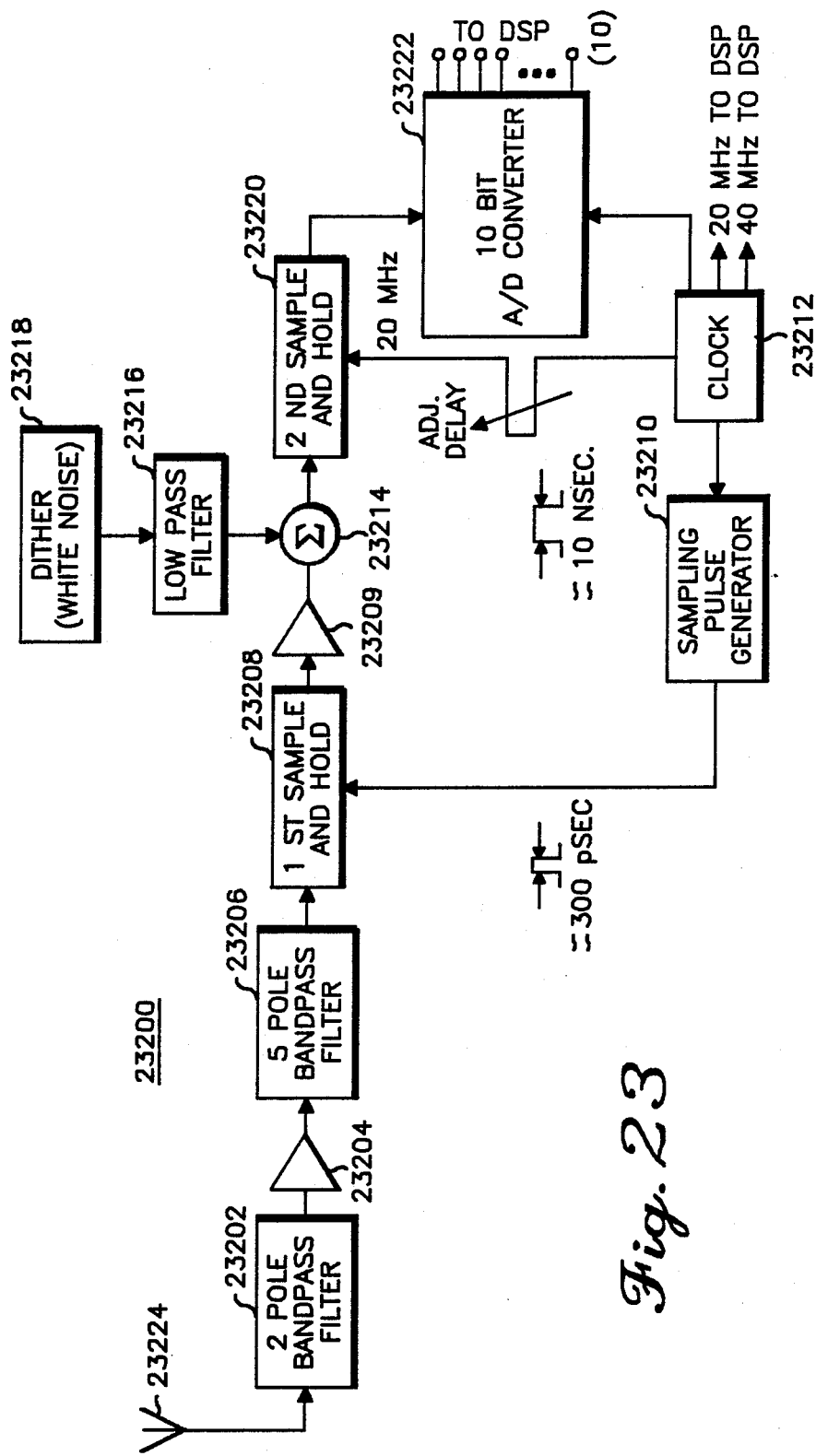
FIG. 23 is a schematic diagram of the front-end circuitry of the digital receiver of the present invention.

FIG. 23 is a schematic diagram of the front end circuitry of the digital receiver of the present invention. This circuitry functions to digitize a selected band of radio frequency signals. The present invention provides that sampling is done directly at R.F. frequencies. However, wideband pre-selection is provided by R.F. analog filters prior to sampling. The function of the R.F. filters 23202 and 23206 is to provide selectivity to spurious responses. These spurious responses included the image, half I.F. spurs, Able-Baker spurs, etc. as found in a conventional receiver front-end. In addition to these spurs, selectivity must be provided to frequencies which can be aliased by the sampling process. Maximum allowable bandwidth is limited to the Nyquist bandwidth ($f_s/2$, where fs is the sampling rate), although practical filters will significantly reduce this.

Use of a 2-pole and 5-pole filter as shown in FIG. 23, each with bandwidths of approximately 4- MHz, will provide greater than 90 dB rejection to aliased frequencies when sampled at a 20 MHz rate. In addition to providing selectivity to signals entering antenna 23224, filter 23206 bandlimits wideband noise entering the first sample and hold 23208 generated by R.F. preamplifier 23204. This is necessary to prevent aliasing of noise, thus effectively increasing the noise figure of the front-end 23200. R.F. preamplifier 23204 is used to amplify the R.F. signal to a sufficient level to provide the necessary signal-to-noise ratio needed for system sensitivity. Since different filters are needed for different bands, it is practical to include the R.F. amplifier 23204 as part of the filter structure (23202 and 23206). The receiver of the present invention provides an R.F. amplifier 23204 having a gain of approximately 28 dB and a noise figure of approximately 5 dB.

Clock 23212 and sampling pulse generator 23210 provide clock signals and sampling pulses to the first sample and hold 23208, second sample and hold 23220, the analog to digital converter 23222, and the digital zero-IF selectivity section (not shown). Clock generation may be accomplished by a 20 MHz crystal oscillator, which is widely available. A 40 MHz signal for use by the digital signal processor (not shown) is derived by doubling the 20 MHz signal by an analog doubling circuit.

The pulse generator 23210 is used to shape the 20 MHz clock signal (an approximate sinusoid) into very narrow pulses. The width of the sampling pulse depends on the highest frequency band desired to be received. A pulse width of approximately 300 psec. will generate a "comb" of harmonics with approximately uniform amplitude to approximately 1 GHz. This is necessary for operation at the operating frequency of approximately 875 MHz of the receiver of the present invention. Pulse generation may be accomplished using a conventional step recovery diode and ringing circuit. A circuit of this type is described in a publication entitled Harmonic Generation Using Step Recovery Diodes and SRD modules, Hewlett Packard Application note #920, available from Hewlett Packard Microwave Semiconductor Division, 350 Trimble Rd., San Jose, CA., 95131.

The band of signals amplified and selected by blocks 23202, 23204, and 23206 is sampled by the first sample and hold 23208. This is analogous to down-converting in a conventional R.F. receiver. Although a flash analog-to-digital converter effectively samples the signal, practical converters have band-limited inputs, thus requiring sampling prior to conversion. Also, to date, all known high resolution (>10 bits), high speed converters utilize a two-step conversion process. This type of converter necessitates the use of a second sample and hold circuit 23220.

Double sampling is necessary to overcome the practical limitations of acquisition time, accuracy, and droop. The first sample and hold must acquire extremely fast, in the range of 300 psec in the receiver of the present invention. This requires the use of a small hold capacitor in order to charge the capacitor from sample to sample to approximately the voltage of the input signal. The inability to completely charge in the sampling interval to the value of the input signal results in a mild filtering processing which can be considered negligible for narrowband signals typically used for land mobile communications. The use of a small hold capacitor in the first sample and hold results in a droop rate unacceptable for use by a two-step analog to digital converter. Also, settling time of a relatively simple hold circuit as can be used by the first sample and hold may be inadequate for a two-step converter. For these reasons, a high accuracy second sample and hold 23220 is used. Since the signal has been effectively down converted, it is changing at a much slower rate. This allows the use of a larger acquisition time and larger hold capacitor. Known two-step converters require the sample and hold to droop less than ½ the step size in significantly less than the sampling period (typically less than ½ the sampling period).

The first sample and hold (23208) may be implemented according to conventional techniques using a Schottky diode bridge and a dual gate MOS FET as the buffer amplifier. The second sample and hold may be realized using a Schottky diode bridge, with additional back biasing to limit droop in the hold mode. A high speed amplifier consisting of J-FETS in differential configuration as inputs and high dynamic range bipolar followers serves as a buffer amplifier.

Wideband amplifier 23209 is necessary to further amplify the signal in order to overcome the quantization noise of the analog to digital converter. The amplifier 23209 is used to amplify a sampled signal; hence it must be wideband. High dynamic range is also necessary to prevent amplifier nonlinearities from distorting the signal. The amplier 23209 noise figure is dependent on the amount of "takeover" gain provided by R.F. amplifier 23204 and overall noise requirements for sensitivity. A Motorola MHW591 CATV wideband amplifier is suitable for use as the wideband amplifier with the 800 MHz receiver of the present invention. An A/D converter structure similar to the type described herein is shown in an article by Muto, Peetz, and Rehner entitled Designing a 10-bit, 20 Ms-Per-Second Analog-to-Digital Converter System, HEWLETT 'PACKARD JOURNAL, Vol 33, #11, pp. 9–29, Nov 1982.

According to the teachings of the present invention, a dither signal 23218 is added to the sampled signal at combiner/isolator 23214. The combiner/isolator helps prevent nonlinearities present in the wideband amplifier and dither source from translating the low passed noise to other frequencies. The purpose of the dither 23218 is to uniformly spread quantization noise of the analog-to-digital converter. The uniform spreading of the noise floor over the Nyquist bandwidth prevents intermodulation distortion caused by quantizing from being an inherent problem, and also allows signal recovery below the least significant bit level, thus reducing gain requirements before the A/D converter and easing the problems caused by non-linearities in the stages preceding the converter. The dither signal 23218 must be added before the second sample and hold 23220 if a two-step converter is used since the signal must be held constant during the conversion period. The dither source 23218 can be realized by using an analog noise source such as a noise diode. The general characteristics and advantages of dither signals are described in a paper by Schuchman, L., Dither Signals and Their Effect on Quantization Noise, IEEE TRANSACTIONS ON COMMUNICATIONS TECHNOLOGY, pp. 162–165, Dec. 1964.

Noise added to the signal should be spectrally isolated from the information. The sampling performed in the 800 MHz receiver of the present invention places the information approximately between 3 and 7 MHz. Low pass filter 23216 prevents noise from being added to the information signal. The receiver of the present invention is provided with a 5-pole elliptic filter with a 1.5 MHz cutoff frequency for low-pass filter 23216. The average voltage level of the dither signal over the noise equivalent bandwidth of the low pass filter 23216 should be greater than approximately 5 step sizes of the analog to digital converter. Care must be exercised to prevent the dither signal from causing clipping at the A/D converter 23222.

The analog-to-digital converter 23222 converts the analog signal to a digital signal. The converter must be capable of accepting signals over the dynamic environment of the intended receiver application. For the land mobile communications application, a minimum of 10 A/D bits is necessary, and theoretical studies indicate the dynamic range provided by a 12-bit converter should be comparable with all existing conventional land-mobile receivers. The two factors of prime importance of the analog to digital converter 23222 are sampling speed and step size. The step size determines the amount of gain necessary prior to the converter in order to take over the quantization noise floor. The larger the step size, the larger the gain requirement. Large amounts of gain result in nonlinear effects prior to the converter. Conversion speed is also very important since this determines the allowable bandwidth of the front-end filters, and also reduces the gain requirement by spreading the quantization noise over a larger bandwidth.

An analog to digital converter 23222 satisfactory for use with the 800 MHz digital receiver of the present invention is a two-step 10-bit converter with a step size of approximately 3 mV, which is capable of converting at rates greater than 50 MHz. According to the principles of the present invention, a front end gain of approximately 54 dB is necessary to realize a post detection signal to noise ratio of approximately 10 dB in a receiver having a 30 kHz bandwidth when receiving a 0.3 $\mu v$ signal sampled at a 20 MHz rate. The large amount of gain necessary prior to converter 23222 limits the non-linear performance of the system. Intermodulation ratio (IMR) is limited to approximately 65 dB which is somewhat less than that achievable by conventional receivers. It will be obvious to one of ordinary skill in the art that a reduction of the step size to approximately 200 $\mu V$ will allow an IMR>80 dB to be achieved. This value is comparable with most existing conventional 800 MHz receivers.

Referring now to FIG. 24, a digital zero-IF selectivity section (DZISS) compatible with the practice of the present invention is depicted in block diagram form. The digital zero-IF selectivity section is disposed between the front-end circuitry 23200 of FIG. 23 and the backend DSP 22120 of FIG. 22, and it operates to convert the modulated digital RF signal output by front end 23200 to the baseband signal processed by the backend DSP 22120. The DZISS 24300 is comprised of an in-phase mixer 24304, a quadrature-phase mixer 24306, a digital quadrature local oscillator (LO) 24302 (providing an in-phase L0 signal 24309 and a quadrature phase L0 signal 24311), two "fast" digital lowpass filters 24308 and 24310, two "slow" digital lowpass filters 24312 and 24313, and a clock source (not shown).

In the practice of the present invention identical digital information is applied to both the in-phase mixer 24304 and the quadrature-phase mixer 24306 at input ports 24303 and 24307 respectively. Generally, ports 24303 and 24307 are not single lines, but are in fact multiple lines representing a multi-bit (e.g., 10 or 12 bits) digital word. The actual length of the digital word used in any given application is dependent upon many factors, including: the resolution required, the dynamic range required and the frequency of sampling the received RF signal. For example, a word length of 12 bits is considered to have an acceptable performance in receiving a typical radio signal sampled at 20 MHz.

Mixers 24304 and 24306 have as a second input quadrature LO lines 24309 and 24311, respectively. As with the A/D output signal discussed above, the LO signals are not single connections, but are multi-bit discrete time representations of signals that are 90 degrees apart in phase (i.e., sine and cosine waveforms). Mixers 24304 and 24306 perform arithmetic multiplications of the A/D input word and the LO word, rounding the result to form an output word that is applied from the output ports of mixers 24304 and 24306 to the input ports of digital lowpass filters 24308 and 24310, respectively. The digital word lengths of the LO and mixer output signals may be selected to yield acceptable noise performance. As the digital word is lengthened, more quantization levels are available to represent the signals. The smaller quantization increments lead to improved noise performance, as is well understood in the art. This quadrature mixing process described above is analogous to that performed in an analog "zero-IF", or direct conversion receiver. However, the use of truly linear digital multipliers precludes second order mixing of undesired signals to D.C., and other undesirable effects, as occurs with analog direct conversion.

The quadrature mixing performed by multipliers 24304 and 24306 acts to frequency-translate the desired signal to a center frequency of approximately zero Hz, where the amount of frequency translation may be determined by channel frequency control 24305. The resultant quadrature signal may then be lowpass filtered to remove out-of-band noise and undesired signals. In the preferred practice of the present invention, this selectivity is provided in two stages. The first stage is formed by fast recursive digital filter sections 24308 and 24310. Digital filters 24308 and 24310 are identical in structure and may be formed from a recursive filter topology which will be described below in greater detail. The remaining selectivity is provided by "slower" recursive filters 24312, and 24313, respectively. This choice of architecture will be discussed in more detail below. Following the filtering process, the digital signals are output to a backend DSP 22120 for further processing.

Figure 25A:
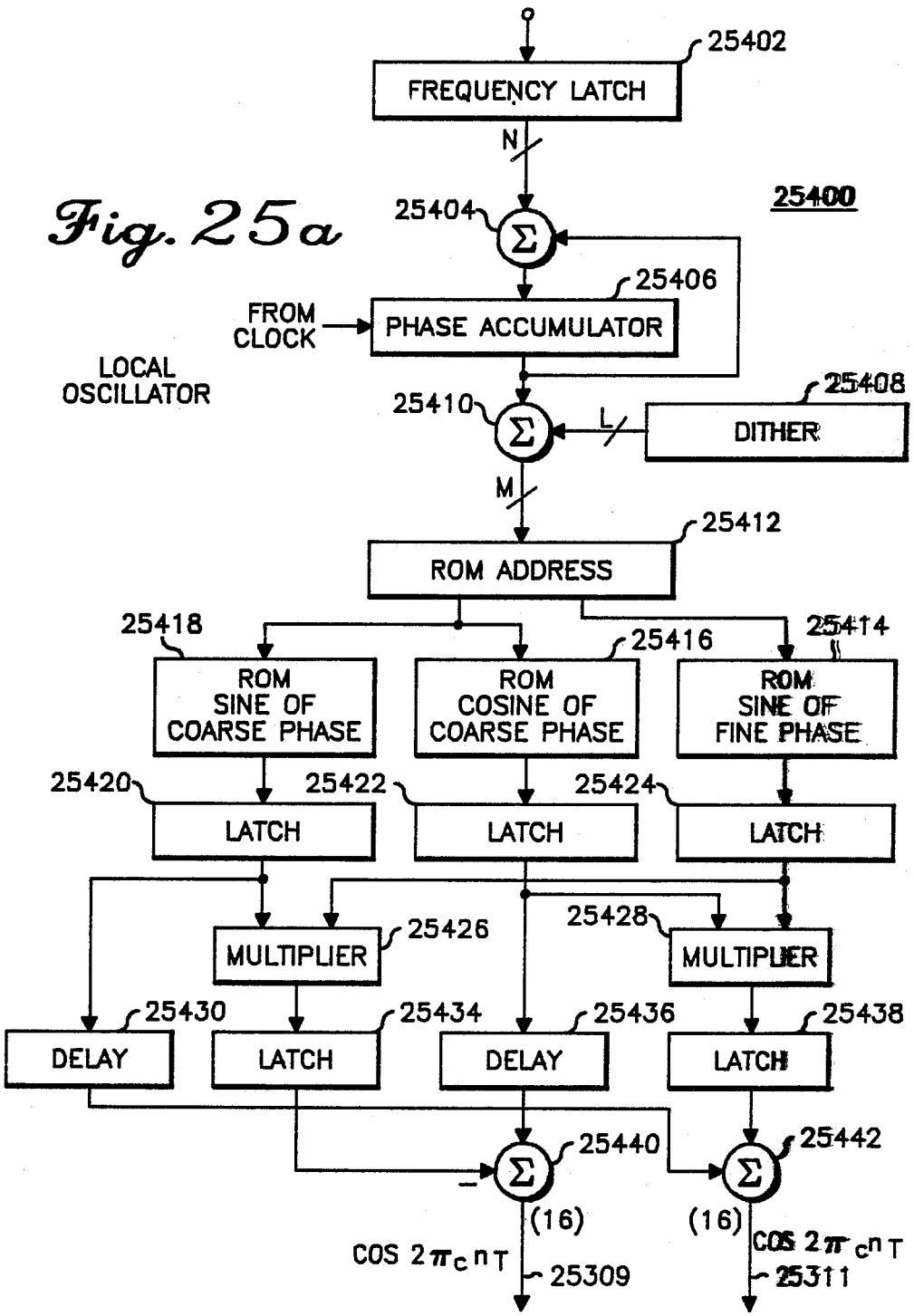
FIG. 25a is a schematic and block diagram of the digital oscillator referenced in FIG. 22.

FIG. 25a is a schematic and block diagram of the digital oscillator described in conjunction with FIG. 24. Recall that the function of the quadrature oscillator is to provide digitized, sampled versions of the cosine and sine waveforms utilized in the quadrature mixing process. Implementation of the digital zero-IF selectivity section depends on the ability to generate accurate, stable digital representations of these waveforms. A class of digital oscillator realizations particularly suited to the requirements of the present invention is based on the concept of ROM (read only memory) lookup. Consider the generation of a digital signal comprising samples of the complex sinusoid:

$$w(t) = e^{j2\pi f_c t},$$

where $f_c$ is the desired oscillator frequency.

According to conventional communications theory, $$e^{j2\pi f_c t} = \cos 2\pi f_c t + j \sin 2\pi f_c t$$

Thus the desired cosine and sine waveforms may be regarded as the real and imaginary parts, respectively, of the complex sinusoid waveform. The sampled version of $e^{j2\pi f_c t}$ is obtained by replacing the continuous time variable t by the discrete time variable nT, where n is a counting integer (1,2,3,...) and T is the sampling period, which equals $1/f_s = 1/\text{sampling rate}$. This discrete time signal is then equivalent to:

$$w(n) = e^{j2\pi f_c(nT)}$$

ROM lookup methods of generating this signal follow from making the frequency variable fc, as well as the time variable, discrete. If we let $f_c = kf_s/2^N$ (where k and N are integers), then:

$$w(n) = e^{j2\pi k f_s(n/f_s)/2^N} = e^{j2\pi nk/2^N}$$

It can be seen that cosine and sine values for only $2^N$ different phases need be generated. One method of generating these values, called direct ROM lookup, basically involves the use of ROM table containing the $2^N$ pairs of values (cosine and sine), which is addressed by a register containing the integer nk (proportional to phase). The phase register is incremented by the value k (corresponding to the desired frequency $f_c$) at each sample time (corresponding to n). The frequency resolution obtained is $\Delta f = f_s/2^N$, wherein $2^N$ distinct frequencies can be generated.

Depending on the application, the direct ROM look-up technique may involve large amounts of ROM. The ROM size may be reduced somewhat by taking advantage of the symmetric properties of cosine and sine waveforms. Such properties allow the number of table entries to be reduced from $2^N$, to $2^N/8$, pairs of numbers. Even with this reduction the ROM size may still be excessive. In such cases, a technique called Factored ROM lookup may be employed to further reduce ROM size.

The digital local oscillator of the present invention uses the factored ROM look-up technique utilizing the fact that the unit magnitude phasor can be broken into a complex product of "coarse" and "fine" phasors. Thus, the unit magnitude phasor $e^{j\phi}$ can be represented dividing the signal into $e^{j\phi_c} \cdot e^{j\phi_f}$. Therefore, the unit magnitude phasor can be realized by having separate coarse value phasors and fine-value phasors stored in ROM which are multiplied together to get the discrete time sine and cosine values required for the quadrature mixers. The advantage of this factorization is that the amount of ROM necessary to store the coarse-value and fine value phasors is greatly reduced from that required for the direct ROM look-up approach. The expense paid for this ROM size reduction is the introduction of circuitry to perform the complex multiplication of coarse and fine phasors. Generally, a complex multiplication can be implemented with four multipliers and two adders. By proper selection of the fine-value phasor, and recalling that the cosine of a small angle can be approximated by one, the ROM for the cosine fine-value phasor can be eliminated. Further, by approximating the small angle cosine values as one, two multipliers can be eliminated from the multiplication structure required to generate a complex product. This results in both a cost and size savings in the factored ROM implementation.

Referring still to FIG. 25a, the digital quadrature local oscillator 25400, as implemented using a factored-ROM approach, is depicted in block diagram form. Frequency information, in the form of an N bit binary number proportional to the desired frequency, within the band sampled by the A/D converter, is loaded into the channel frequency latch 25402. Channel frequency latch 25402 may be realized in many different forms. For example, assuming that N=20, five cascaded 74LS175's (Quad D flip-flops), manufactured by Motorola, Inc., and others, provide an acceptable implementation. Those skilled in the art will appreciate that channel frequency latch 25402 may be loaded by various means. For example, in a single frequency radio the channel frequency latch could be permanently loaded with a single binary number. For multiple frequency radios, channel frequency latch 25402 could be loaded from an EPROM or ROM look-up table or else calculated by and latched from a microprocessor.

The output of channel frequency latch 25402 is coupled to a binary summer 25404. It will be understood by those skilled in the art that in the following discussion of digital quadrature local oscillator 25400 all coupling lines in between the functional blocks are in fact multi-bit binary words and not single connections. The output of adder 25404 is coupled to phase accumulator 25406. Phase accumulator 25406 can be implemented as an N-bit binary latch which is used to hold the address of the next location of ROM to be addressed. Thus, the output of phase accumulator 25406 may be directly coupled to cosine coarse-value ROM 25418, sine coarse-value ROM 25416, and sine fine-value ROM 25414 (recall that fine-value cosine ROM is not required, as it is being approximated by one). Further, the output of phase accumulator 25406 is fed back into summer 25404 to be added (modulo $2^N$) to the binary number representing the channel frequency information located in the channel frequency latch 25402. The output of phase accumulator 25406 is updated once every clock pulse, which is generally the sampling frequency. The result of this binary addition is that phase accumulator 25406 is holding the binary sum (proportional to phase) of the last address plus a binary vector contained in the channel frequency latch. This number indicates the next address to be required to create the quadrature local oscillator signals cos $2\pi f^c nT$ and sin $2\pi f^c nT$.

In the preferred embodiment, the ROM size may be reduced, or equivalently, the frequency resolution may be improved without increasing the ROM size, by adding a digital dither signal to the output of phase accumulator 25406 and truncating the result prior to addressing the ROM tables. The frequency resolution of the local oscillator is defined by the data path width (N) of the phase accumulator and the sampling rate $f_s$ required. The most straight-forward method of increasing frequency resolution is to add more bits to the phase accumulator and increase the size of the ROM tables. However this can be an expensive solution since the ROM must double in size for each bit added to the phase accumulator. Another option would be to add bits to the phase accumulator but truncate the additional bits before performing the ROM look-up. This introduces severe phase rounding and causes spurs in the local oscillator output. In order to avoid these spurs a low level dither signal is added to the accumulator output before truncation.

According to the principles of the present invention, the frequency resolution of the digital oscillator may be enhanced, without increasing ROM size and without introducing spurs in the output, by adding a binary dither signal to the output of phase accumulator 25406 before truncating. To accomplish this, digital oscillator 25400 is provided with an L-bit dither source 25408, which generates an L-bit wide, uniform probability density, pseudorandom "white noise" signal. Dither source 25408 is clocked at the sampling frequency $f_s$, so as to provide a new L-bit dither word for every phase word output from phase accumulator 25406. An N-bit dither word is formed by appending M=N−L leading zeroes to the L-bit dither word output from dither source 25408. This composite N-bit dither signal is added to the N-bit output of phase accumulator 25406 by N-bit binary adder 25410, in Modulo $2^N$ fashion. The sum output of adder 25410 is then truncated to M bits (truncation not shown). In practice this truncation process is achieved by simply ignoring the least significant bits produced at the output of digital adder 25410. The truncation operation itself allows for reduced ROM size.

Quantization or truncation of the binary phase word produces distortion or noise in the generated sine and cosine waveforms. Since the phase is a periodic function (sawtooth), the noise produced by quantization would also be periodic unless it is randomized somehow. Periodic noise would result in discrete "spurs" in the oscillator output spectrum which are undesirable in most applications if their level exceeds some threshold. Addition of the dither signal prior to phase quantization randomizes the phase noise, resulting in a more desirable white noise spectrum at the output. The binary phase word is represented by a binary word of N bits. The dither signal comprises a pseudo-random binary word of L bits which is summed with the N bit phase word. The process results in a binary word N=L+M bits. This binary word is then truncated to a binary phase word of M bits which is relatively free of the spurious signals described above.

The effect of phase quantization on oscillator output noise can be shown by the following analysis. The desired oscillator output is described by the following equation:

$$w(n) = e^{j2\pi f_c nT} = e^{j\phi(n)}$$

If the phase angle is quantized with error (n), the actual output is described as follows:

$$\underline{w}(n) = e^{j[\phi(n)+\delta(n)]}$$

The error introduced is:

$$E(n) = \underline{w}(n) - w(n) = e^{j[\phi(n)+\delta(n)]} - e^{j\phi(n)}$$
$$= e^{j\phi(n)}[e^{j\delta(n)} - 1]$$

For the case of interest where $\delta(n)$ is very small (<<1), $e^{j\delta}$ is (n) can be approximated by $1+j\delta(n)$, thus yielding:

$$E(n) = e^{j\phi(n)} \cdot j\delta(n)$$

The spectrum of E(n) can be seen as simply a frequency translation (and unimportant scaling by j) of the spectrum of the phase quantization noise $\delta(n)$. Thus if $\delta(n)$ is random or "white", so is E(n). Furthermore, the power of E(n) equals the power of $\delta(n)$, allowing the output noise level created by the phase noise to be easily estimated.

Choosing the power level of the dither signal involves a tradeoff between noise whitening effect and output noise power level. As the dither power is increased (by increasing the number of bits, L, in the dither signal), the noise becomes more whitened, but the total phase noise power increases as well. It can be shown that if the dither signal exhibits a uniform probability density, the choice of L=N−M results in the preferred level of dither power since it represents the smallest dither signal necessary to completely whiten the phase quantization noise. Thus, in the preferred implementation, the number of dither bits L equals the number of bits discarded in the truncation process. It may be noted that dither signals exhibiting other than uniform probability density may be utilized. However, a uniform density is preferred as it is the most easily generated. With L=N−M, the variance (power) of the phase noise is equal to 2 times the equivalent phase variance of the dither signal. Given a desired frequency resolution, determined by N and $f_s$, then L and M, and hence the required ROM size, are determined by the allowable level of white noise at the oscillator output.

As an example, with $f_s = 20$ MHz, and N=20 bits, the frequency resolution is 19.07 Hz. Truncating to M=17 bits (to reduce ROM size by a factor of 8) without dither creates spurs in the oscillator output, which for one particular frequency are 98 dB below the level of the desired signal. Addition of a 3-bit dither signal prior to truncation whitens the error signal, eliminating the spurs. According to the principles of the present invention, the frequency resolution of the digital oscillator, for a given level of output noise, can be increased indefinitely by simply adding more bits to the frequency and phase latches, and to the dither signal. The ROM size, determined by M, remains constant. The M-bit binary word retained after truncation is coupled to the ROM address latch 25412, whose output is coupled to ROM's 25418, 25416, and 25414. Upon receiving an address, ROM's 25418, 25416, and 25414 output the digital binary word located at the received address on their respective output ports. The digital quadrature signals are then arithmetically generated from the three binary numbers.

As stated previously, the output signals of ROM 25416, and 25418 are binary numbers proportional to the cosine and sine of the coarse phase. The output signal of ROM 25414 is a binary number proportional to the sine of the fine phase. In order to minimize the error in the fine cosine approximation, the fine phase values used are the values centered around the positive axis. The output of ROM address latch 25412 is an M bit number that is divided into a Mc bit coarse address and an $M_f$ bit fine address where $M=M_c+M_f$. The coarse phase is $2\pi(P_c+\frac{1}{2})/2^{M_c}$, where $P_c$ is the integer corresponding to the $M_c$ bit coarse address. The fine phase is $2\pi(p_f-2^{M_f-1})/2^M$, where $P_f$ is the integer corresponding to the $M_f$ bit fine address. For example, if $M_c=10$ and $M_f=7$, the ROM table entries may be configured as shown below in Tables 1 and 2.

TABLE 1

| Address ($P_c$) | Contents of coarse COS ROM at address '$P_c$' | Contents of coarse SIN ROM at address '$P_c$' |
|---|---|---|
| 0 | COS $2\pi \cdot (1)/2^{11}$ | SIN $2\pi \cdot (1)/2^{11}$ |
| 1 | COS $2\pi \cdot (3)/2^{11}$ | SIN $2\pi \cdot (3)/2^{11}$ |
| 2 | COS $2\pi \cdot (5)/2^{11}$ | SIN $2\pi \cdot (5)/2^{11}$ |
| 3 | COS $2\pi \cdot (7)/2^{11}$ | SIN $2\pi \cdot (7)/2^{11}$ |
| 4 | COS $2\pi \cdot (9)/2^{11}$ | SIN $2\pi \cdot (9)/2^{11}$ |
| . | | |
| . | | |
| 1022 | COS $2\pi(2045)/2^{11}$ | SIN $2\pi(2045)/2^{11}$ |
| 1023 | COS $2\pi(2047)/2^{11}$ | SIN $2\pi(2047)/2^{11}$ |

TABLE 2

| Address ($P_f$) | Contents of fine SIN ROM at address '$P_f$' |
|---|---|
| 0 | SIN $2\pi(-64)/2^{17}$ |
| 1 | SIN $2\pi(-63)/2^{17}$ |
| 2 | SIN $2\pi(-62)/2^{17}$ |
| 3 | SIN $2\pi(-61)/2^{17}$ |
| . | |
| . | |
| 126 | SIN $2\pi(62)/2^{17}$ |
| 127 | SIN $2\pi(63)/2^{17}$ |

To generate the cosine waveform (i.e., the real component of the complex waveform), the outputs of sine coarse-value ROM 25418 and sine fine-value ROM 25414 are first multiplied in multiplier 25426. The output of multiplier 25426 is fed to summing circuit 25440 where it is subtracted (2's complement form) from the output of cosine coarse-value ROM 25416. This arithmetic process yields the cosine-value which is output on port 25441 and coupled to quadrature mixer 24304 of FIG. 24. To generate the sine values of the digital quadrature LO the outputs of the cosine coarse-value ROM 25416 and sine fine value ROM 25414 are multiplied in multiplier 25428. The output of multiplier 25428 is fed to a summing circuit 25442 where it is summed with the output of sine coarse-value ROM 25418. Summing circuit 25442 outputs via connection 25443 the discrete time sine value digital word which is coupled to quadrature mixer 24306 of FIG. 4. Therefore, since the discrete time values of the sine and cosine signals are calculated mathematically, perfect 90 degree phase control is achieved using minimal ROM space. Latches 25420, 25422, 25424, 25434 and 25438 provide pipelining which facilitates high operating speed of the digital oscillator. Delays 25420 and 25436 are provided to equalize the delays of the various signal paths.

The factored ROM LO reduces the ROM area while maintaining acceptable frequency resolution. For example, to implement a digital quadrature LO that operates at 20 MHz, the coarse-value ROM's 25416, 25418 could each be implemented in a 1024×16 ROM and the fine-value sine ROM 25414 could be implemented in a 128×8 ROM. This would result in frequency resolution of approximately 20 Hz using approximately 34,000 bits of ROM. The factored-ROM configuration is preferred for operation at high sampling rates, since, except for the phase accumulator, there is no circuitry connected in a feedback manner. This allows the rest of the LO circuitry (especially multipliers 25426 and 25428, which represent the main speed bottleneck) to be pipelined to achieve a very high operating rate. Pipelining would consist of introducing latches at certain critical points, such as within the multipliers themselves, as is well understood in the art. Thus, a factored-ROM LO is described which outputs discrete time digital quadrature signals which exhibit a selected frequency.

A digital adder suitable for use with the apparatus of the present invention may be of a type constructed with several 74LS181 4-bit arithmetic logic unit devices, connected in parallel. These devices are shown and described in a data manual entitled "Motorola Schottky TTL Data Book", available from Motorola, Inc., Box 2092, Phoenix, Arizona, 85036. ROMs 25418, 25416 and 25414 may be formed by a variety of well known ROM devices such as a 82LS181 available from Signetics Corporation, 811 E. Argues Avenue, P. 0. Box 3409, Sunnyvale, Calif. 94088, and described in the "Signetics Bipolar Memory Data Manual", 1984. Both multiplier 25426 and 25428 may be realized as, for example, an MPY016K manufactured by TRW, Inc. TRW Electronic Components Group, P. 0. Box 2472, LaJolla, CA. 92038.

The amount of coarse-value ROM required can be further reduced by taking advantage of symmetries in the cosine and sine wave forms, and thereby storing only the values of the unit magnitude phasor residing in the first octant (i.e., the first 45 degrees) of the phasor unit circle. Those skilled in the art will appreciate that the unit magnitude phasor represents sine or cosine values rotating through 360 degrees. Due to the symmetrical nature of sinusoidal waveforms, the values of the cosine and sine waveforms over the first octant of the unit circle are identical to the values of these waveforms over any other octant, except for possible sign changes and reversal of roles (i.e., sine becomes cosine and vice versa). Therefore, the only coarse-value phasors that are required are those in the first octant provided there is an indicator of which octant the phasor is currently residing, and there is circuitry present to negate (i.e., change sign) and/or exchange the outputs of coarse-cosine ROM 25416 and coarse-sine ROM 25418 according to the current octant. An octant indicator is readily implemented using three binary bits of the ROM address. For example, the three most-significant-bits (MSB's) could be used to indicate the octant, and the remaining bits used to address the ROM for the coarse-valued phasor.

Figure 25B:
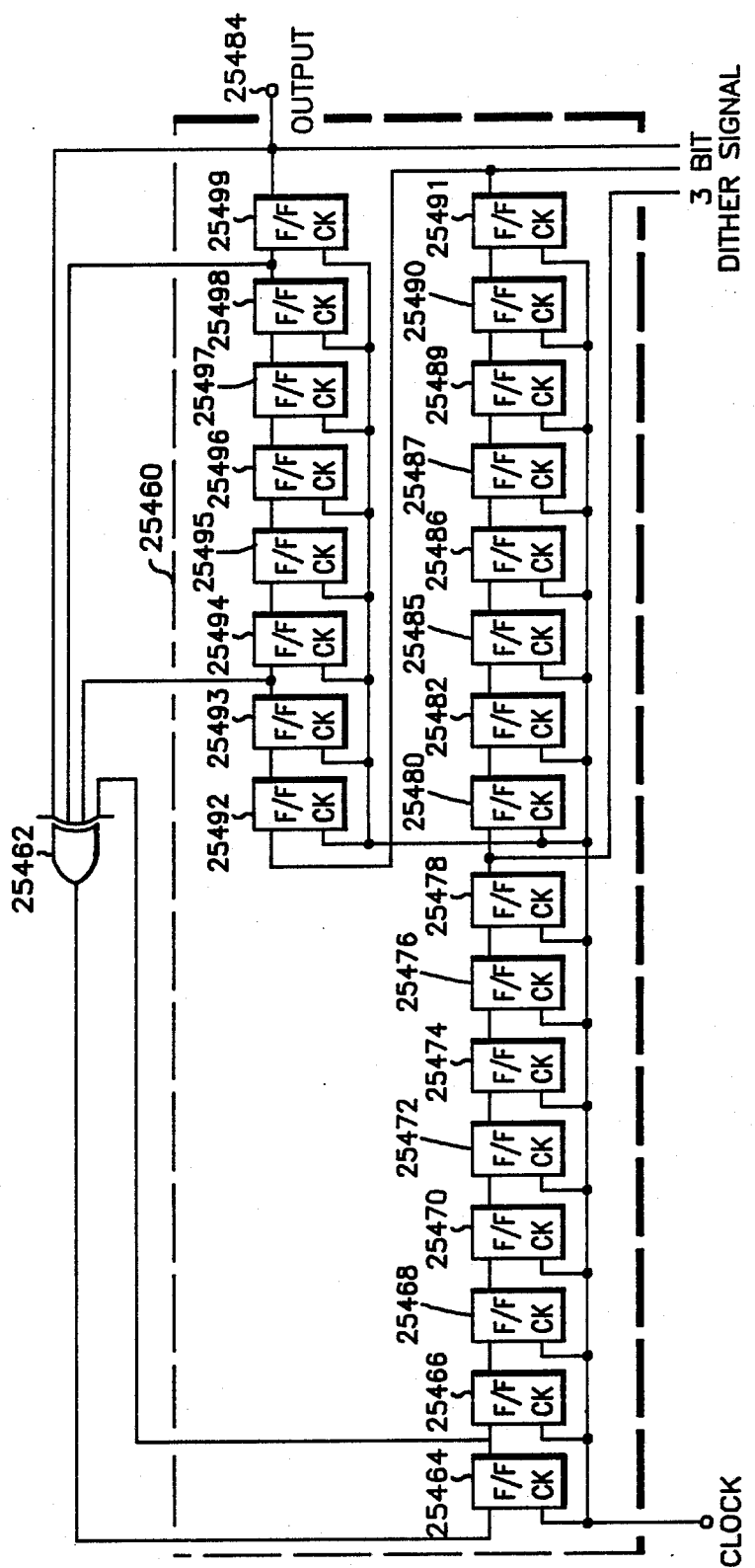
FIG. 25b is a schematic diagram of a pseudorandom dither generator compatible with the digital zero I.F. selectivity section of FIG. 24.
Figure 27A:
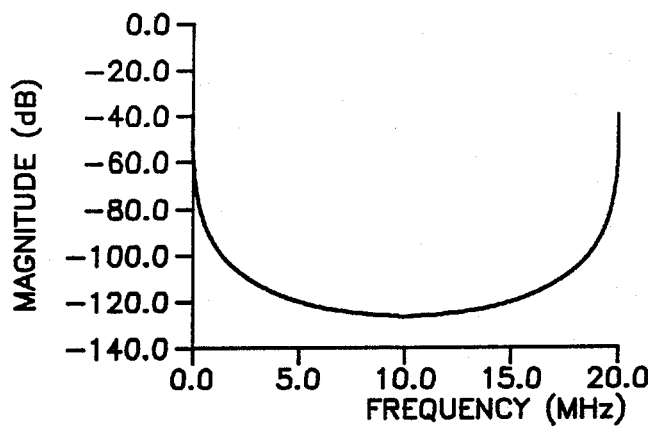
FIGS. 27a through 27d are frequency diagrams detailing the characteristics of the fast lowpass filters of FIG. 26.
Figure 27B:
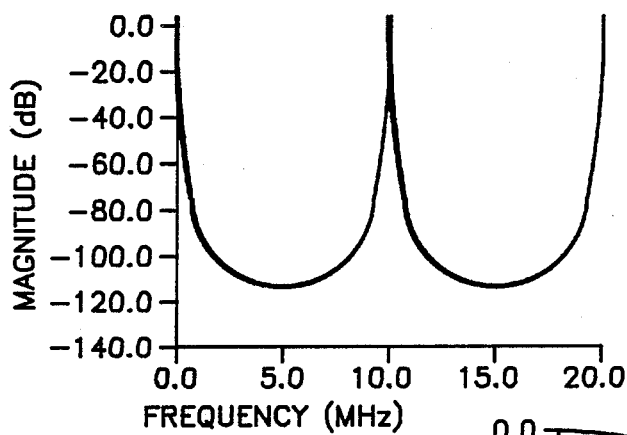
Figure 27C:
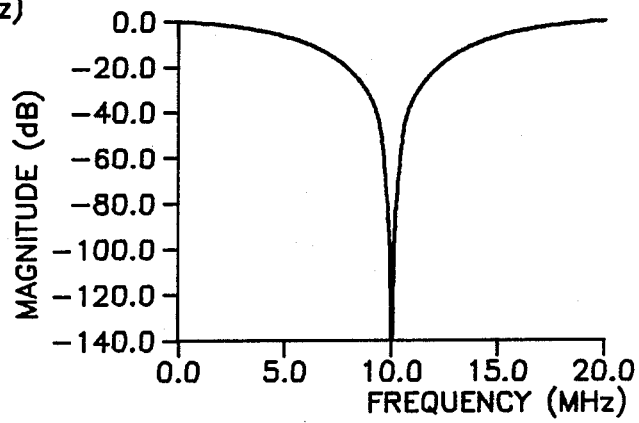
Figure 27D:
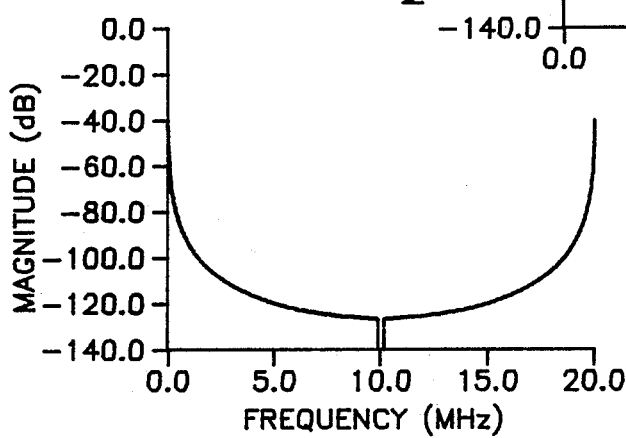

FIG. 25b is a schematic diagram of an example of a type of digital dither generator compatible with the digital oscillator of the present invention. A digital dither signal can be generated by any of several well-known pseudorandom sequence generation techniques. One type of dither, or random number generator is shown and described in a paper by G. I. Donov, A High-Speed Random-Number Generator, RADIO ELECTRONICS AND COMMUNICATION SYSTEMS, Vol. 25, No. 4, pp. 88-90, 1982.

Referring now to FIG. 25b, a feedback shift register pseudorandom sequence generator which may be advantageously employed in the practice of the present invention is shown in schematic form. The sequence generator of FIG. 25b is used to provide an L-bit digital dither signal to the binary adder 25410 of FIG. 25a. The dither generator 25408 includes an R-bit shift register 25460 which may be formed of a plurality of flip-flops 25464 through 25499 which are connected in a cascade fashion. In the preferred practice of the present invention, a parallel 3-bit dither signal is tapped from the shift register at the outputs of flip-flops 25478, 25491 and 25499 respectively. The inputs to an Exclusive-Or gate 25462 are coupled to the outputs of flip-flops 25464, 25493, 25498 and 25499. The output of Exclusive-Or gate 25462 is coupled to the input of flip-flop 25464. The shift register produces a 3-bit pseudo-random dither signal which is added to the output of the phase accumulator 25406 of FIG. 25a. The flip-flops 25464-25499 and the Exclusive-Or gate 25462 as well as the other devices used in the practice of the present invention may be any of several well known logic devices; however, high speed TTL devices are particularly well adapted for the practice of the present invention. Implementations employing other logic families will also be obvious to one of ordinary skill in the art. The dither generator of FIG. 25b is set forth as an example of one type of digital dither generator which performs satisfactorily with the digital oscillator of the present invention. It would be obvious to one skilled in the art that many other digital dither generators could also be advantageously employed, provided the digital dither generator provides a pseudorandom sequency of L-bit numbers whose period is at least as long as $2^N$ samples, and whose probability density is uniform, in order for the phase noise produced by truncation to be "whitened".

As shown in FIG. 24, the intermediate-frequency (IF) filter section accepts data from the A/D converter at the rate of 20M samples/sec, mixes the received signal to dc (the zero IF frequency), lowpass filters the received signal to extract the desired signal, and sends the signal to the backend 22120 of FIG. 22 at a (drastically) reduced sampling rate. In the preferred implementation, the lowpass filtering and sample-rate reduction are not separate operations; instead, the sampling rate is gradually reduced between filter sections, as undesired signals (which could cause aliasing if not removed) are filtered out. The only filtering section which operates at the input sampling rate ($f_s$=20 MHz in the exemplary embodiment described here) is the first section. The only other circuitry which operates at that rate are the quadrature local oscillator (LO) and mixers. Thus it is this high-speed circuitry which sets an upper limit on the overall operational speed of the digital zero-IF selectivity section. High-speed operation is very important to the digital receiver of the present invention, to minimize intermodulation problems occurring with the front-end sample-and-hold and A/D converter and to allow a sufficiently wideband signal to be accepted.

Figure 26B:
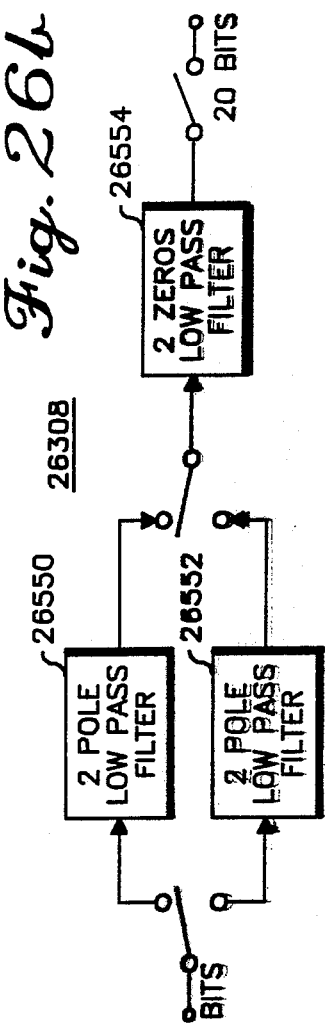
Figure 26A:
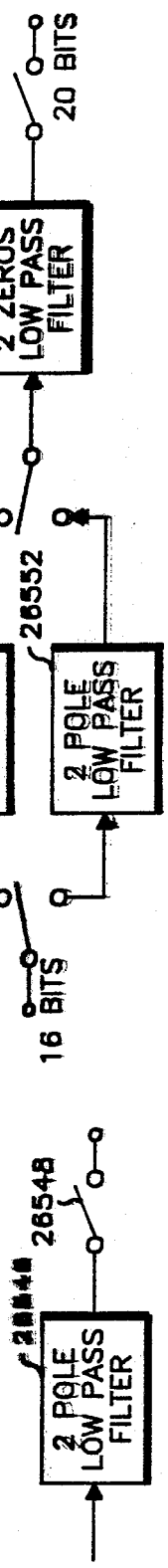
FIG. 26a is a block diagram of a desired "fast", narrowband lowpass filter.

FIG. 26a is a block diagram of the "fast", narrow-band lowpass filters 24308 and 24310 of FIG. 24. The quadrature local oscillator 24302 and mixers 24304 and 24306 are non-feedback circuits (primarily ROMs and multipliers) which are amenable to pipelining or other forms of parallelism to increase their speed. However, because the lowpass filter sections 24308, 24310 are implemented as recursive (infinite impulse response) filters, they cannot be pipelined to increase their speed. Their speed is determined by the maximum delay around a closed (feedback) path. For the lowpass filter implementation of the present invention, this path includes two digital adders and one latch. It is this path which limits the A/D sampling rate and, therefore, potentially limits the overall performance of a digital receiver. Because of problems in attaining this very high speed the filter was designed by interleaving two 10 MHz TTL filters. The aliasing problems that would ordinarily be associated with using a low sampling rate are alleviated by adding zeroes near the unwanted filter poles.

The "Fast" lowpass section 26546 of FIG. 26a is decomposed into two half-speed sections plus a combining filter, as is shown in FIG. 26b. This modification permits the digital IF section to operate at twice the speed that would otherwise be possible, and potentially allows improved performance of the digital receiver of the present invention. The "decomposed" filter of the present invention is shown in conjunction with FIGS. 24 and 26. Other filter decomposition techniques have been discussed, for example, in a paper, M. Bellanger, G. Bonnerott and M. Coudreuse, Digital Filtering by Polyphase Network: Application to Sample-Rate Alteration and Filter Banks. IEEE TRANSACTIONS ON ACOUSTICS, SPEECH, AND SIGNAL PROCESSING, Vol. ASSP-24, No. 2, April 1976.

The combining filter 26554 is a nonrecursive filter. The combining filter, which is shown in greater detail in FIG. 29, uses two zeros at $f_s/2 (z=-1)$ to cancel the poles introduced by the decomposition. Such a filter can be implemented with only adders and latches (i.e., without multipliers), and so adds minimal hardware.

Note that although decomposition requires additional hardware, it nominally increases power consumption (with a CMOS implementation), since two half-speed circuits require approximately the same power as a single full-speed circuit (ignoring the additional power of the combining filter).

FIG. 27 illustrates the decomposition process in detail with several magnitude plots. In particular, FIG. 27a shows the response of the original version of the first two-pole section, for an input sampling rate $f_s$ of 20 MHz. FIG. 27b shows the "decomposed" characteristic which results from two 10 MHz sections, while FIG. 27c shows the response of the subsequent "combining" filter. Finally, FIG. 27d shows the composite (i.e., cascade) of FIG. 27b and FIG. 27c, which is virtually indistinguishable from FIG. 27a, except for the "notch" at 10 MHz (which results from the two zeros at $f_s/2$, which cancel the two nearby poles).

The decomposed filter can be represented as follows:

$$y(n) = \sum_{i=1}^{2N_D} y(n-i)h_d(i) + x(n)$$

where x and y are complex filter inputs and outputs, respectively (i.e., they have both a real part and an imaginary part). Also, $h_d$ are the decomposed filter polynomial coefficients, and $N_D=2$ is the order of the original full-speed filter. Since the decomposed 20 MHz filter is expressed in terms of $z^{-2}$ (as will be shown in the next section), it can be implemented in terms of a 10 MHZ circuit wherein:

$$h_d(i) = h_h(i/2), i \text{ even}$$
$$0, i \text{ odd}$$

where $h_h$ are the original high speed coefficients.

Then the decimating filter can be reexpressed as:

$$y(n) = \sum_{i=2}^{2N_D} y(n-i) h_h(i/2) + x(n)$$

The change of variables $i \rightarrow 2j$ simplifies this summation to:

$$y(n) = \sum_{j=1}^{N_D} y(n-2j)h_h(j) + x(n)$$

From this formulation, decimating-filter inputs x and outputs y can be decomposed into two streams, as shown in FIG. 26a:

$$x^{(\Psi)}(m) = x(2m+\Psi)$$

$$y^{(\Psi)}(m) = y(2m+\Psi)$$

where:

$$y = \text{mod}(n,2) \epsilon \{0,1\}$$

Substituting $n \rightarrow 2m+1$ in the above decimating-filter summation yields:

$$y(n) = \sum_{j=1}^{N_D} y(2m - 2j + 1)h_h(j) + x(2m + \Psi)$$

Finally, the two decomposed decimating filters ($\Psi = 0,1$) may be represented as:

$$y^{(\Psi)}(m) = \sum_{j=1}^{N_D} y^{(\Psi)}(m - j)h_h(j) + x^{(\Psi)}(m)$$

Assume that the desired filter has a pole $z=z_p$. Then the corresponding filter characteristic may be represented as:

$$H = (1 - z_p z^{-1})^{-1}$$

If this pole is "repeated" 180 degrees away, the following characteristic is obtained:

$$H' = [(1 - z_p z^{-1})(1 - z_p e^{j\pi} z^{-1})]^{-1}$$
$$= [(1 - z_p z^{-1})(1 + z_p z^{-1})]^{-1}$$
$$= (1 - z_p^2 z^{-2})^{-1}$$

Since the resulting characteristic is in terms of $z^{-2}$, it can be decomposed (as was shown in the previous section) into two half-speed filters, each with pole $z^2 = z_p^2$.

The lowpass filter sections in the digital zero-IF selectivity implementation of the present invention is realized using the following form, which is written in terms of coefficients a and b, where b = ca. For a pole-pair $z_p$, $z_p^*$, where:

$$z_p = (1-d)e^{j\phi}(d, 0 < 1)$$

the coefficients are:

$$a \approx 2d$$

and $$b = d^2 + \phi^2$$

For the half-speed filters, the pole-pairs are $z_p^2$ and $(z_p^2)^*$. Since $$z_p^2 = [(1 - d)e^{j\theta}]^2$$
$$\approx (1 - 2d)e^{j2\theta}$$

Then the coefficients for the half-speed filter may be obtained in terms of those for the full-speed case by analogy to the full-speed case:

$$a' = 2(2d)$$
$$= 2a$$

and $$b' = (2d)^2 + (2\theta)^2$$
$$= 4(d^2 + \theta^2)$$
$$= 4b$$

This design is illustrated in FIG. 26b. A second-order IIR filter is described in a paper, Agarwal, A. C., Burrus C. S., New Recursive Digital Filter Structures Having Very Low Sensitivity and Roundoff Noise, IEEE TRANSACTIONS ON CIRCUITS AND SYSTEMS, Vol. CAS-27, No. 12, Dec. 1975. The filter structure II proposed by Agarwal and Burrus has been modified for minimum delay around all feedback loops for the purposes of the present invention. The filter structure of the present invention is illustrated in FIG. 28.

All digital filter structures are made up of basically the same three components: adders, multipliers, and delay circuits (generally latches or RAM). The factors affecting the performance of a digital filter all have to do with the fact that the various parameters of the filters are quantized, that is, they have finite precision rather than the infinite precision available in analog filters. The finite precision of a digital filter basically gives rise to three major performance effects that must be controlled in any implementation of a digital filter.

Coefficient roundoff is one of these effects. The constant valued coefficients found in a digital filter determine its frequency response. The result of rounding these coefficients so that they may be represented digitally in a finite number of bits causes a permanent, predictable change in the filter response. This is analogous to changing the RLC values in an analog filter; however, digital filters do not suffer the detriment of temperature variations as in analog filters. Generally, the higher Q of the filter (i.e. narrow bandwidth compared to the sampling rate) the more the frequency response is distorted by coefficient rounding, unless special structures are employed. Judicious selection of the filter structure is of key importance in light of the fact that IF filters are generally extremely narrow band, or high-Q filters.

Round-off noise is another of the performance characteristics that must be controlled in a digital filter. Data entering a digital filter has been rounded to a finite number of bits, and it is almost always necessary to perform additional roundings at certain points within the filter. Such rounding operations create an error or noise signal in the digital filter. For example, if the digital word length used in a filter is 16 bits and the coefficients are represented in 10 bits each multiplication operation would create a 25 bit product, which must be rounded to 16 bits before the result may be put back into memory.

The last major effect that is controlled in a digital filter is the overflow level. The fact that data samples are represented in a finite number of bits means that there is a maximum allowable absolute value associated with every node in the filter which, if exceeded, results in an overflow phenomenon (generally wrap-around if 2's complement binary arithmetic is used). This largest allowed data value, coupled with the level of roundoff noise described previously, determines the dynamic range of the filter.

Several conventional structures are available to implement digital filters. A straight forward design approach is to cascade sections of first and second order direct-form filters until the desired filter order is achieved. The advantages of this method are its simplicity, regularity, and the ease of actual filter design. However, the conventional approach also suffers from many detriments mostly stemming from the fact that high precision (for example 16 bit) filter coefficient representation is required to implement a narrowband filter. This necessitates highly-complex multiplications (for example 16 . 20 bits) be performed in the feedback paths of the filter sections. The multiplications place severe speed and time limitations on the operation of the filters. Further, pipelining, a common technique used to speed logic circuits, cannot be employed in feedback loops. Lastly, high precision, high speed multipliers consume tremendous amounts of power.

Referring now to FIG. 28, a digital lowpass filter section 28700 is depicted in block diagram form. The filter employed in the DZISS is a recursive filter (i.e., the output signal is fed back, scaled, and summed at strategic points in the filter structure) having a narrow bandwidth and optimized for high-speed and low-sensitivity to the previously described detrimental effects of parameter quantization on digital filters. The second-order narrowband lowpass infinite-impulse response (IIR) filter of FIG. 28 is used in the decomposed "fast" lowpass filter of FIG. 26b which operates at the speed of the A/D converter. Decomposition is useful in attaining this high operational speed, but requires additional hardware: two second-order IIR sections instead of one, and a second-second-order FIR section which would not otherwise be needed.

The digital low pass filter 28700 provides the function depicted by the function blocks 26550 and 26552 of FIG. 26. The digital lowpass filter 28700 consists of four digital adders (2's complement) 28704, 28708, 8712, and 28716, two digital delays or latches 28710 and 8718, and two binary shifters 28706 and 28714. As mentioned previously in the discussion of the digital quadrature local oscillator 25400, the individual connections of lowpass filters 24308, 24310, and 24312, and 24313, as described in FIG. 24, are multi-bit digital words and not single electrical lines.

The input signal to the digital filter 28700 is applied to a non-inverting input 28702 of the digital adder 28704. A second inverting input to the digital adder 28704 is taken from digital delay 28718 which is fed back from the output 28720 of the filter circuit. The difference (2's complement) result of digital adder 28704 is next applied to the input of gain element 28706 which presents the shifted first sum signal as one input of digital adder 28708.

Bit shifter 28706 shifts all bits of the data word outputted from digital adder 28704 to the right (i.e., toward the least significant bit) by $N_c$ bits, effecting multiplication by a coefficient c equal to $2^{-Nc}$. This bit shift may be implemented by an appropriate routing of the data lines from digital adder 28704 to adder 28708. Thus, high operating speed of digital filter section 28700 is facilitated, since there is no time delay associated with bit shifter 28706, as there would be in a coefficient multiplication implemented by a conventional multiplier circuit.

Digital adder 28708 adds to the shifted first sum signal the last output of digital adder 28708 as held in delay 28710. Further, the last or previous output of digital adder 28708 is applied to digital adder 28712. A second inverted input to digital adder 28712 is taken from digital delay 28718 which, as previously mentioned, is taken from the output 28720 of the digital filter. The result of digital adder 28712 is applied to bit shifter 28714 which is coupled to digital adder 28716. Bit shifter 28714 shifts all bits of the data word outputted from digital adder 28712 to the right by $N_a$ bits, effecting multiplication by a coefficient a equal to $2^{-Na}$. Bit shifter 28714 also facilitates high operating speed since no time delay is incurred. The parameters $N_c$ and $N_a$ associated with bit shifters 28706 and 28714 respectively, control the frequency response of digital filter section 28700, and may be chosen to yield the response appropriate to the intended application, as shown by the previous analysis. Digital adder 28716 adds the second shifted sum signal to the previous output of 28716 as held in delay 28718. The output of delay 28718 is also the output of the digital lowpass filter section 28700 and represents a band-limited representation of the input signal 28702 that was previously applied to the input of summing circuit 28704.

FIG. 29 is a block diagram of the second-order combining finite-impulse-response (FIR) filter with a notch at half the sampling rate used in the decomposed fast lowpass filters of FIG. 26b. The input 29802 to filter 29800 is coupled to the output 2820 of filter 28700, as pictured in FIG. 26b. According to FIG. 29, the digital filter 29800 comprises digital shifters 29804, 29806, and 29808 coupled to digital delays 29810 and 29814 and digital summers 29812 and 29816, respectively. The digital shifters 29804, 29806, and 29808 use gains of ¼, ½, and ¼, respectively, to implement a filter with two zeros on the unit circle, at half the sampling frequency. These digital shifters perform right shifting of the input 29802 by 2, 1, and 2 bits, respectively. Since such "bit shifting" may be implemented by routing the wiring connections in the appropriate manner, these gain operations consume no actual time and require no actual hardware. A first partial sum is formed in adder 29812 using the scaled output of gain element 29806 as the first input and the previous, or last, scaled output of gain element 29804 as the second input, obtained from delay element 29810. Similarly, the output 29818 is obtained as the second partial sum formed in adder 29816 using the scaled output of gain element 29808 as the first input and the previous, or last, first partial sum of adder 29812 as the second input, obtained from delay element 29814. The transfer function of this filter may be written:

$$H(z) = Y(z)/X(z) = (\tfrac{1}{4})[1 + z^{-1}(2 + z^{-1})]$$

To compute an output, this FIR filter needs only to perform one addition and one latch operation, compared with two additions and one latch operation in the IIR sections, so that the FIR combining filter easily operates at the full input sampling rate (20 MHz). An alternative design would allow the adder to run at a lower sampling rate by the use of additional control circuitry. This would permit the FIR filter to operate more slowly by incorporating decimation into the filter operation, i.e., computing only the outputs needed by subsequent filter sections operating at a reduced sampling rate. In a CMOS implementation, power consumption is typically reduced when operational speed is reduced. Therefore, the power consumption of the FIR combining filter could be reduced at the expense of some control circuitry.

Between the "fast" filters 24308 and 24310 and "slow" lowpass filters 24312 and 24313 of FIG. 24, it is desirable to perform sampling rate reduction, or decimation. As is well known in the art, the degree of sampling rate reduction possible depends on the amount of attenuation provided by the "fast" lowpass filters. For example, if a 20 MHz input sampling rate is used, and the "fast" filters are implemented as decomposed filters with coefficients as listed below in table 3, then an output sampling rate of 2 MHz can be used with over 100 dB of aliasing protection provided by the "fast" filters.

TABLE 3

| filter section | a | c | rate (MHz) |
| --- | --- | --- | --- |
| fast (decomposed) | $2^{-8}$ | $2^{-9}$ | 20 |
| slow$_1$ | $2^{-6}$ | $2^{-2}$ | 2 |
| slow$_2$ | $2^{-6}$ | $2^{-3}$ | 2 |
| slow$_3$ | $2^{-6}$ | $2^{-4}$ | 2 |

The "slow" lowpass filters 24312 and 24313 can be implemented by several stages of two pole filter sections. For example, if three stages, each having the structure of FIGS. 30a, 30b, and 30c and the coefficients listed in Table 3 are used, wherein slow 1, slow 2 and slow 3 correspond to FIGS. 30a, 30b, and 30c, respectively, then the sampling rate can be reduced from 2 MHz to 80 KHz.

An alternative hardware-saving design involves interleaving the in-phase and quadrature sample streams and using three stages of time-division-multiplexed filtering. This requires that the filters run at twice the rate they would operate with a non-multiplexed design but since the sampling rate is reduced by a factor of 10 from the fast filter, this multiplexed filter still can operate at one-fifth the rate of the first filtering stage.

Figure 30B:
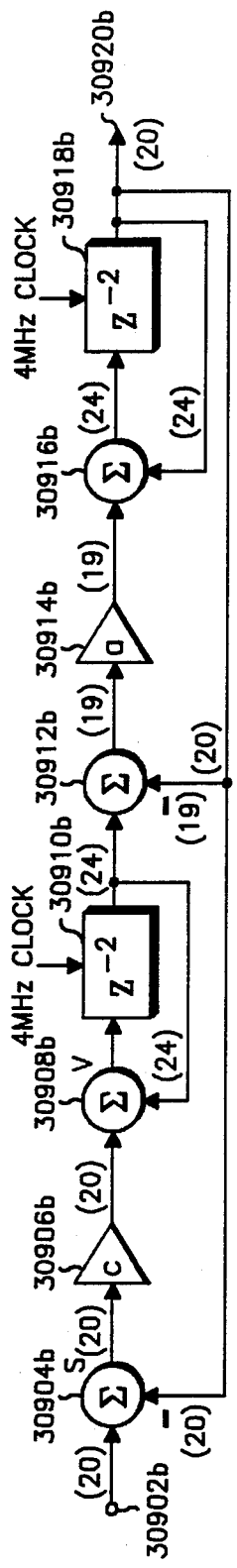
Figure 30C:
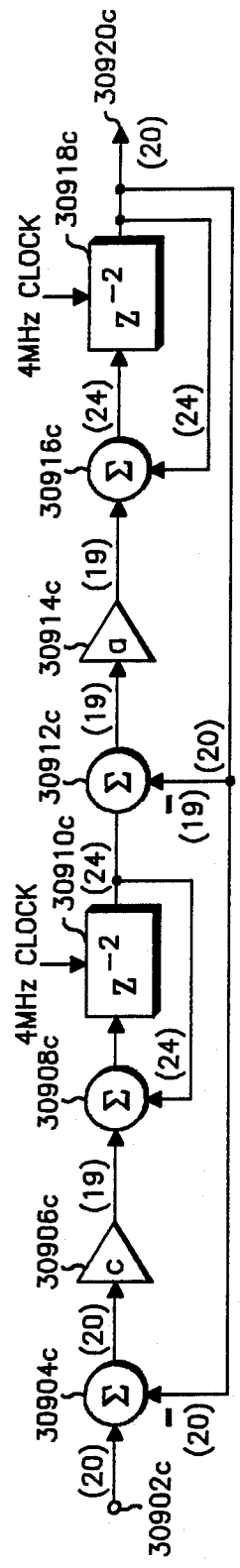

FIG. 30a is a block diagram of the first time-division-multiplexed second-order lowpass IIR filtering stage used in the time-division-multiplexed implementation of the "slow" lowpass filters. FIG. 30a through 30c represent a time-division multiplexed version of a filter structure similar to that depicted in FIG. 28. The main difference between the structure in FIG. 28 and the multiplexed version in FIG. 30 is that the delay elements have been doubled in length. Thus instead of using $z^{-1}$ elements, implemented in hardware as single latches, $z^{-2}$ elements are used which are implemented as two latches configured in series. The effect of this structure is that the filter alternates each sample between processing in-phase and quadrature samples. In the following discussion, the operation of FIG. 30 is discussed in detail. After processing by digital filter 30900a, the signal is coupled to the second filtering stage 30900b and subsequently to the third filtering stage, depicted by FIG. 30900c. The overall filter structure of digital filters 30900a, 30900b, and 30900c is identical, so only digital filter 30900a is discussed in detail. However, the data paths and filter responses of digital filters 30900a, 30900b and 30900c vary slightly between the various stages, as shown by FIGS. 30a, 30b and 30c, respectively, as well as Table 3.

The digital lowpass filter 30900a consists of four digital adders (2's complement) 30904a, 30908a, 30912a, and 30916a, four digital latches two each in 30910a, and 30918a, and two binary shifters 30906a and 30914a. The input signal to the digital filter 30900a is applied to a non-inverting input 30902a of the digital adder 30904a. A second inverting input to the digital adder 30904a is taken from digital latch pair 30918a which is fed back from the output 30920a of the filter circuit. The difference (2's complement) result of digital adder 30904a is next applied to the input of bit shifter 30906a which presents the shifted first sum signal as one input of digital adder 30908a.

Bit shifter 30906a shifts all bits of the data word outputted from digital adder 30904a to the right (i.e., toward the least significant bit) by $N_c$ bits, effecting multiplication by a coefficient equal to $2^{-N_c}$. This bit shift may be implemented by an appropriate routing of the data lines from digital adder 30904a to adder 30908a. Thus, high operating speed of digital filter section 30900a is facilitated, since there is no time delay associated with bit shifter 30906a, as there would be in a coefficient multiplication implemented by a conventional multiplier circuit.

Digital adder 30908a adds to the shifted first sum signal the output of digital adder 30908a from two sample times past as held in latch pair 30910a. Further, the output of digital adder 30908a as held in latch 30910a is applied to digital adder 30912a. A second inverting input to digital adder 30912a is taken from latch pair 30918a which, as previously mentioned, is taken from the output 30920a of the digital filter. The result of digital adder 30912a is applied to bit shifter 30914a which is coupled to digital adder 30912a. Bit shifter 30914a shifts all bits of the data word outputted from digital adder 30912a to the right by $N_a$ bits, effecting multiplication by a coefficient equal to $2^{-N_a}$. Bit shifter 30914a also facilitates high operating speed since no time delay is incurred. The parameters $N_c$ and $N_a$ associated with bit shifters 30906a and 30914a respectively, control the frequency response of digital filter section 30900a, and may be chosen to yield the response appropriate to the intended application. Digital adder 30916a adds the second shifted sum signal to the previous output of 30916a as held in delay 30918a. The output of delay 30918a is also the output of the digital lowpass filter section 30900a and represents a band-limited representation of the input signal 30902a that was previously applied to the input of summing circuit 30904a.

It will be obvious to one skilled in the art that more gradual sample-rate reduction could be employed, say, between each of the four (total) lowpass filter sections. Gradual sample-rate reduction offers a significant advantage in that it gives much flexibility in establishing the overall ratio of the input to the output sampling rates. This permits the A/D sampling rate to be established almost arbitrarily to match a desired preselector passband, subject to a constraint on the output sampling rate. At the output of the third (and last) "slow" lowpass filter section, sufficient attenuation has been applied to channels at higher frequencies, so that the aliasing caused by decimation from 2 MHz to 80 kHz does not interfere with the desired band, centered at approximately zero frequency.

Figure 31:
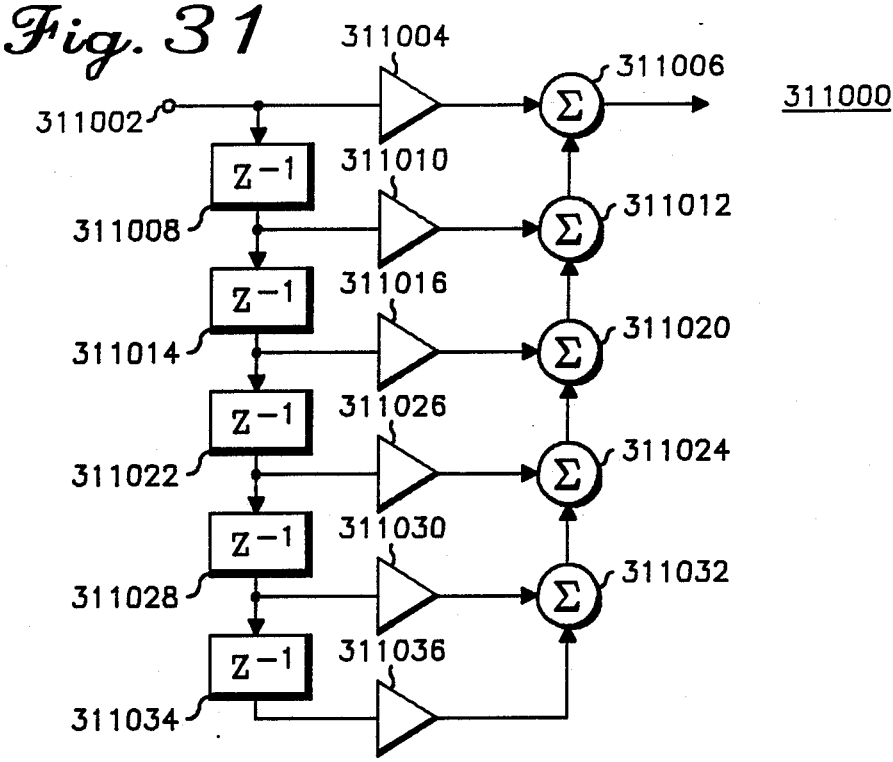
FIG. 31 is a block diagram of the fifth-order lowpass FIR filter used to further reduce the sampling rate from 80 to 40 kHz.
Figure 32:
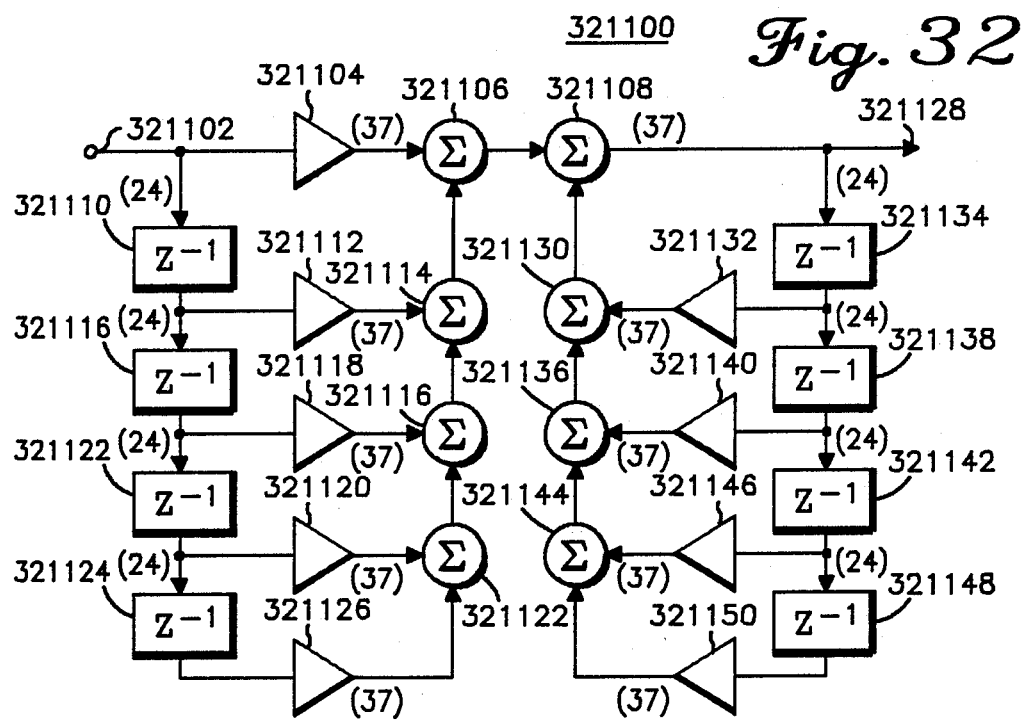
FIG. 32 is a block diagram of the fourth-order lowpass IIR filter used for final selectivity and passband equalization, prior to demodulation.

After filter processing and decimation by the high speed selectivity sections 22114 of FIG. 22, the recovered digital signal comprises a received digital signal having quadrature components. The quadrature characteristics of the received digital signal insures that phase information present in the original RF signal is preserved through the processing chain. The received quadrature digital signals are coupled to the digital receiver backend 22120 of FIG. 22, which is advantageously implemented by a programmable, general purpose digital signal processing I.C., as mentioned above. The radio backend 22120 performs the additional processing required to generate the digital baseband signal used to provide a recovered data or audio signal. In addition, the radio backend 22120 can provide final predemodulation filtering and post-demodulation processing of the recovered signal. FIGS. 31 and 32 detail digital filter structures suitable for performing final predemodulation selectivity in the context of a digital signal processing I.C. FIG. 33 details one technique which is suitable for demodulating an FM signal in accordance with the teachings of the present invention.

FIG. 31 shows a fifth-order nonrecursive filter 311000 which provides additional attenuation so that the sampling rate may be further reduced from 80 to 40 kHz while causing negligible aliasing distortion of the desired band. Because this filter is operating at the relatively low output sampling rate of 40 kHz (complex samples), it is possible to implement it in a general-purpose digital signal processor. Such processors are typically well suited to pipelined multiply operations 311004, 311010, 311016, 311026, 311030, 311036, and accumulate operations 311006, 311012, 311020, 311024, and 311032, so that the "direct-form" filter structure was chosen.

FIG. 32 shows a direct-form filter structure 321100 with four poles and four zeros, which is employed to smooth out the passband response of the composite receiver filter. It may be implemented with a series of multiply operations 321104, 321112, 321118, 321120, 321126, 321132, 321140, 321146, and 321150, an accumulate operations 321106, 321114, 321116, 321122, 321108, 321130, 321136, and 321144 in a general-purpose digital signal processor. Because single-precision (typically 16-bit wordlength) operations do not afford sufficient dynamic range for mobile-radio applications, it is necessary to use double-precision calculations in the DSP implementation. It will be apparent to one skilled in the art that different bandwidths for the final selectivity section could be programmably obtained by choosing different filter coefficients in the back-end DSP. Also, different selectivity bandwidths may be obtained through use of different downsampling rates, or through different wired-gain elements (via two-to-one selectors, for example) in the multiplierless lowpass filter sections.

FIG. 33 is a diagram of a digital FM demodulator compatible with the digital radio architecture of the present invention. In reality, digital demodulation is one task, among others, performed by a digital signal processor I.C. According to FIG. 33, limiter section 131202 comprises the scaling stage 331204 together with the in-phase channel inverse calculation generator 331210 and the product multiplier 331212 where the reciprocal of the scaled and rotated in-phase (I') component is multiplied with the scaled and rotated out-of-phase (Q') component producing a term equal to the value of the tangent of the phase angle of the scaled and rotated signal vector sample. The action of digital multiplier 331212 performs an ideal limiting of any amplitude variations of the input signal vector that may be present. The term passed from the digital multiplier 331212 represents the tangent of the rotated and scaled signal vector sample. This term is processed by the arctangent generator stage 331214 whose output equals the phase angle of the rotated and scaled signal vector. This quantity when added by digital summer 331214 to the coarse phase value output from the coarse phase accumulator 331206 represents the total phase angle of the input signal vector sample. The difference signal generated at the output of digital summer 331218 between the phase angle of the current signal vector sample and the negative of the delayed output generated by digital delay 331220 represents 1 sample of the output demodulated message.

FIGS. 34a through 34c are diagrams detailing the principles of phasors in the context of the present invention. Referring now to FIG. 34a the scaler's 331204 function is to scale the amplitude of the input signal vector of varying magnitude to the shaded region shown. The coarse phase accumulator 331206 determines the coarse phase angle of the signal vector, $\phi_c$, and the output of the arctangent generator stage 331212 equals the fine phase of the signal vector, $\phi_f$, as depicted in FIG. 34b. The signal vector $\phi_f$ is constrained by the vector rotation to lie in the range of $-\pi/4 \leq \phi_f \leq +\pi/4$ (shaded region of FIG. 34b.) The sum of these two quantities generated at the output of digital summer 331214 represents the total phase angle of the input signal vector sample, $\phi(n)$. The difference value $\Delta(\phi(n))$ generated by digital summer 331218 between the current phase sample, $\phi(n)$, and the phase sample, $\phi(n-1)$ generated by digital delay 331220, as shown in FIG. 34c, represents one sample of the demodulated output message. The stream of samples representing the demodulated output message may be low passed filtered to remove noise outside the message bandwidth, as is typically performed subsequent to FM detection.

It would be obvious to one of ordinary skill in the art that the digital demodulator described in the figures above could be implemented with discrete hardware digital multipliers, adders, registers, etc. The digital demodulator of the present invention is particularly suitable for implementation with a class of devices known as digital signal processors. The present invention would perform satisfactorily with a variety of well known digital signal processors such as a NEC D7720, available from NEC Electronics U.S.A. Inc., One Natick Executive Park, Natick, Mass. 01760, or a TMS 32010 available from Texas Instruments Inc. P. 0. Box 225012, Dallas, Texas 752265. Digital signal processors generally include hardware high speed digital multipliers as well as the ability to process a digital data stream in accordance with a predetermined algorithm.

Figure 35A:
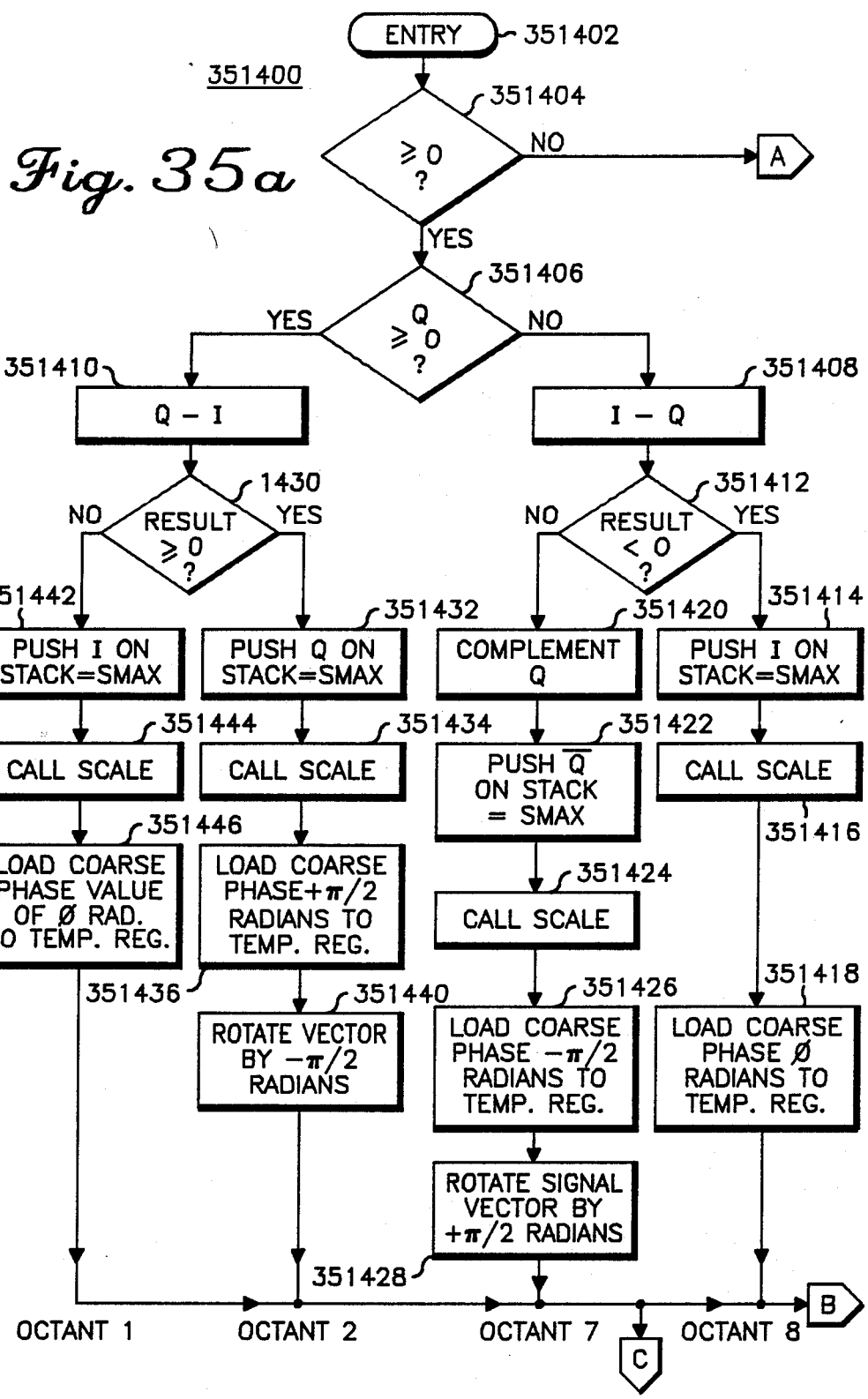
FIGS. 35a and 35b are flow diagrams detailing the operation of the background routine of the FM demodulator of the present invention.
Figure 35B:
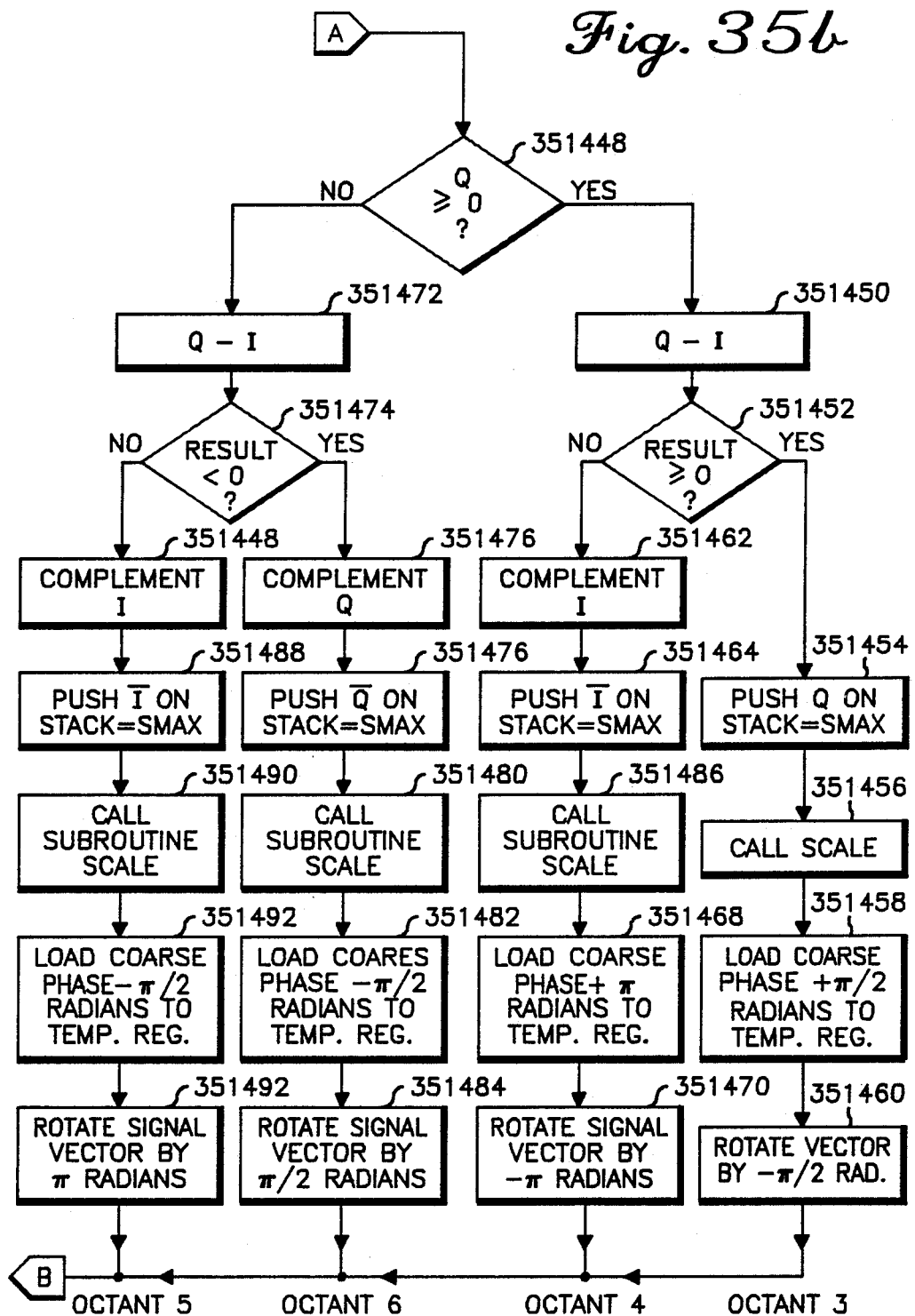

FIGS. 35a and 35b are flow diagrams detailing the background processing of the present invention as implemented with a digital signal processor. In all descriptions of the present invention, the in-phase and out-of-phase signal vector components will hereinafter be referred to as the components I and Q respectively. The algorithm of the present invention begins at 351402, which causes the digital signal processor to execute decision 351404 to determine the sign of the I component. Based on the outcome of decision 351404, the sign of the Q component is determined by decisions 351406 and 351448. Next, the difference of the I and Q components is determined by items 351410, 351408, 351472, and 351450 which generate values comprising the values of Q−I, I−Q, Q−I, and Q+I, respectively. The sign of the respective results is determined by decisions 351430, 351412, 351474, and 351452, respectively. Based on the results of these decisions, the component (I or Q) which has the greater absolute value is known, and the octant (i.e. multiple of $\pi/4$) in which the signal vector lies is also known. This value, if less than zero, is complemented by items 351420, 351486, 351476, and 351462, respectively. The value that represents the greatest absolute value of either the I or Q channel is pushed onto a program stack by items 351442, 351432, 351422, 351414, 351488, 351478, 351466, or 351454, respectively, and is hereafter referred to as the quantity SMAX. The quantity SMAX is used by the call to the scale subroutine by items 351444, 351434, 351424, 351416, 351490, 351480, 351466, 351456, respectively, to determine the correct amount of scaling to be applied to the input signal vector sample. The scale subroutine returns correctly scaled signal vector components I and Q. Next a coarse phase value, based on the octant location of the signal vector is stored to a temporary storage location by items 351446, 351436, 351426, 351418, 351492, 351482, 351468, or 351460, respectively.

This value will always be a multiple of $\pi/2$ radians over the range of $-\pi \leq \phi(c) \leq \pi$. The signal vector is then geometrically rotated by the negative of the coarse phase value that was saved by items 351440, 351428, 351492, 351484, 351470, or 351460, respectively. The scaled and rotated signal components that result are hereafter referred to as the I' and Q' signal vector components. The effect of this vector rotation is to rotate the signal vector such that the rotated signal vector components I' and Q' yield a composite vector with a phase angle in the range of $-\pi/4 \leq \phi_f \leq \pi/4$.

Figure 36A:
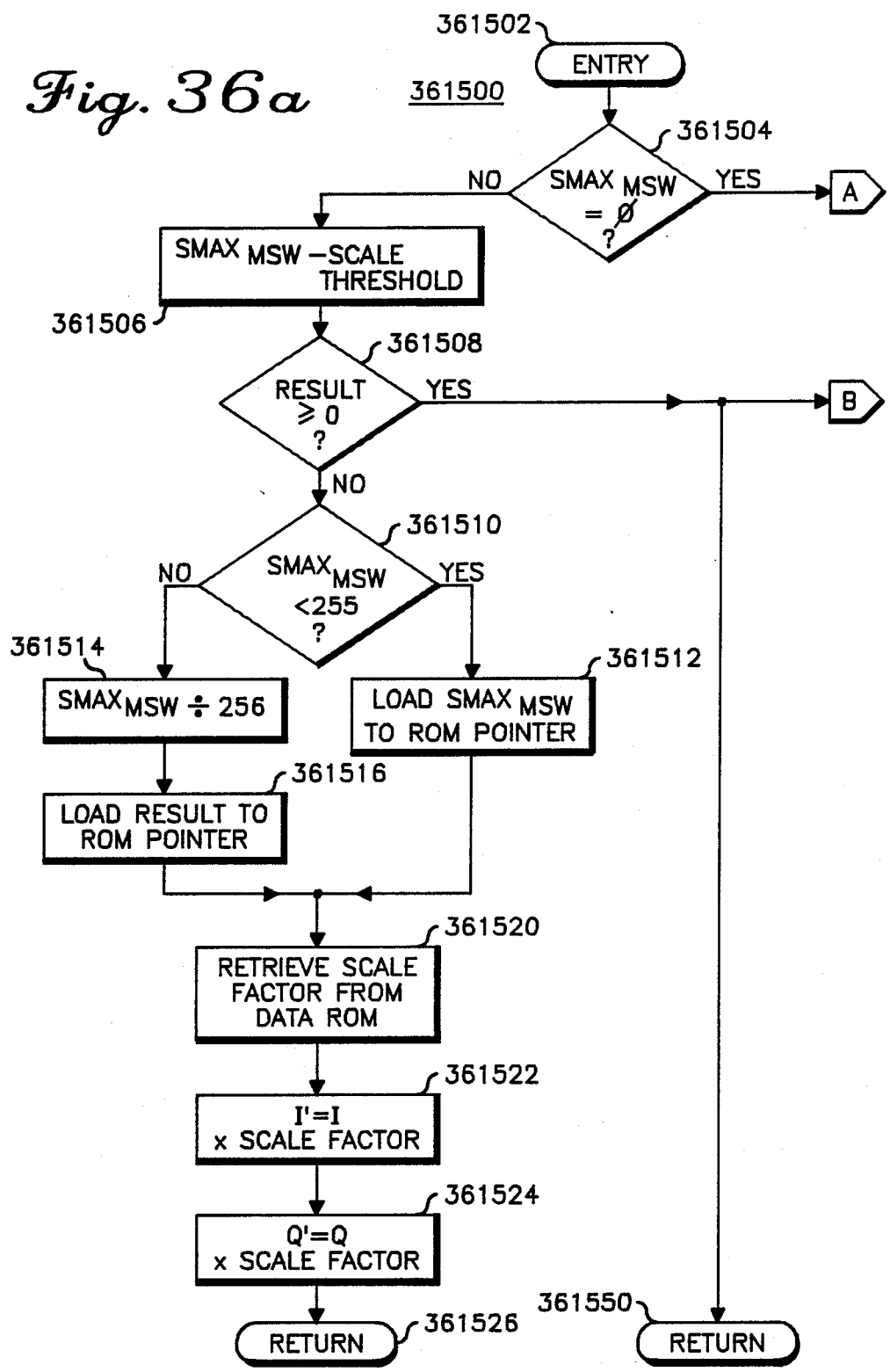
Figure 36B:
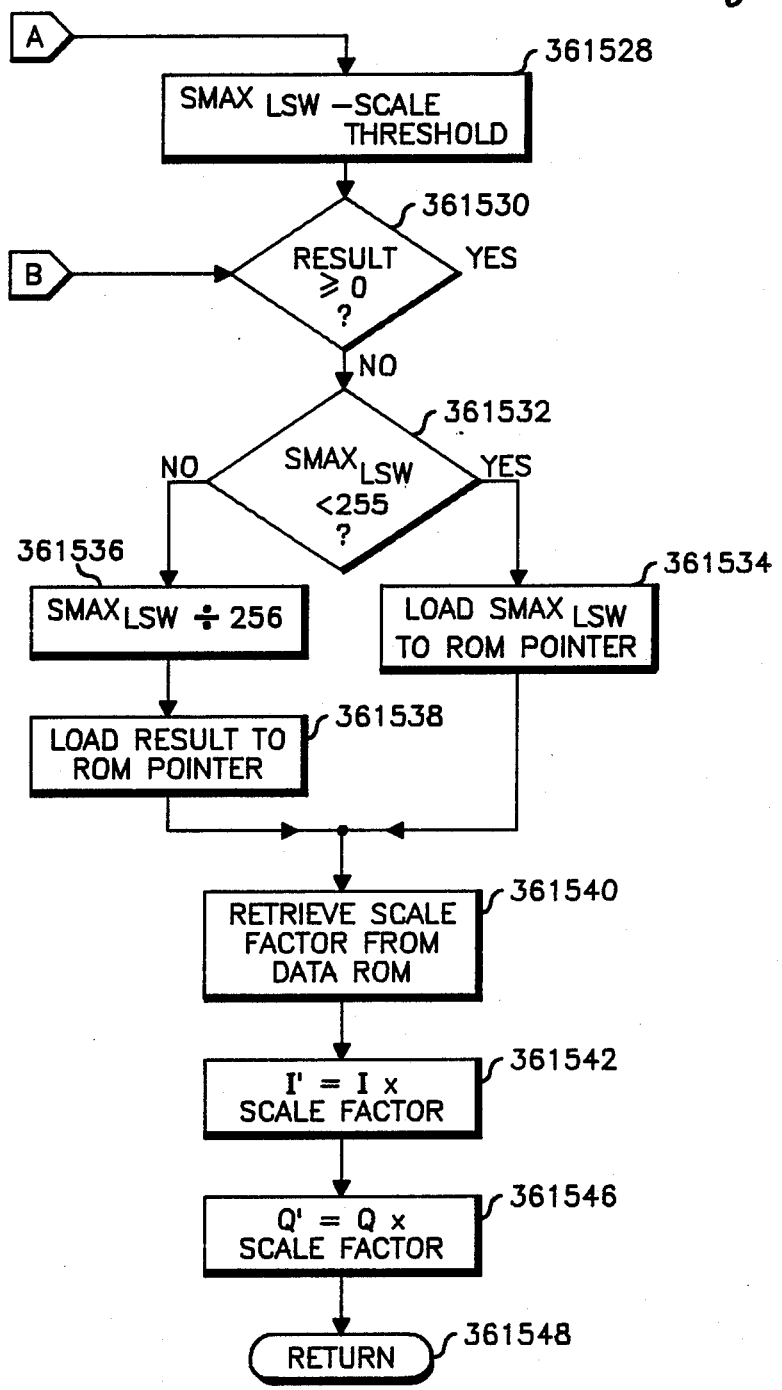

FIGS. 36a and 36b are flow diagrams of the operation of the scale subroutine described in conjunction with FIG. 35a above. The scaling subroutine 361500 examines the value of SMAX to determine the correct amount of scaling to be applied to the signal vector components I and Q. The operation of this subroutine is dependent on the resolution or number of bits used to represent the signal vector components. The operation of the scale subroutine will be explained in the context of using 32 bit long words to represent the signal vector components. Upon entry to the scale subroutine at 361502, the most significant word (MSW) of the quantity SMAX is compared to zero by decision 361504. If the MSW of SMAX is greater than zero, the least significant word (LSW) of SMAX will be discarded, and the MSW will be compared to a scaling threshold value by item 361506. If the MSW of SMAX is found to equal zero, then the MSW will be discarded, and the LSW will be compared to a scaling threshold value by item 361528. The results of the comparisons generated by items 361506, and 361528, respectively, are tested against zero by decisions 361508, and 361530, respectively, and if the result is found to be greater than zero, no scaling of the signal vector components is necessary, and the subroutine exits through item 361550 to the point where the routine activated subroutine 361500. If the retained word (i.e. MSW or LSW) of SMAX is less than the threshold value, the retained word is tested to see if its absolute magnitude is greater than 255 by decisions 361510, and 361532, respectively. This is equivalent to determining if the upper 8 bits of the retained word of SMAX are greater than or equal to zero. If the result of this test is true (i.e. the MSW or the LSW of SMAX is greater than 255), the retained word is divided by 256 by items 361514 or 361536, respectively. This has the effect of shifting the upper 8 bits of the retained word of SMAX into the lower 8 bits of this word. If the result of decision 361510, or 361532 indicates that the retained word is less than 255, then no division is performed. This quantity is now used as an address offset by items 361516, 361512, 361538, or 361534 to select values stored in ROM data table, and a scaling factor is retrieved from a ROM by items 361520, 361540. This factor is adjusted to the correct value necessary to scale the signal vector components, depending on previous decisions 361510 or 361532. Finally the signal vector components are scaled to the correct region for use by the approximations applied within the demodulator by items 361522 and 361524 or 361542 and 361546 and the routine exists back to the calling procedure through items 361526 or 361548.

Figure 37A:
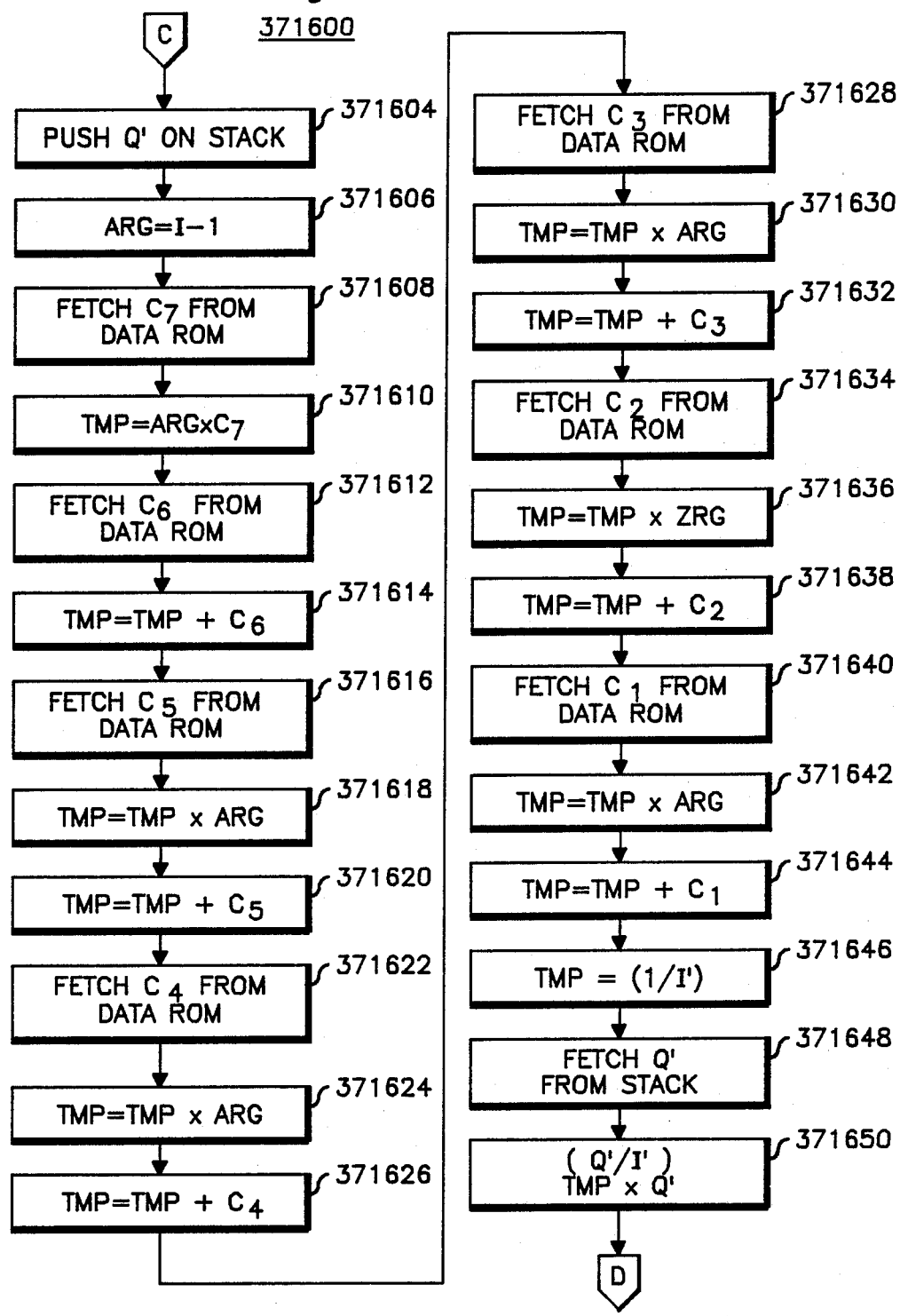
FIGS. 37a through 37b are flow diagrams detailing the operation of the remaining portions of the digital demodulator of the present invention.
Figure 37B:
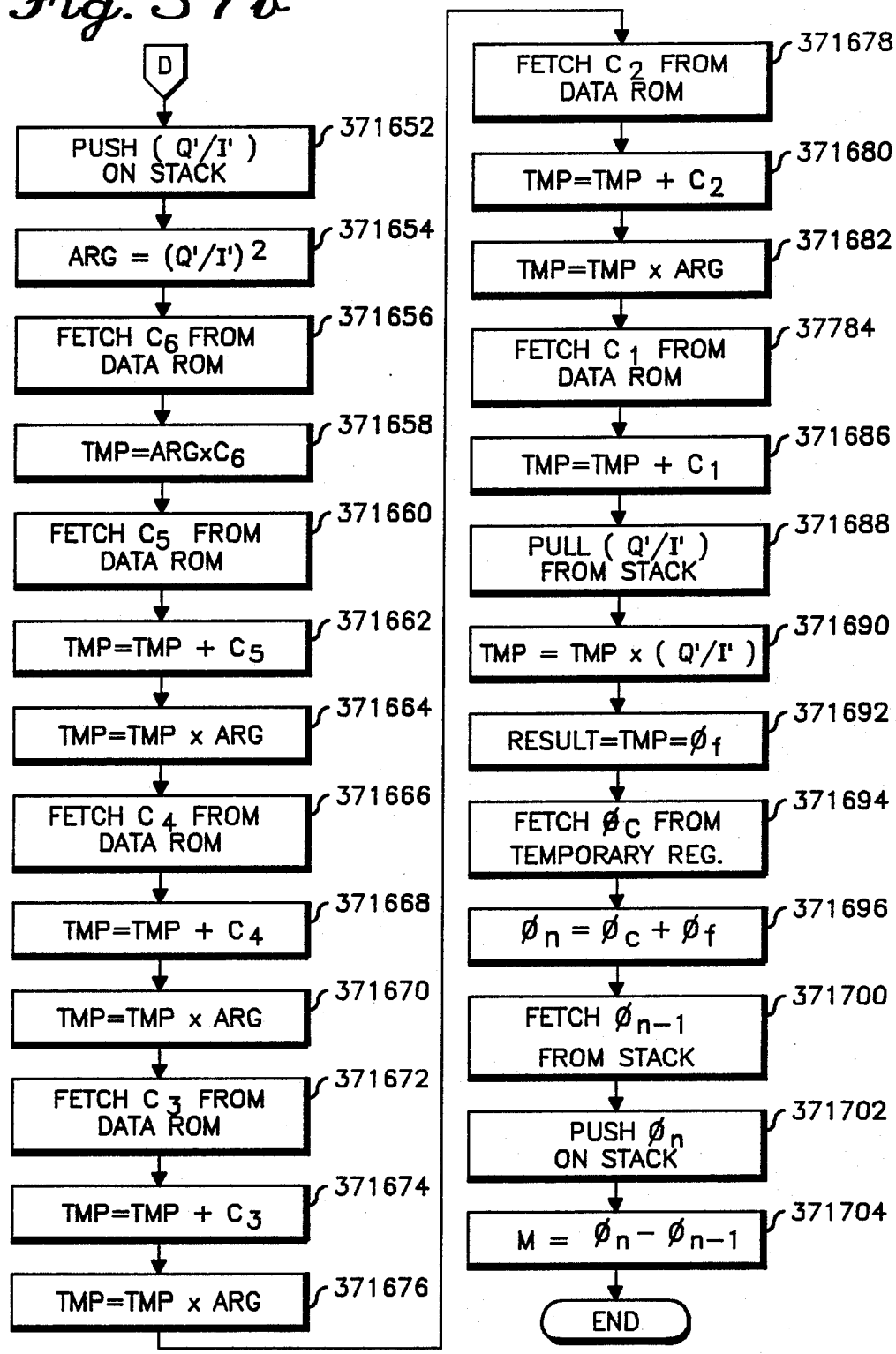

Referring now to FIG. 37a, the inverse or reciprocal of the I' vector component is now determined. This processing is accomplished by implementing a 6th order Chebyshev polynomial approximation to the function $f(x) = 1/x$.

The polynomial which approximates this function is:

$$f(x) = (1/x) \sim$$

$$\{[[[[[C7(x - 1) + C6](x - 1) + C5](x - 1) + C4](x - 1) + C3](x - 1) + C2](x - 1) + C1\}$$

where, $x = I'$ and, $C1 = +1.00000, C2 = -1.0027, C3 = +1.00278, C4 = -0.91392,$ $C5 = +0.91392, C6 = -1.62475, C7 = +1.62475.$ According to the principles of the present invention, the Q' component is pushed on a program stack storage area by item 371604 and the quantity (I'−1) is calculated by item 371606, hereinafter referred to as the quantity ARG. Coefficient C7 is fetched from data ROM by item 371608 and is multiplied with ARG by item 371610 forming a quantity TMP. Coefficient C6 is fetched from as data ROM by item 371612 and added to TMP by item 371614 yielding the new value for TMP. This pattern is successively repeated by items 371616 through 371644 until the Q' component is then fetched from the program stack storage by item 371648 and multiplied with TMP by item 371650 yielding an approximation to the quantity $\tan \phi_f = Q'/I'$.

The arctangent of the quantity obtained by item 371650 is now determined. This processing is performed by implementing a 5th order Chebyshev polynomial approximation to the function:

$$\phi_f = \arctan(x)$$

The polynomial that approximates this function is:

$$\arctan(x) \sim x\{[[[[C6(y) + C5]y + C4]y + C3]y + C2]y + C1\}$$

where, $$x = Q'/I'$$

$$y = x^2 = (Q'/I')^2$$

and, $C6 = -0.01343$, $C5 = +0.05737$, $C4 = -0.12109$, $C3 = +0.19556$, $C2 = -0.33301$, $C1 = +0.99997$.

The quantity $x = (Q'/I')$ is pushed onto program stack storage by item 371652, and the value of the squared quantity $y = x^2$, hereinafter referred to as ARG is calculated by item 371654. In a chain like manner, similar to the calculation of the inverse value described previously, the value of the arctangent of the quantity $(Q'/I')$ is computed by items 371656 through 371692. The result of this process is a signed value representing the phase angle of the rotated signal vector, or the fine phase angle of the input signal vector sample. The value of the coarse phase of the input signal vector sample is retrieved from a temporary storage location by item 371694 and is summed with the result of the arctangent calculation by item 371696.

This result represents the phase angle of the input signal vector sample. The phase angle of the previous input signal vector sample, $\theta n-1$, is fetched from a program stack by item 371700. The current phase sample is pushed onto a program stack by item 371702. Finally, the difference of the previous phase sample and the current phase sample is calculated by item 371704 thus yielding an output sample of the demodulated message m(n).

The message sample m(n) comprises the demodulated voice signal in a sampled form. The demodulated voice signal may be converted back to analog form, then amplified and played through a loudspeaker, as mentioned above. Alternatively, a digital voice message may be stored in a digital memory 22123 for later use. In a data communications system (not shown), demodulated data symbols may be routed to a computer for further processing or to a computer terminal for immediate display.

In summary, a digital radio receiver has been described. The digital receiver of the present invention contemplates an all digital radio receiver which operates on a received signal which is converted to a digital form after preselection at the output of the antenna. The receiver of the present invention comprises a preselector, a high-speed analog-to-digital (A/D) converter, a digitally implemented intermediate-frequency (IF) selectivity section having an output signal at substantially baseband frequencies, and general-purpose digital signal processor (DSP) integrated circuits performing demodulation and audio filtering.

While a particular embodiment of the invention has been described and shown, it should be understood that the invention is not limited thereto since many modifications may be made. It is therefore contemplated to cover by the present application any and all such modifications that may fall within the true spirit and scope of the basic underlying principles disclosed and claimed herein.

What is claimed is:

1. An apparatus for extending the threshold sensitivity of an analog to digital (A/D) converter that converts an analog alternating current (AC) input signal having a given frequency into digital data, comprising:
   means for generating a noise signal which does not have any substantial energy at said given frequency;
   means for summing said analog AC input signal and said noise signal to produce a resultant signal that is coupled to an input of the A/D converter;
   clock means for generating periodic pulses at a first frequency coupled to said A/D converter causing the latter to make A/D conversions in response to said pulses; and
   the resultant signal produced by said summing means containing the signal component corresponding to said analog AC input signal which is converted by the A/D converter into a digital data representation, said A/D converter having a given threshold sensitivity and the magnitude of said AC input signal being less than said threshold sensitivity, said signal component corresponding to the AC input signal being converted by the A/D into digital data, whereby AC input signals having a magnitude less than said given threshold sensitivity of the A/D converter can be converted into digital data thereby extending the threshold sensitivity of the A/D converter.

2. The apparatus according to claim 1 wherein said generating means generates a noise signal that produces quantization noise at the digital data output from the A/D converter having an essentially uniform power spectral density.

3. The apparatus according to claim 1 wherein said generating means generates a Gaussian noise signal.

4. The apparatus according to claim 1 wherein said generating means generates a noise signal having an amplitude less than the maximum voltage range of the A/D converter.

5. The apparatus according to claim 4 wherein the amplitude of the noise signal is approximately 15 decibels less than the maximum voltage range of the A/D converter.

6. The apparatus according to claim 1 further comprising a clock means for generating periodic pulses coupled to said A/D converter causing the latter to make A/D conversions in response to said pulses.

7. The apparatus according to claim 6 wherein the ratio of the rate of said periodic pulses to the bandwidth of said analog AC input signal is greater than 10.

8. The apparatus according to claim 6 further comprising means for periodically sampling the amplitude of the analog AC input signal and storing the sampled amplitude, said stored amplitude of the analog AC input signal coupled to said summing means.

9. The apparatus according to claim 8 wherein said sampling means includes means for generating sampling pulses having a time duration of less than 0.5 times the reciprocal of the frequency of said analog AC input signal.

10. The apparatus according to claim 1 wherein the first frequency of the pulses generated by said clock means is less than the given frequency of said AC input signal.

11. A method for extending the threshold sensitivity of an analog to digital (A/D) converter that converts an analog alternating current (AC) input signal having a given frequency into digital data comprising the steps of:
  generating a noise signal which does not have any substantial energy at said given frequency;
  summing the analog AC input signal and said noise signal to produce a resultant signal which contains a signal component corresponding to said AC input signal;
  coupling the resultant signal to the input of the A/D converter;
  generating periodic clock pulses at a first frequency which are coupled to said A/D converter and cause A/D conversions to be made in response to said pulses; and
  the A/D converter converting said signal component into digital data representative of said analog AC input signal, said A/D converter having a given threshold sensitivity and the magnitude of said AC input signal being less than said threshold sensitivity, wherein converting by the A/D converter of the signal component into digital data effectively extends the threshold sensitivity of the A/D converter.

12. The method according to claim 11 further comprising the steps of periodically sampling the amplitude of the analog AC input signal, storing the sampled amplitude, and summing the stored amplitude with the noise signal to produce said resultant signal.

13. The method according to claim 12 wherein said sampling step includes the step of generating sampling pulses having a time duration of less than 0.5 times the reciprocal of the frequency of said analog AC input signal.

14. The method according to claim 11 further comprising the step of generating periodic clock pulses which cause corresponding A/D conversions to be made.

15. The method according to claim 12 wherein the ratio of the rate of the clock pulses to the bandwidth of the analog AC input signal is greater than 10.

16. The method according to claim 11 wherein the first frequency of said pulse is less than the given frequency of said AC input signal.

17. In a communications receiver having a bandpass filter with a bandwidth which permits the passage of an analog radio frequency (RF) input signal having a frequency within a predetermined range of frequencies and an analog to digital (A/D) converter having a digital data output, the improvement comprising:
  means for generating a noise signal which does not have any substantial energy within said range of frequencies;
  means for summing said filtered analog RF input signal and said noise signal to produce a resultant signal that is coupled to an input of the A/D converter;
  clock means for generating periodic pulses at a first frequency coupled to the A/D converter causing the latter to make A/D conversions in response thereto;
  said summing means producing a resultant signal containing a signal component corresponding to said analog RF input signal which is converted by the A/D converter into a digital data representation, said A/D converter having a given threshold sensitivity and the magnitude of said AC input signal being less than said threshold sensitivity, said signal component corresponding to the AC input signal being converted by the A/D into digital data, whereby AC input signals having a magnitude less than said given threshold sensitivity of the A/D converter can be converted into digital data thereby extending the threshold sensitivity of the A/D converter.

18. The apparatus according to claim 17 wherein said generating means generates a noise signal that produces quantization noise at the digital data output from the A/D converter having an essentially uniform power spectral density.

19. The apparatus according to claim 17 wherein said generating means generates a Gaussian noise signal.

20. The apparatus according to claim 17 wherein said generating means generates a noise signal having an amplitude less than the maximum voltage range of the A/D converter.

21. The apparatus according to claim 20 wherein the amplitude of the noise signal is approximately 15 decibels less than the maximum voltage range of the A/D converter.

22. The apparatus according to claim 17 further comprising clock means for generating periodic pulses coupled to the A/D converter causing the latter to make A/D conversions in response thereto.

23. The apparatus according to claim 22 wherein the ratio of the rate of said periodic pulses to the bandwidth of said analog A input signal is greater than 10.

24. The apparatus according to claim 22 further comprising means for periodically sampling the amplitude of the filtered analog RF input signal and storing the sampled amplitude, said stored amplitude coupled to said summing means and summed with said noise signal to produce said resultant signal.

25. The apparatus according to claim 24 wherein said sampling means includes means for generating sampling pulses having a time duration of less than 0.5 times the reciprocal of the frequency of said analog RF input signal.

26. The receiver according to claim 17 wherein the first frequency of said pulses is less than the given frequency of said AC input signal.

27. A method for converting an analog radio frequency (RF) signal having a given frequency into digital data comprising the steps of:
  bandpass filtering said analog RF signal;
  storing a first signal corresponding to an instantaneous magnitude of said filtered analog RF signal;

generating a noise signal which does not have any substantial energy at said given frequency;

summing said first signal and said noise signal to produce a resultant signal;

coupling said resultant signal to an analog to digital (A/D) converter;

generating periodic clock pulses at a first frequency which are coupled to said A/D converter and cause A/D conversions to be made in response to said pulses, said A/D converter having a given threshold sensitivity and the magnitude of said RF signal being less than said threshold sensitivity, wherein the converting by the A/D converter of the signal component into digital data effectively extends the threshold sensitivity of the A/D converter.

28. The method according to claim 27 further comprising the step of periodically sampling the instantaneous magnitude of said analog RF signal and storing a first signal corresponding to said sampled magnitude.

29. The method according to claim 28 wherein said sampling step includes the step of generating sampling pulses having a time duration of less than 0.5 times the reciprocal of the frequency of said analog RF signal.

30. The method according to claim 27 further comprising the step of generating periodic clock pulses causing corresponding A/D conversions to be made.

31. The method according to claim 30 wherein the ratio of the rate of the clock pulses to the bandwidth of the analog RF signal is greater than 10.

32. The method according to claim 27 wherein the first frequency of said pulses is less than the given frequency of said AC input signal.

33. An apparatus for extending the threshold sensitivity of an analog to digital (A/D) converter that converts an analog alternating current (AC) input signal having a given frequency into digital data, comprising:

means for generating a noise signal which does not have any substantial energy at said given frequency;

means for summing said analog AC input signal and said noise signal to produce a resultant signal that is coupled to an input of the A/D converter;

clock means for generating periodic pulses at a first frequency coupled to said AD converter causing the latter to make A/D conversions in response to said pulses, the ratio of the rate of said periodic pulses to the bandwidth of said analog AC input signal being greater than 10; and the resultant signal produced by said summing means containing a signal component corresponding to said analog AC input signal which is converted by the A/D converter into a digital data representation.

34. The apparatus according to claim 33 wherein said generating means generates a noise signal that produces quantization noise at the digital data output from the A/D converter having an essentially uniform power spectral density.

35. The apparatus according to claim 33 wherein said generating means generates a Gaussian noise signal.

36. The apparatus according to claim 33 wherein said generating means generates a noise signal having an amplitude less than the maximum voltage range of the A/D converter.

37. The apparatus according to claim 36 wherein the amplitude of the noise signal is approximately 15 decibels less than the maximum voltage range of the A/D converter.

38. The apparatus according to claim 33 further comprising means for periodically sampling the amplitude of the analog AC input signal and storing the sampled amplitude, said stored amplitude of the analog AC input signal coupled to said summing means.

39. The apparatus according to claim 38 wherein said sampling means includes means for generating sampling pulses having a time duration of less than 0.5 times the reciprocal of the frequency of said analog AC input signal.

40. The apparatus according to claim 33 wherein the first frequency of said pulses generated by said clock means is less than the given frequency of said AC input signal.

41. The apparatus according to claim 33 wherein the A/D converter has a given threshold sensitivity and the magnitude of said AC input signal is less than said threshold sensitivity, said signal component corresponding to the AC input signal being converted by the A/D into digital data, whereby AC input signal having a magnitude less than said given threshold sensitivity of the A/D converter can be converted into digital data thereby extending the threshold sensitivity of the A/D converter.

42. A method for extending the threshold sensitivity of an analog to digital (A/D) converter that converts an analog alternating current (AC) input signal having a given frequency into digital data comprising the steps of:

generating a noise signal which does not have any substantial energy at said given frequency;

summing the analog AC input signal and said noise signal to produce a resultant signal which contains a signal component corresponding to said AC input signal;

coupling the resultant signal to the input of the A/D converter;

generating periodic clock pulses at a first frequency which are coupled to said A/D converter and cause A/D conversions to be made in response to said pulses, the ratio of the rate of the clock pulses to the bandwidth of the analog AC input signal being greater than 10; and the A/D converter converting said signal component into digital data representative of said analog AC input signal.

43. The method according to claim 42 further comprising the steps of periodically sampling the amplitude of the analog AC input signal, storing the sampled amplitude, and summing the stored amplitude with the noise signal to produce said resultant signal.

44. The method according to claim 43 wherein said sampling step includes the step of generating sampling pulses that determine the duration of the sampling pulses, the sampling pulses being less than 0.5 times the reciprocal of the frequency of said analog AC input signal.

45. The method according to claim 42 wherein the first frequency of said pulses is less than the given frequency of said AC input signal.

46. The method according to claim 42 wherein said A/D converter has a given threshold sensitivity and the magnitude of said AC input signal is less than said threshold sensitivity, wherein said step of converting by the A/D converter of the signal component into digital data effectively extends the threshold sensitivity of the A/D converter.

47. In a communications receiver having a bandpass filter with a bandwidth which permits the passage of an analog radio frequency (RF) input signal having a frequency within a predetermined range of frequencies and an analog to digital (A/D) converter having a digital data output, the improvement comprising:
means for generating a noise signal which does not have any substantial energy within said range of frequencies;
means for summing said filtered analog RF input signal and said noise signal to produce a resultant signal that is coupled to an input of the A/D converter;
clock means for generating periodic pulses at a first frequency coupled to the A/D converter causing the latter to make A/D conversions in response thereto, the ratio of the rate of said periodic pulses to the bandwidth of said analog AC input signal being greater than 10; and
said summing means producing a resultant signal containing a signal component corresponding to said analog RF input signal which is converted by the A/D converter into a digital data representation.

48. The apparatus according to claim 47 wherein said generating means generates a noise signal that produces quantization noise at the digital data output from the A/D converter having an essentially uniform power spectral density.

49. The apparatus according to claim 47 wherein said generating means generates a Gaussian noise signal.

50. The apparatus according to claim 47 wherein said generating means generates a noise signal having an amplitude less than the maximum voltage range of the A/D converter.

51. The apparatus according to claim 50 wherein the amplitude of the noise signal is approximately 15 decibels less than the maximum voltage range of the A/D converter.

52. The apparatus according to claim 47 further comprising means for periodically sampling the amplitude of the filtered analog RF input signal and storing the sampled amplitude, said stored amplitude coupled to said summing means and summed with said noise signal to produce said resultant signal.

53. The apparatus according to claim 52 wherein said sampling means includes means for generating sampling pulses having a time duration of less than 0.5 times the reciprocal of the frequency of said analog RF input signal.

54. The apparatus according to claim 47 wherein the first frequency of said pulses is less than the given frequency of said AC input signal.

55. The receiver according to claim 47 wherein said A/D converter has a given threshold sensitivity and the magnitude of said AC input signal is less than said threshold sensitivity, said signal component corresponding to the AC input signal being converted by the A/D into digital data, whereby AC input signals having a magnitude less than said given threshold sensitivity of the A/D converter can be converted into digital data thereby extending the threshold sensitivity of the A/D converter.

56. A method for converting an analog radio frequency (RF) signal having a given frequency into digital data comprising the steps of:
bandpass filtering said analog RF signal;
storing a first signal corresponding to an instantaneous magnitude of said filtered analog RF signal;
generating a noise signal which does not have any substantial energy at said given frequency;
summing said first signal and said noise signal to produce a resultant signal;
coupling said resultant signal to an analog to digital (A/D) converter;
generating periodic clock pulses at a first frequency which are coupled to said A/D converter and cause A/D conversions to be made in response to said pulses, the ratio of the rate of the clock pulses to the bandwidth of the analog RF signal being greater than 10.

57. The method according to claim 56 further comprising the step of periodically sampling the instantaneous magnitude of said analog RF signal and storing a first signal corresponding to said sampled magnitude.

58. The method according to claim 57 wherein said sampling step includes the step of generating sampling pulses having a time duration of less than 0.5 times the reciprocal of the frequency of said analog RF signal.

59. The method according to claim 56 wherein the first frequency of said pulses is less than the given frequency of said AC input signal.

60. The method according to claim 56 wherein said A/D converter has a given threshold sensitivity and the magnitude of said RF signal is less than said threshold sensitivity, wherein the converting by the A/D converter of the signal component into digital data effectively extends the threshold sensitivity of the A/D converter.

61. A digital zero-IF selectivity section circuit operating on a recovered input signal in a receiver device, comprising, in combination:
clock means for providing a periodic clock signal;
digital oscillator means, coupled to said clock means, for providing first and second digitized discrete-time signals, such that said first digitized discrete time signal leads said second digitized discrete time signal by 90 degrees in phase;
means for digital quadrature mixing the input signal and said first and second digitized discrete time signals to provide first and second digitized output signals occupying a selected frequency band centered substantially at zero Hertz; and
first and second digital filtering means, each comprising:
a decomposed, internally multiplexed, filter section coupled to said digitized output signals;
sample rate reducing means coupled to said decomposed filter section;
a multiplierless digital filter section coupled to said sample rate reducing means;
whereby, said first and second digital filtering means operate to selectively band-limit the frequency spectrum of said first and second digitized output signals thereby providing first and second filtered digitized output signals.

62. The circuit of claim 61, wherein said decomposed, internally multiplexed filter section comprises:
means for generating a second periodic clock signal wherein said second clock signal has a period approximately equal to at least twice the period of said first clock signal;

demultiplexing means, coupled to said digitized output signals for demultiplexing same into at least two demultiplexed signals;

first filtering means for filtering said demultiplexed signals providing at least two filtered demultiplexed signals;

multiplexing means for multiplexing said filtered demultiplexed signals into a multiplexed signal which represents a selectively band-limited portion of said input signal; and second filtering means coupled to said first clock signal and said multiplexed signal for providing a combined and filtered multiplexed output signal which represents a selectively band-limited portion of said digitized output signals.

63. The circuit of claim 61, wherein each of said multiplierless digital filter sections comprise:

first binary summing means coupled to an input signal and a second binary delayed signal for providing a first binary sum signal;

first binary shifting means coupled to said first binary sum signal for providing a shifted first binary sum signal;

second binary summing means coupled to said shifted first sum signal and a first binary delayed signal for providing a second binary sum signal;

first binary storage means coupled to said second binary sum signal for providing said first binary delayed signal;

third binary summing means coupled to said first binary delayed signal and said second delayed binary signal for providing a third binary sum signal;

second binary shifting means coupled to said third binary sum signal for providing a shifted third binary sum signal;

fourth binary summing means coupled to said shifted third binary sum signal and said second binary delayed signal for providing a fourth binary sum signal;

second binary storage means coupled to said fourth binary sum signal for providing said second binary delayed signal.

64. The circuit of claim 63, wherein said second binary delayed signal comprises th digital filter output signal.

65. A digital zero-IF selectivity section for operating on a received input signal in a receiver, comprising, in combination;

clock means for providing at least a first and second periodic clock signal;

digital oscillator means, coupled to said clock means, for providing first and second digitized discrete-time signals such that said first digitized discrete-time signal leads said second digitized discrete time signal by 90 degrees in phase;

means for digital quadrature mixing the input signal and said first and second digitized signals for providing first and second digitized output signals such that said first and second digitized output signals such that said first and second digitized output signals occupy a selected frequency band centered substantially at zero Hertz;

first and second digital filtering means, each of said first and second digital filtering means comprising at least one digital filtering section coupled to a sample rate reducing means, and each of said first and second digital filtering means being coupled to said clock means for providing first and second filtered digitized output signals;

multiplexing means coupled to said first and second digital filter means to provide a multiplex output signal;

third digital filtering means, coupled to said multiplex means, comprising at least one digital filtering section, coupled to said clock means, for providing a selected order filter and to provide a filtered multiplex signal;

demultiplexing means coupled to said clock means and said filtered multiplex signal for providing first and second output signals such that said first and second output signal occupy a frequency band substantially centered at zero Hertz.

66. A digital zero-If selectivity section for operating on a recovered input signal in a receiver, comprising, in combination:

clock means for providing a periodic first clock signal;

means for dividing the frequency of said clock signal to provide a second clock signal;

digital oscillator means, coupled to said clock means, for providing first and second digitized discrete-time signals such that said first digitized discrete-time signal leads said second digitized discrete time signal by 90 degrees in phase;

means for digital quadrature mixing the input signal and said first and second digitized output signals such that said first and second digitized output signals occupy a selected frequency band centered substantially at zero Hertz;

first and second digital filtering section means respectively coupled to receive said first and second digitized output signals and each of said first and second digital filtering section means being coupled to said clock means for providing first and second filtered digitized output signals;

first and second data sampling rate reducer means respectively coupled to said first and second filtered digitized output signals for providing first and second reduced rate data signals;

multiplexing means coupled to said first and second reduced rate data signals to provide a multiplex output signal;

third digital filtering section means coupled to said second clock signal and said multiplex output signal to provide a first filtered multiplex signal;

fourth digital filtering section means coupled to said second clock signal and said first filtered multiplex signal to provide a second filtered multiplex signal;

fifth digital filtering section means coupled to said second clock signal and said second filtered multiplex signal to provide a third filtered multiplex signal; and demultiplexing means coupled to said second clock signal and said third filtered multiplex signal for providing first and second output signals such that said first and second output signal occupy a frequency band substantially centered at zero Hertz.

67. The circuit of claims 61, 65 or 66, wherein said digital oscillator means further comprises:

binary addressing means having an input port for receiving a frequency information signal and an additional input port coupled to said clock means to provide a binary address signal;

binary storage means coupled to said binary addressing means for providing a plurality of stored binary signals; and combining means constructed and arranged to combine said stored binary signals for providing said first and second digitized discrete-time signals.

68. The circuit of claim 67, wherein said binary addressing means includes a first and second binary storage means comprised of a plurality of single bit storage means.

69. The circuit of claim 67, wherein said binary storage means comprises read-only-memory.

70. The circuit of claims 61, 65 or 66, wherein said digital quadrature mixing means further comprises:

first and second discrete mixing means each coupled to said input signal and a respective one of said first and second digitized discrete-time signals to provide said first and second digitized output signals.

71. The circuit of claim 70, wherein said first and second mixing means comprise digital multipliers.

72. A digital zero-IF selectivity section circuit operating on a first and second input signal in a transmitter device, comprising, in combination:

clock means for providing a periodic clock signal;

digital oscillator means, coupled to said clock means, for providing first and second digitized discrete-time signals such that said first digitized discrete time signal leads said second digitized discrete time signal by 90 degrees in phase;

first and second digital filtering means, coupled to the first and second input signals and said clock means, for selectively band-limiting the frequency spectrum of said first and second input signals thereby providing first and second filtered input signals; and means for digital quadrature mixing said first and second filtered input signals and said first and second digitized signals to provide first and second digitized output signals.

73. The circuit of claim 72, wherein said digital oscillator means further comprises:

binary addressing means having an input port for receiving a frequency information signal and an additional input port coupled to said clock means to provide a binary address signal;

binary storage means coupled to said binary addressing means for providing a plurality of stored binary signals; and combining means constructed and arranged to combine said stored binary signals for providing said first and second digitized discrete-time signals.

74. The circuit of claim 73, wherein said binary addressing means includes a first and second binary storage means comprised of a plurality of single bit storage means.

75. The circuit of claim 73, wherein said binary storage means comprises read-only-memory.

76. The circuit of claim 72, wherein said digital quadrature mixing means further comprises:

first and second discrete mixing means each coupled respectively to said first and second input signals and a respective one of said first and second digitized discrete-time signals to provide said first and second digitized output signals.

77. The circuit of claim 76, wherein said first and second mixing means comprise digital multipliers.

78. The circuit of claim 72, wherein each of said first and second digital filtering means further comprises:

at least two digital filter sections cascaded together for achieving a selected order digital filter and intercoupled by sampling rate increasing means, for reducing the operating speed of subsequent logic sections.

79. The circuit of claim 78, wherein said digital filter sections do not employ digital multipliers.

80. The circuit of claim 79, wherein each of said filter further comprises:

first binary summing means coupled to an input signal and a second binary delayed signal for providing a first binary sum signal;

first binary shifting means coupled to said first binary sum signal for providing a shifted first binary sum signal;

second binary summing means coupled to said shifted first sum signal and a first binary delayed signal for providing a second binary sum signal;

first binary storage means coupled to said second binary sum signal for providing said first binary delayed signal;

third binary summing means coupled to said first binary delayed signal and said second shifted binary signal for providing a third binary sum signal;

second binary shifting means coupled to said third binary sum signal for providing a shifted third binary sum signal;

fourth binary summing means coupled to said shifted third binary sum signal and said second binary delayed signal for providing a fourth binary sum signal;

second binary storage means coupled to said fourth binary sum signal for providing said second binary delayed signal.

81. The circuit of claim 80 wherein said second binary delayed signal comprises the digital filter output signal.

82. The circuit of claim 78, which includes:

first and second periodic clock signal means wherein said second clock signal has a period approximately equal to at least twice the period of said first clock signal;

demultiplexing means, coupled to the input signal for demultiplexing the input signal into at least two demultiplexed signals;

first filtering means for filtering said demultiplexed signals providing at least two filtered demultiplexed signals;

multiplexing means, for multiplexing said filtered demultiplexed signals into a multiplexed signal which represents a selectively band-limited portion of said input signal; and second filtering means coupled to said first clock signal and said multiplexed signal for providing a combined and filtered multiplexed output signal which represents a selectively band-limited portion of said input signal.

83. In a receiver for receiving and periodically presenting a received digital input signal to an intermediate frequency section, the improvement comprising:

clock means for providing a periodic clock signal;

a digital oscillator means, coupled to clock means, for providing first and second digitized discrete-time signals such that said first digitized discrete-time signal leads said second digitized discrete time signal by 90 degrees in phase;

means for digital quadrature mixing the digital input signal and said first and second digitized discrete time signals to provide first and second digitized output signals occupying a selected frequency band centered substantially at zero hertz; and first and second digital filtering means, coupled to said digital quadrature mixing means and to said clock means, for selectively band-limiting the frequency spectrum of said first and second digitized output signals providing first and second filtered digitized output signals, each of said digital filtering means comprising:

at least one digital filtering section intercoupled by a sample rate reducing means;

multiplexing means coupled to said digital filter sections to provide a multiplex output signal;

third digital filtering means, coupled to said multiplex means, comprising at least one digital filtering section for providing a selected order filter and to provide a filtered multiplex signal;

demultiplexing means coupled to said clock means and said filtered multiplex signal for providing first and second output signals such that said first and second output signal occupy a frequency band substantially centered at zero Hertz.

84. A digital zero-IF selectivity section circuit operating on a recovered input signal in a receiver device comprising, in combination:

clock means for providing a first and second periodic clock signal, such that said second clock signal has a period approximately twice that of said first clock signal;

digital oscillator means, coupled to said first clock signal, for providing first and second digitized discrete-time signals, such that said first digitized discrete time signal leads said second digitized discrete time signal by 90 degrees in phase;

means for digital quadrature mixing the input signal and said first and second digitized discrete time signals to provide first and second digitized output signals occupying a selected frequency band centered substantially at zero Hertz; and first and second digital filtering means, each comprising:

at least two digital filter sections cascaded together for achieving a selected order digital filter, at least the first section comprising:

demultiplexing means, coupled to said digitized output signals for demultiplexing same into at least two demultiplexed signals;

first filtering means, coupled to said second clock signal, for filtering said demultiplexed signals providing at least two filtered demultiplexed signals;

multiplexing means for multiplexing said filtered demultiplexed signals into a multiplexed signal which represents a selectively band-limited portion of said input signal; and second filtering means coupled to said first clock signal and said multiplexed signal for providing a combined and filtered multiplexed output signal;

sample rate reducing means, coupled at least between the first and second filter sections, for reducing the operating speed of subsequent filter sections, each of said subsequent filter sections comprising:

first binary summing means coupled to an input signal and a second binary delayed signal for providing a first binary sum signal;

first binary shifting means coupled to said first binary sum signal for providing a shifted first binary sum signal;

second binary summing means coupled to said shifted first sum signal and a first binary delayed signal for providing a second binary sum signal;

first binary storage means coupled to said second binary sum signal for providing said first binary delayed signal;

third binary summing means coupled to said first binary delayed signal and said second delayed binary signal for providing a third binary sum signal;

second binary shifting means coupled to said third binary sum signal for providing a shifted third binary sum signal;

fourth binary summing means coupled to said shifted third binary sum signal and said second binary delayed signal for providing a fourth binary sum signal;

second binary storage means coupled to said fourth binary sum signal for providing said second binary delayed signal comprising a filtered digitized output signal;

whereby, said first and second digital filtering means operate to selectively band-limit the frequency spectrum of said first and second digitized output signals thereby providing first and second filtered digitized output signals.

85. An apparatus for substantially digitally processing a wideband analog signal containing a desired narrow band analog signal, comprising:

(a) means, including coupling means and filter means for receiving and filtering a wideband analog signal containing a desired narrowband analog signal;

(b) digitizing means, coupled to said filter means, for periodically sampling and converting said wideband analog signal to a sampled wideband digital signal;

(c) digital means, coupled to said digitizing means, for selecting the desired sampled narrowband digital signal from the sampled wideband digital signal, wherein said digital means includes a digital quadrature oscillator means, a digital quadrature multiplier/mixer means, a digital quadrature narrowband lowpass filter means, and means for programmably controlling the bandwidth of said digital quadrature lowpass filter means.

86. The apparatus as recited in claim 85 wherein said filter means is an RLC filter.

87. The apparatus as recited in claim 85 wherein said filter means is a transmission line filter.

88. The apparatus as recited in claim 85 wherein said filter means is a crystal filter.

89. The apparatus as recited in claim 85 wherein said filter means is a Surface Acoustic Wave (SAW) filter.

90. The apparatus as recited in claim 85 wherein said digitizing means is a flash A/D converter sampling at a rate at least twice the highest frequency of the wideband analog signal.

91. The apparatus as recited in claim 85 wherein said digitizing means is a sample-and-hold circuit and an A/D converter sampling and converting at a rate substantially higher than the bandwidth of the wideband analog signal.

92. The apparatus as recited in claim 85 wherein said digital means includes a digital oscillator means, a digital multiplier/mixer means, and a digital narrowband filter means.

93. The apparatus as recited in claim 92 wherein said digital oscillator means contains means for programmably controlling the operating frequency of said digital oscillator means.

94. The apparatus as recited in claim 92 wherein said digital filter contains means for programmably controlling the bandwidth of said digital filter.

95. The apparatus as recited in claim 92 wherein said apparatus includes decimating means for substantially reducing the sampling rate of said wideband digital signal.

96. The apparatus as recited in claim 92 wherein said digital narrowband filter is multiplierless.

97. The apparatus as recited in claim 85 wherein said digital quadrature oscillator means contains means for programmably controlling the operating frequency of said digital quadrature oscillator means.

98. The apparatus as recited in claim 85 wherein said apparatus includes decimating means for substantially reducing the sampling rate of said wideband digital signal.

99. The apparatus as recited in claim 85 wherein said digital quadrature lowpass filter is multiplierless.

100. The apparatus as recited in claim 85 wherein said digital processing means comprises a general purpose digital signal processor.

101. The apparatus as recited in claim 85 wherein said digital processing means further includes means for additional digital filtering and sampling rate reduction.

102. The apparatus as recited in claim 85 wherein said digital processing means further includes means for FM demodulation processing.

103. The apparatus as recited in claim 85 wherein said digital processing means further includes means for AM demodulation processing.

104. The apparatus as recited in claim 85 wherein said digital processing means further includes means for SSB demodulation processing.

105. The apparatus as recited in claim 85 wherein said digital processing means further includes means for demodulation of angle modulated signals.

106. The apparatus as recited in claim 85 wherein said digital processing means further includes means for Quadrature AM demodulation processing.

107. A method for substantially digitally processing a wideband analog signal containing a desired narrowband analog signal, comprising the steps of:
(a) receiving and filtering a wideband analog signal containing a desired narrowband analog signal;
(b) periodically sampling and converting said wideband analog signal to a sampled wideband digital signal;
(c) selecting the desired sampled narrowband digital signal from the sampled wideband digital signal; and
(d) programmably controlling the bandwidth of the sampled narrowband digital signal:
(e) demodulating said sampled narrowband digital signal.

108. The method as recited in claim 107 wherein said sampling and converting step occurs at a rate at least twice the highest frequency of the wideband analog signal.

109. The method as recited in claim 107 wherein said sampling and converting step further comprises the individual steps of sampling and converting at a rate substantially higher than the bandwidth of the wideband analog signal.

110. The method as recited in claim 107 wherein said selecting step further comprises the steps of generating a digital local oscillator signal, multiplying the digital local oscillator signal by the sampled wideband digital signal to produce a sampled product signal, and digital narrowband filtering the sampled product signal to produce the sampled narrowband digital signal.

111. The method as recited in claim 110 further including the step of programmably controlling the frequency of said digital local oscillator signal.

112. The method as recited in claim 110 wherein said steps further include the step of programmably controlling the bandwidth of said sampled narrow-band digital signal.

113. The method as recited in claim 110 wherein said steps further comprise the step of substantially reducing the sampling rate of said sampled product signal.

114. The method as recited in claim 110 wherein said digitally narrowband filtering step comprises filtering with multiplierless digital filters.

115. The method as recited in claim 107 wherein said selecting step further comprises the steps of generating a digital quadrature oscillator signal, quadrature multiplying the digital quadrature oscillator signal by the sampled wideband digital signal to produce a sampled product signal, and digital quadrature lowpass filtering the sampled product signal to produce the sampled narrow-band digital signal.

116. The method as recited in claim 115, further including the step of programmably controlling the operating frequency of said digital quadrature oscillator signal.

117. The method as recited in claim 115 wherein said steps further include the step of substantially reducing the sampling rate of the sampled product signal.

118. The method as recited in claim 115 wherein said digital quadrature low-pass filtering step comprises filtering with mulitplierless digital filters.

119. The method as recited in claim 107 wherein said step of demodulation is FM demodulation processing.

120. The method as recited in claim 111 wherein said demodulating step is AM demodulation processing.

121. The method as recited in claim 107 wherein said demodulating step is SSB demodulation processing.

122. The method as recited in claim 107 wherein said demodulating step is angle demodulation processing.

123. The method as recited in claim 107 wherein said demodulating step is Quadrature AM demodulation processing.

124. An apparatus for digitally processing a wideband radio frequency (RF) signal containing a desired narrowband signal, comprising:
(a) means, including antenna means for receiving (RF) signals containing said wideband (RF) signal;
(b) filter means, coupled to said antenna means, for filtering said wideband (RF) signal;
(c) digitizing means, coupled to said filter means, for periodically sampling and converting said wideband RF signal to a sampled wideband digital signal;
(d) digital means, coupled to said digitizing means, for selected the desired sampled narrowband signal from the sampled wideband digital signal; and
(e) digital processing means for demodulating said sampled narrowband digital signal wherein said digital processing means further includes means for additional digital filtering and sampling rate reduction.

125. The apparatus as recited in claim 124 wherein said filter means is an RLC filter.

126. The apparatus as recited in claim 124 wherein said filter means is a transmission line filter.

127. The apparatus as recited in claim 124 wherein said filter means is a crystal filter.

128. The apparatus as recited in claim 124 wherein said filter means is a Surface Acoustic Wave (SAW) filter.

129. The apparatus as recited in claim 124 wherein said digitizing means is a flash A/D converter sampling at a rate at least twice the highest frequency of the wideband RF signal.

130. The apparatus as recited in claim 124 wherein said digitizing means is a sample-and-hold circuit and an A/D converter sampling and converting at a rate substantially higher than the bandwidth of the wideband RF signal.

131. The apparatus as recited in claim 124 wherein said digital means includes a digital oscillator, a digital multiplier/mixer, and a digital narrowband filter.

132. The apparatus as recited in claim 131 wherein said digital oscillator contains means for programmably controlling the operating frequency of said digital oscillator.

133. The apparatus as recited in claim 131 wherein said digital filter contains means for programmably controlling the bandwidth of said digital filter.

134. The apparatus as recited in claim 131 wherein said apparatus includes decimating means for substantially reducing the sampling rate of the sampled wideband digital signal.

135. The apparatus as recited in claim 131 wherein said digital narrowband filter is multiplierless.

136. The apparatus as recited in claim 124 wherein said digital means includes a digital quadrature oscillator, a digital quadrature multiplier/mixer, and a digital quadrature narrowband low pass filter.

137. The apparatus as recited in claim 136 wherein said digital quadrature oscillator contains means for programmably controlling the operating frequency of said digital quadrature oscillator.

138. The apparatus as recited in claim 136, wherein said digital quadrature narrowband lowpass filter contains means for programmably controlling the bandwidth of said digital quadrature narrowband lowpass filter.

139. The apparatus as recited in claim 136 wherein said apparatus includes decimating means for substantially reducing the sampling rate of the sampled wideband digital signal.

140. The apparatus as recited in claim 136 wherein said digital quadrature lowpass filter is multiplierless.

141. The apparatus as recited in claim 124 wherein said digital processing means comprises a general purpose digital signal processor.

142. The apparatus as recited in claim 124 wherein said digital processing means further includes means for FM demodulation processing.

143. The apparatus as recited in claim 124 wherein said digital processing means further includes means for AM demodulation processing.

144. The apparatus as recited in claim 124 wherein said digital processing means further includes means for SSB demodulation processing.

145. The apparatus as recited in claim 124 wherein said digital processing means further includes means for demodulation of angle modulated signals.

146. The apparatus as recited in claim 124 wherein said digital processing means further includes means for Quadrature AM demodulation processing.

147. A method for substantially digitally processing a wideband radio frequency (RF) signal containing a desired narrowband signal, comprising the steps of:
  (a) receiving (RF) signals containing said wideband RF signal;
  (b) filtering said wideband RF signal;
  (c) periodically sampling and converting said filtered wideband (RF) signal to a sampled wideband digital signal;
  (c) selecting the desired sampled narrowband digital signal from the sampled wideband digital signal by generating a digital quadrature local oscillator signal, quadrature multiplying the quadrature local oscillator signal by the sampled wideband digital signal to produce a product signal, digital quadrature narrowband lowpass filtering the product signal to produce the sampled narrowband digital signal, and programmably controlling the bandwidth of said sampled narrowband digital signal;
  (d) digitally demodulating said sampled narrowband digital signal.

148. The method as recited in claim 147 wherein said sampling and converting step occurs at a rate at least twice the highest frequency of the wideband RF signal.

149. The method as recited in claim 147 wherein said sampling and converting step further comprises the individual steps of sampling and converting at a rate substantially higher than the bandwidth of the wideband RF signal.

150. The method as recited in claim 147 wherein said selecting step further includes the steps of generating a digital local oscillator signal, multiplying the digital local oscillator signal by the sampled wideband digital signal to produce a sampled product signal, and digital narrowband filtering the sampled product signal to produce the sampled narrow-band digital signal.

151. The method as recited in claim 150 wherein said steps further include the step of programmably controlling the operating frequency of said digital local oscillator signal.

152. The method as recited in claim 150 wherein said steps further include the step of programmably controlling the bandwidth of said sampled narrow-band digital signal.

153. The method as recited in claim 150 wherein said steps further comprise the step of substantially reducing the sampling rate of said sampled wideband digital signal.

154. The method as recited in claim 150 wherein said low-pass filtering step comprises filtering with multiplierless digital filters.

155. The method as recited in claim 147 further including the step of programmably controlling the operating frequency of said quadrature local oscillator signal.

156. The method as recited in claim 147 wherein said steps further includes the step of substantially reducing the sampling rate of said sampled wideband digital signal.

157. The digital method as recited in claim 147 wherein said quadrature lowpass filtering step comprises filtering with multiplierless digital filters.

158. The digital method as recited in claim 147 wherein said demodulating step comprises FM demodulation processing.

159. The digital method as recited in claim 147 wherein said demodulating step comprises AM demodulation processing.

160. The digital method as recited in claim 147 wherein said demodulating step comprises SSB demodulation processing.

161. The digital method as recited in claim 147 wherein said demodulating step comprises angle demodulation processing.

162. The digital method as recited in claim 147 wherein said demodulating step comprises Quadrature AM demodulation processing.

* * * * *

UNITED STATES PATENT AND TRADEMARK OFFICE
CERTIFICATE OF CORRECTION

PATENT NO. : 4,893,316

DATED : January 9, 1990

INVENTOR(S) : Janc et al.

It is certified that error appears in the above-identified patent and that said Letters Patent is hereby corrected as shown below:

In the claims:

Claim 15, Col. 47, line 57, "claim 12" should be --claim 14--.
Claim 23, Col. 48, line 48, "A" should be --AC--.
Claim 64, Col. 53, line 45, "th" should be --the--.
Claim 66, Col. 54, line 16, "zero-If" should be --zero-IF--.
Claim 120, Col. 60, line 39, "claim 111" should be --claim 107--.

Signed and Sealed this

Fourth Day of June, 1991

Attest:

HARRY F. MANBECK, JR.

Attesting Officer

Commissioner of Patents and Trademarks